United States Patent
Sakatani et al.

(10) Patent No.: US 7,466,062 B2
(45) Date of Patent: Dec. 16, 2008

(54) VIBRATION WAVE MOTOR AND LENS BARREL

(75) Inventors: Koji Sakatani, Tokyo (JP); Atsushi Nakamae, Tokyo (JP); Hiroyuki Takizawa, Tokyo (JP); Sumio Kawai, Tokyo (JP)

(73) Assignee: Olympus Imaging Corp., Tokyo (JP)

( * ) Notice: Subject to any disclaimer, the term of this patent is extended or adjusted under 35 U.S.C. 154(b) by 519 days.

(21) Appl. No.: 11/287,920

(22) Filed: Nov. 28, 2005

(65) Prior Publication Data

US 2006/0113868 A1 Jun. 1, 2006

(30) Foreign Application Priority Data

Nov. 26, 2004 (JP) .............................. 2004-343152

(51) Int. Cl.
*H01L 41/04* (2006.01)
*H01L 41/08* (2006.01)

(52) U.S. Cl. .................... 310/323.16; 310/323.01; 310/323.02; 310/311

(58) Field of Classification Search .............. 310/323
See application file for complete search history.

(56) References Cited

U.S. PATENT DOCUMENTS 5,440,190 A * 8/1995 Imabayashi et al. .... 310/323.13
5,812,330 A * 9/1998 Akada ........................ 359/823
6,078,438 A 6/2000 Shibata et al.

FOREIGN PATENT DOCUMENTS

| JP | 3-29908 | 3/1991 |
| JP | 11-002752 | 1/1999 |
| JP | 11-235062 | 8/1999 |

* cited by examiner

*Primary Examiner*—Jaydi SanMartin
(74) *Attorney, Agent, or Firm*—Volpe and Koenig, P.C.

(57) ABSTRACT

A vibration wave motor includes a housing, a rotor, a bearing member, a vibrator serving as an actuator and having a support shaft and a driving element, and a leaf spring having a pressing protrusion. The vibrator is slidably disposed in an opening of the housing along a rotation axis direction of the rotor, and a support shaft of the vibrator is rotatable. The vibrator is held while being urged by the leaf spring and being in contact with the rotor. The vibrator is excited to generate supersonic vibration so that the rotor is rotated. Since the vibrator is movably supported by the housing in the rotation axis direction and the vibrator is urged by the leaf spring and is in contact with a friction contact surface of the rotor, the vibrator is evenly in contact with the rotor in a direction perpendicular to the friction contact surface so as to provide superior driving conditions of the vibration wave motor.

17 Claims, 40 Drawing Sheets

FIG.55
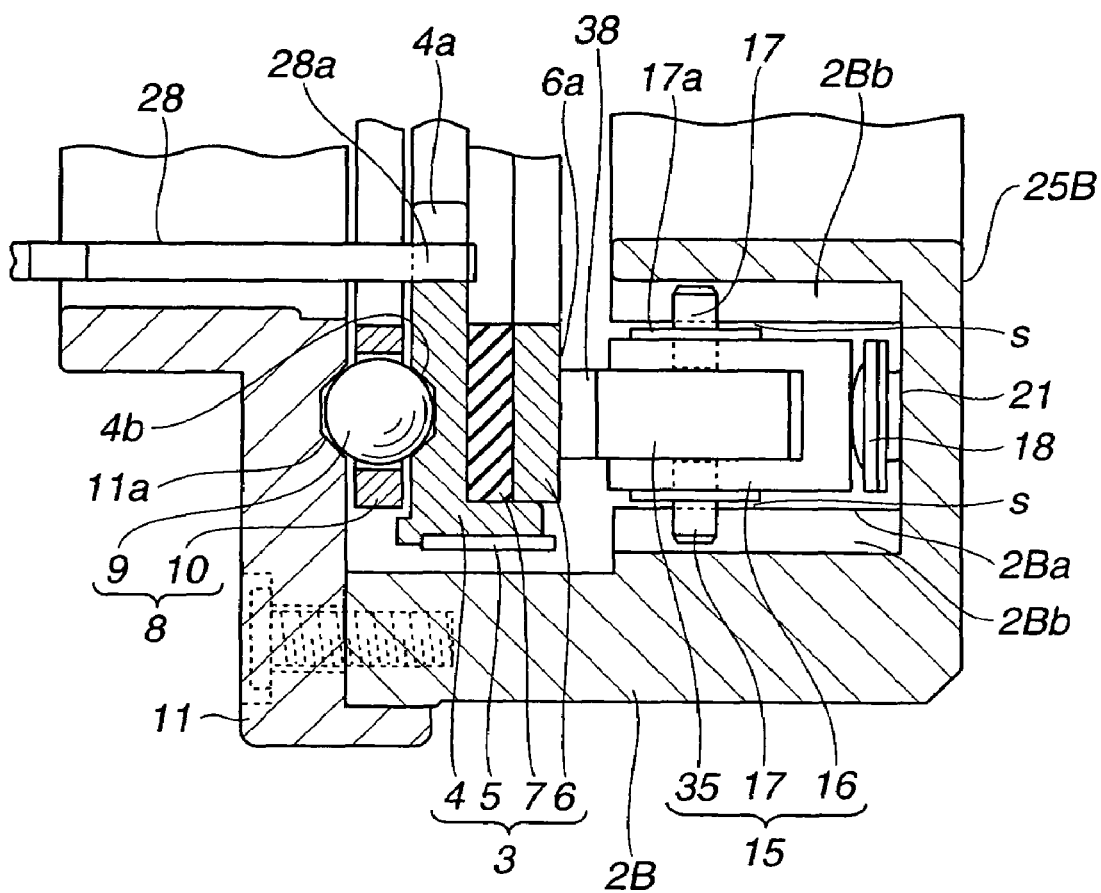
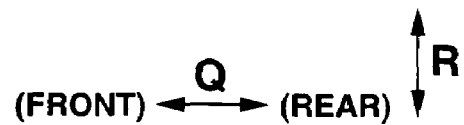

VIBRATION WAVE MOTOR AND LENS BARREL

CROSS REFERENCES TO RELATED APPLICATIONS

The present invention contains subject matter related to Japanese Patent Application No. 2004-343152 filed in the Japanese Patent Office on Nov. 26, 2004, the entire contents of which are incorporated herein by reference.

BACKGROUND OF THE INVENTION

1. Field of the Invention

The present invention relates to a vibration wave motor and a lens barrel including the vibration wave motor.

2. Description of the Related Art

In general, a vibration wave motor used for a driving unit includes a vibrator (vibration body) having an energy transducer, such as a piezoelectric device, and a contact body in contact with the vibrator. The vibration wave motor transduces kinetic energy caused by traveling waves or standing waves to a relative movement between the vibrator and the contact body using a frictional force. In such a structure, the output of the vibration wave motor is significantly influenced by the friction on an interface between the vibrator and the contact body and by the number of the vibrators. Accordingly, a variety of ultrasonic motors having various contact mechanisms of vibrators are proposed.

For example, Japanese Patent Application Laid-open No. 11-235062 discloses such a vibration actuator device (vibration wave motor). This vibration actuator device includes a vibrator that vibrates in accordance with a driving signal, a ring-shaped relative movement member in contact with the vibrator to relatively move, and a pressure support member that supports the vibrator and applies pressure to the vibrator so as to be in contact with the relative movement member. The pressure support member includes a ring-shaped base portion, a leaf spring supported by the base portion in a cantilever fashion, and a support portion provided at a free end of the leaf spring.

SUMMARY OF THE INVENTION

According to an embodiment of the present invention, a vibration wave motor includes at least one vibrator including a driving element on which an elliptical vibration is excited and have a node of vibration, a rotor supported rotatably about a rotation axis and having a contact surface in contact with the vibrator, a support member in which the vibrator is arranged, a guide support portion formed in the support member in order to restrict the movement of the vibrator in a direction perpendicular to the rotation axis and a circumferential direction and in order to support the vibrator substantially at the node thereof movably forward and backward in the rotation axis direction, and an urging member arranged in the support member, the urging member for urging the vibrator in the rotation axis direction of the rotor so as to be in contact with the contact surface. The vibrator, the rotor, the support member, and the pressurizing member are integrated into a unit to form the vibration wave motor.

According to another embodiment of the present invention, a lens barrel includes the vibration wave motor of the present invention and the vibration motor drives a predetermined lens.

According to another embodiment of the present invention, a vibration wave motor includes a housing; a rotor for rotating about a rotation axis relative to the housing; a plurality of contacting members in contact with the rotor in the rotation axis direction; a plurality of guide support portions provided on the housing, each of which supports one of the plurality of the contacting members; a guide groove formed on each of the guide support portions to guide the contacting member movably forward and backward in the rotation axis direction; a plurality of urging portions each of which is disposed at a side opposite to the rotor with respect to the contacting member in the rotation axis direction, each urging respective corresponding contacting member against the rotor; and a holding member fixed to the housing at a position at the side of the rotor opposite to the housing. The holding member prevents the rotor and the plurality of contacting members from dropping off the housing. At least one of the plurality of contacting members is a vibrator, the vibrator has a driving element on which an elliptical vibration is excited, and the vibrator has a node of the vibration.

According to another embodiment of the present invention, a vibration wave motor includes a housing; a rotor for rotating about a rotation axis relative to the housing; a plurality of guide support portions each of which has a guide groove extending in the rotation axis direction and is provided on the housing; a vibrator that is arranged in at least one of the plurality of guide support portions, excites an elliptical vibration, has a node of vibration, is restricted by the guide groove to move in a direction perpendicular to the rotation axis and in circumferential direction of the rotation axis, and is supported by the guide groove movably forward and backward in the rotation axis direction; an urging member that is disposed at a side opposite to the rotor with respect to the vibration in the rotation axis direction and urges the vibrator against the rotor; and a holding member fixed to the housing at a position at the side of the rotor opposite to the housing in the rotation axis direction. The holding member prevents the rotor and the plurality of vibrators from dropping off the housing. The output of the vibration wave motor is changed by changing the number of the vibrators disposed in the plurality of guide support portions.

Additional features and advantages of the invention will be set forth in the description which follows, and in part will be obvious from the description, or may be learned by practice of the invention. The features and advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 55 is an enlarged sectional view about the vibrator unit of the vibration wave motor shown in FIG. 53 along the rotation axis.

DESCRIPTION OF THE PREFERRED EMBODIMENTS

Embodiments of the present invention are described with reference to the accompanying drawings.

Figure 1:
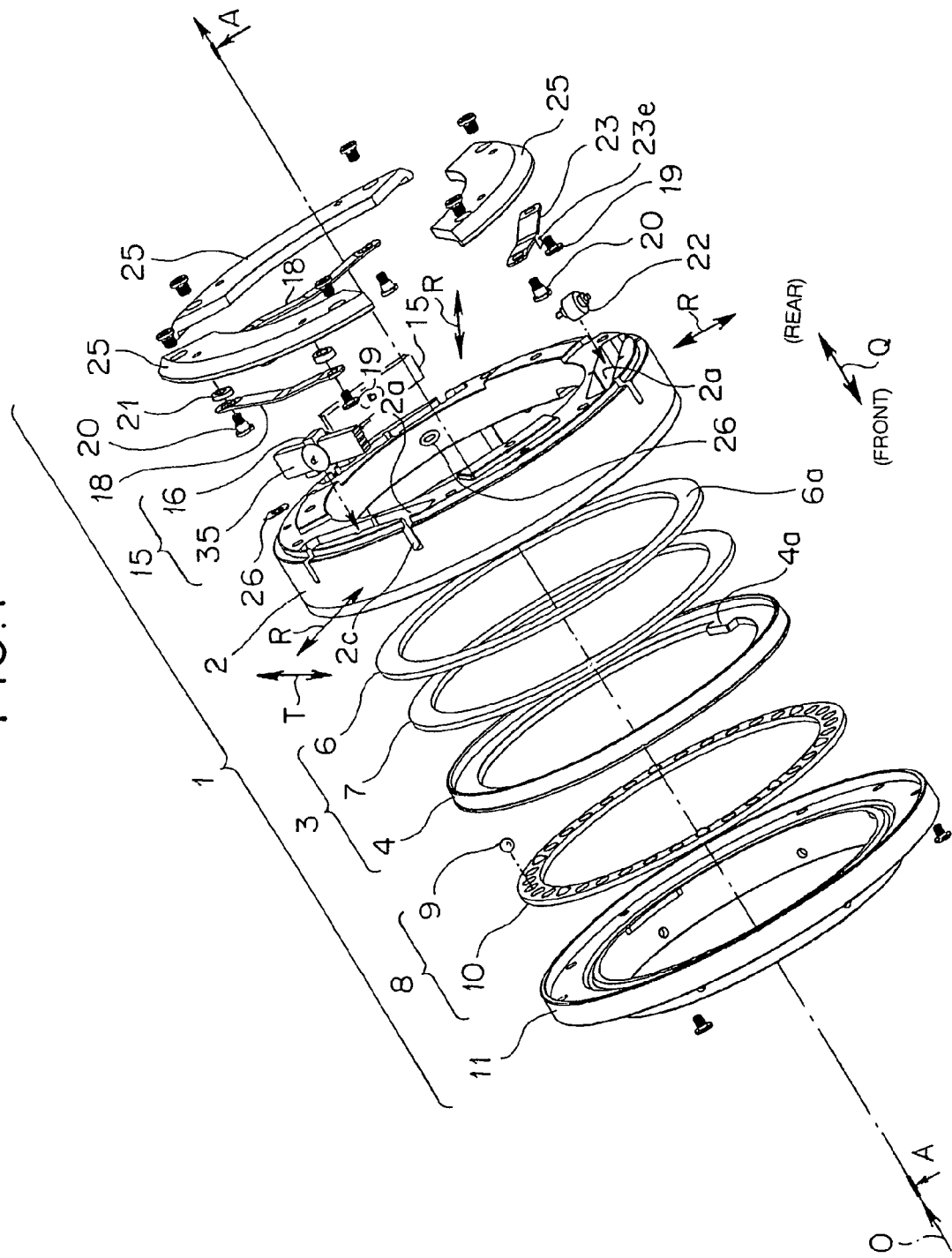
FIG. 1 is an exploded perspective view of a vibration wave motor according to an embodiment of the present invention.

FIG. 1 is an exploded perspective view of a vibration wave motor according to an embodiment of the present invention.

In the following description, a rotation axis O of the vibration wave motor coincides with an optical axis O of a photographing lens when the vibration wave motor is applied to a lens barrel, which is described below. However, depending on the structure of the lens barrel, the rotation axis O of the vibration wave motor substantially coincides with the optical axis O of the photographing lens. A direction parallel to the optical axis O is referred to as the Q direction. In the Q direction, a position adjacent to a lens (adjacent to a subject) in the lens barrel is referred to as "front" whereas a position adjacent to a lens mount (adjacent to a camera body) in the lens barrel is referred to as "rear". A radial direction about the rotation axis O is referred to as the R direction. Also, a tangential direction to a circumference of a circle having the rotation axis O is referred to as the T direction.

According to this embodiment, the vibration wave motor 1, for example, is a rotary motor that can be applied to a lens barrel of a digital camera as a lens driving actuator unit. The lens barrel of a digital camera, which is one of electronic apparatuses, will be described below with reference to FIG. 25.

The vibration wave motor 1 employs an ultrasonic range as the frequency range of vibration waves. Therefore, the vibration wave motor 1 is a so-called ultrasonic motor.

As shown in FIG. 1, the vibration wave motor 1 includes a housing 2, which is a support member (fixed member); a rotor 3, which is a driven member (moving member or rolling element); two vibrator units 15 and a roller 22 (rotating member), both of which are incorporated in the housing 2; leaf springs 18 and 23, which are pressurizing members (spring members or resilient plate members) and form a support mechanism unit; three presser plates 25; a bearing member 8, which receives a thrust force from the rotor 3 urged by the vibrator units 15 and the roller 22; and a bearing holder 11, which is integrally supported by the housing 2 to receive a thrust force from the bearing member 8. These components are assembled into an actuator unit.

In the case where the vibration wave motor 1 is assembled in a lens barrel 60 shown in FIG. 25, which will be described below, a connection rod 28, which is fixed to an LD ring (lens driving ring) 27 of the lens barrel 60, is engaged with the rotor 3.

Each component of the vibration wave motor 1 is described in detail with reference to FIGS. 1 to 16.

Figure 2:
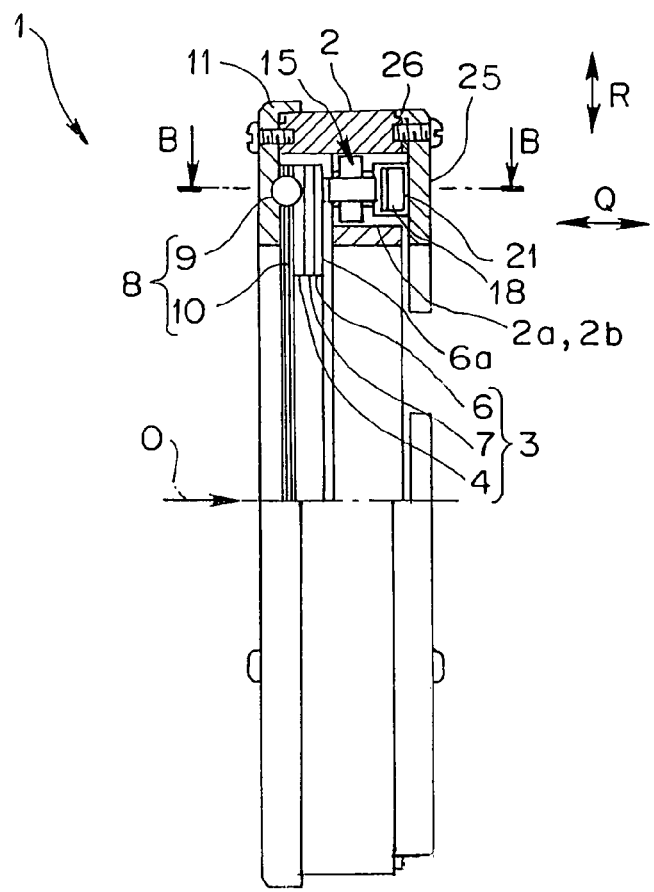
FIG. 2 is a side view, partly in section including a rotation axis, of the vibration wave motor shown in FIG. 1.
Figure 3:
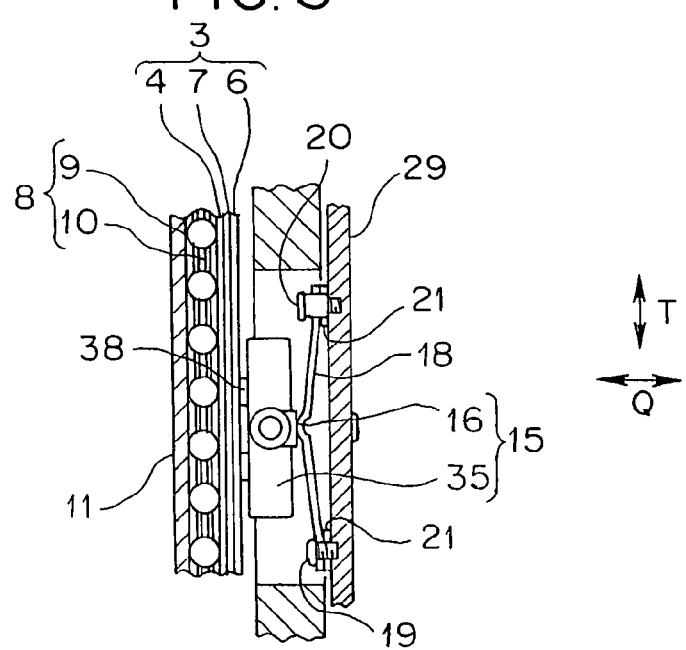
FIG. 3 is a sectional view taken along the line B-B of FIG. 2.
Figure 4:
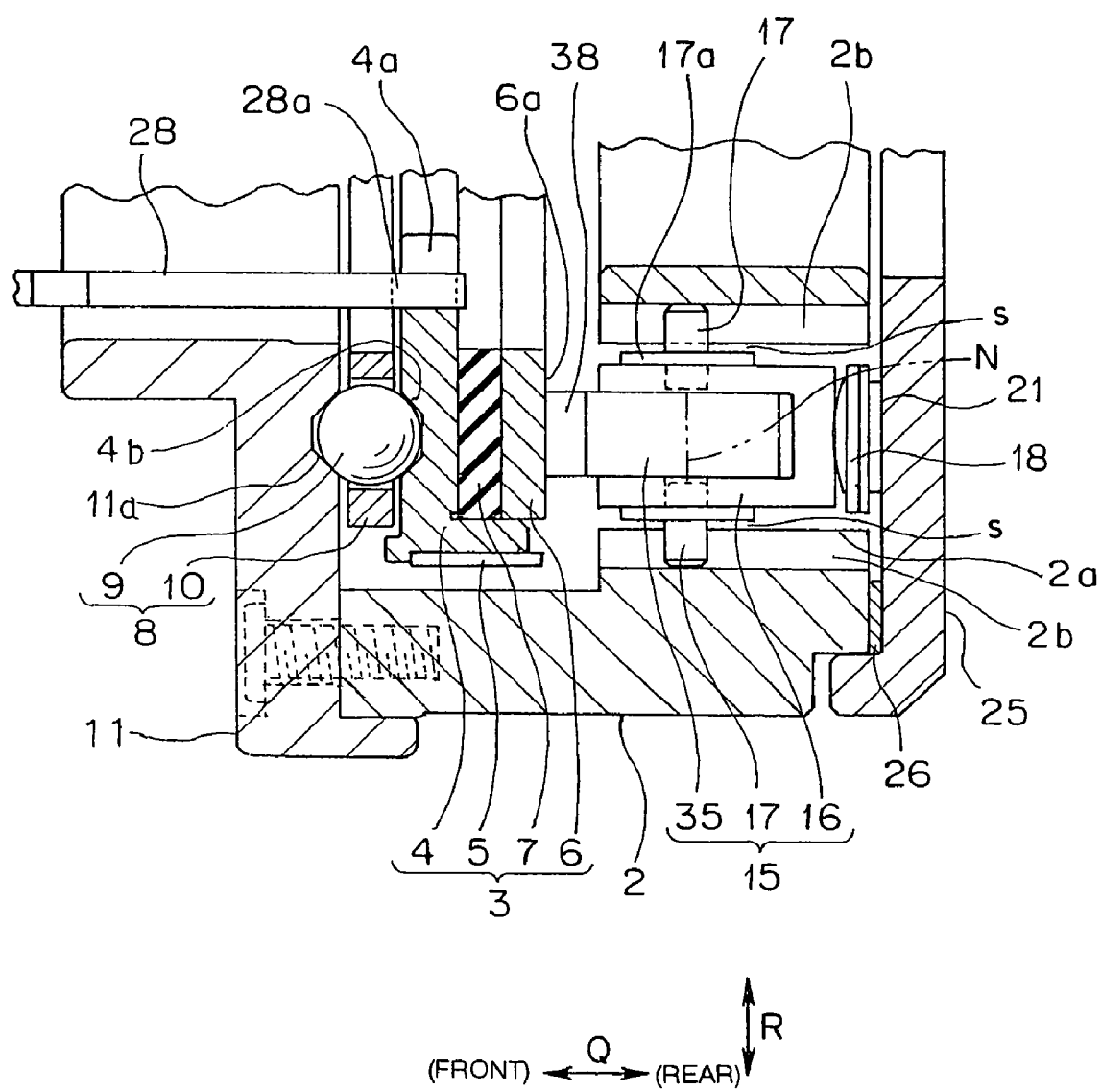
FIG. 4 is an enlarged sectional view along the rotation axis about a vibrator unit of the vibration wave motor shown in FIG. 1.
Figure 5:
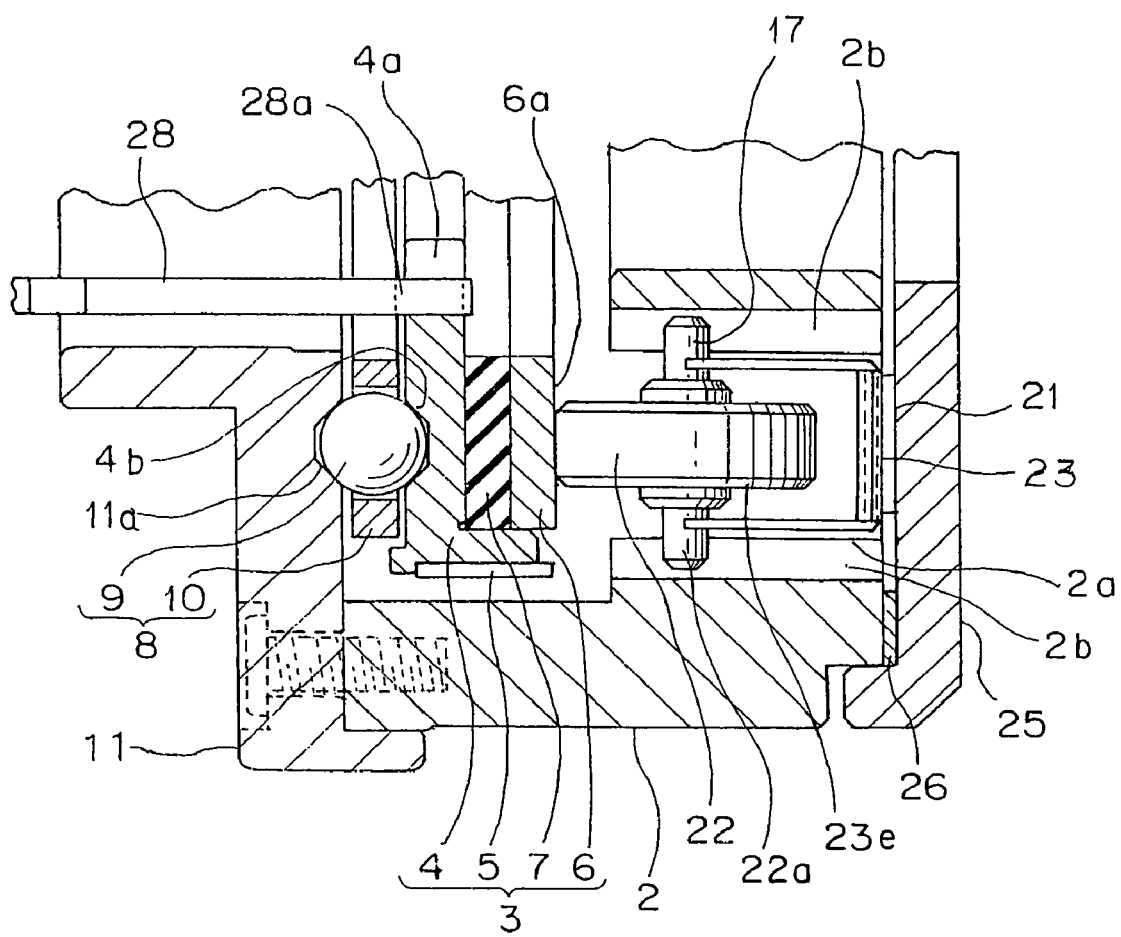
FIG. 5 is an enlarged sectional view along the rotation axis about a roller of the vibration wave motor shown in FIG. 1.
Figure 6:
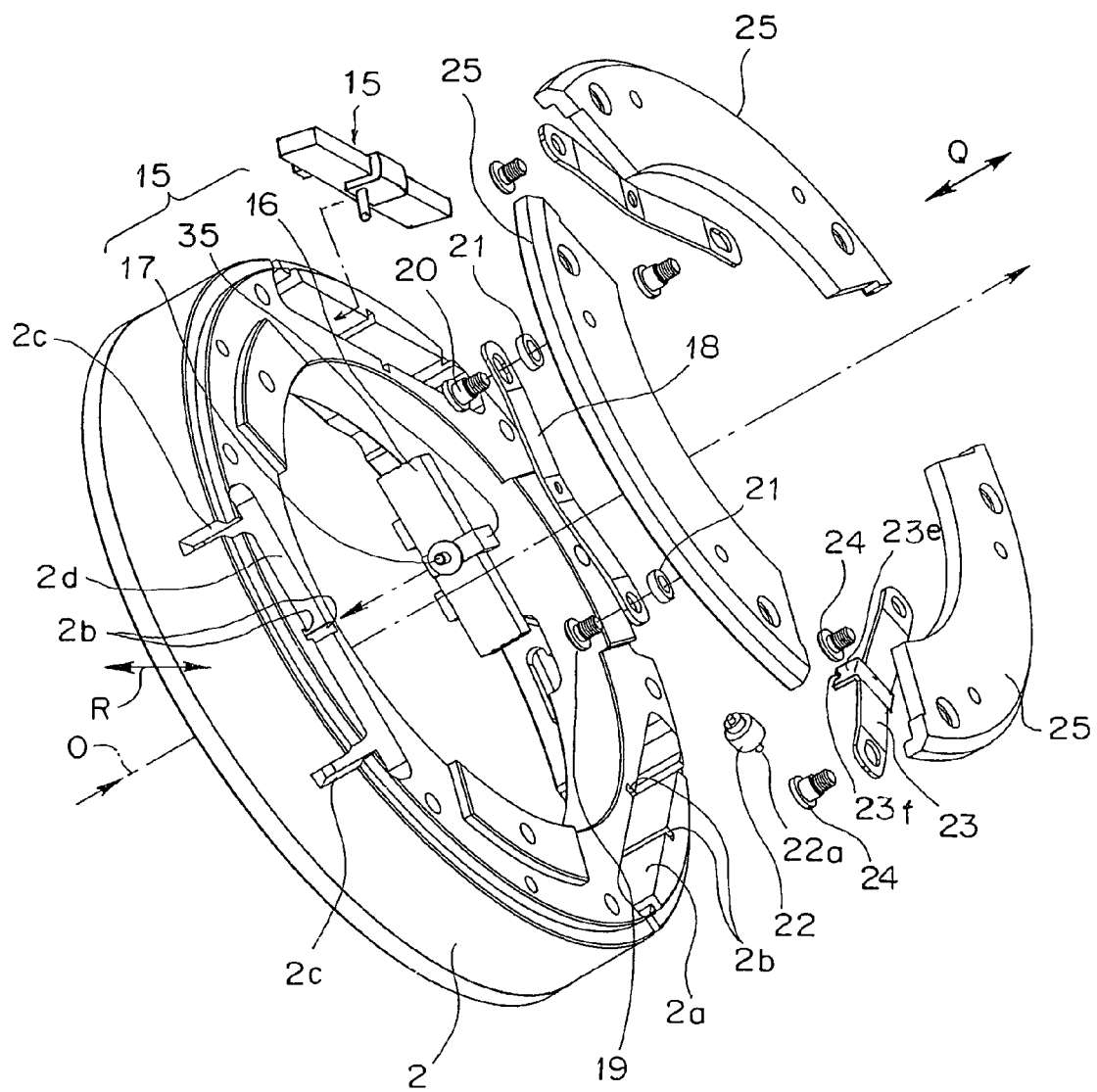
FIG. 6 is an exploded perspective view of a housing, the vibrator unit, a leaf spring, and a presser plate of the vibration wave motor shown in FIG. 1.
Figure 7:
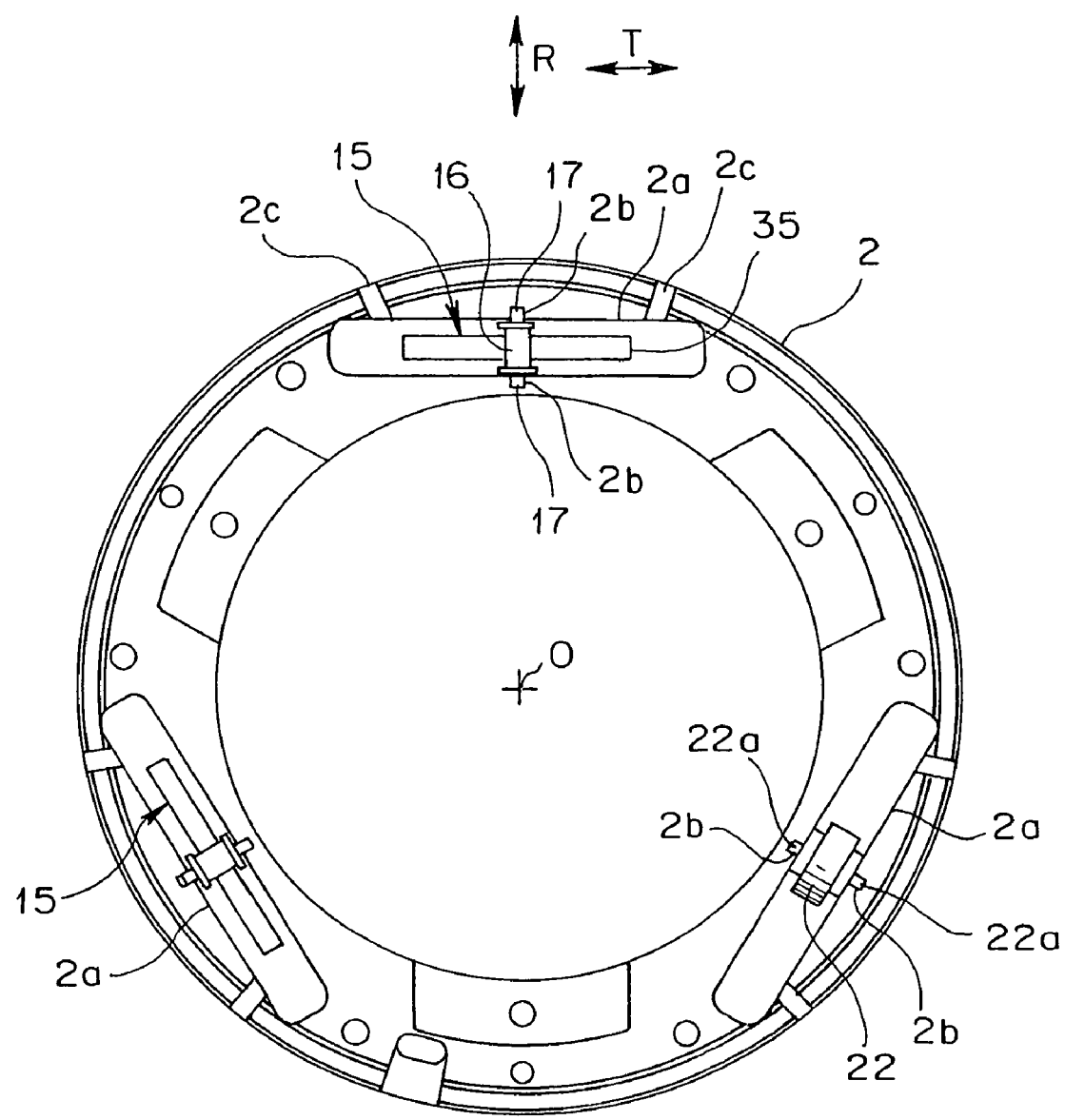
FIG. 7 illustrates a state that the vibrator unit is inserted into the housing of the vibration wave motor shown in FIG. 1 when viewed in the rotation axis direction.
Figure 8:
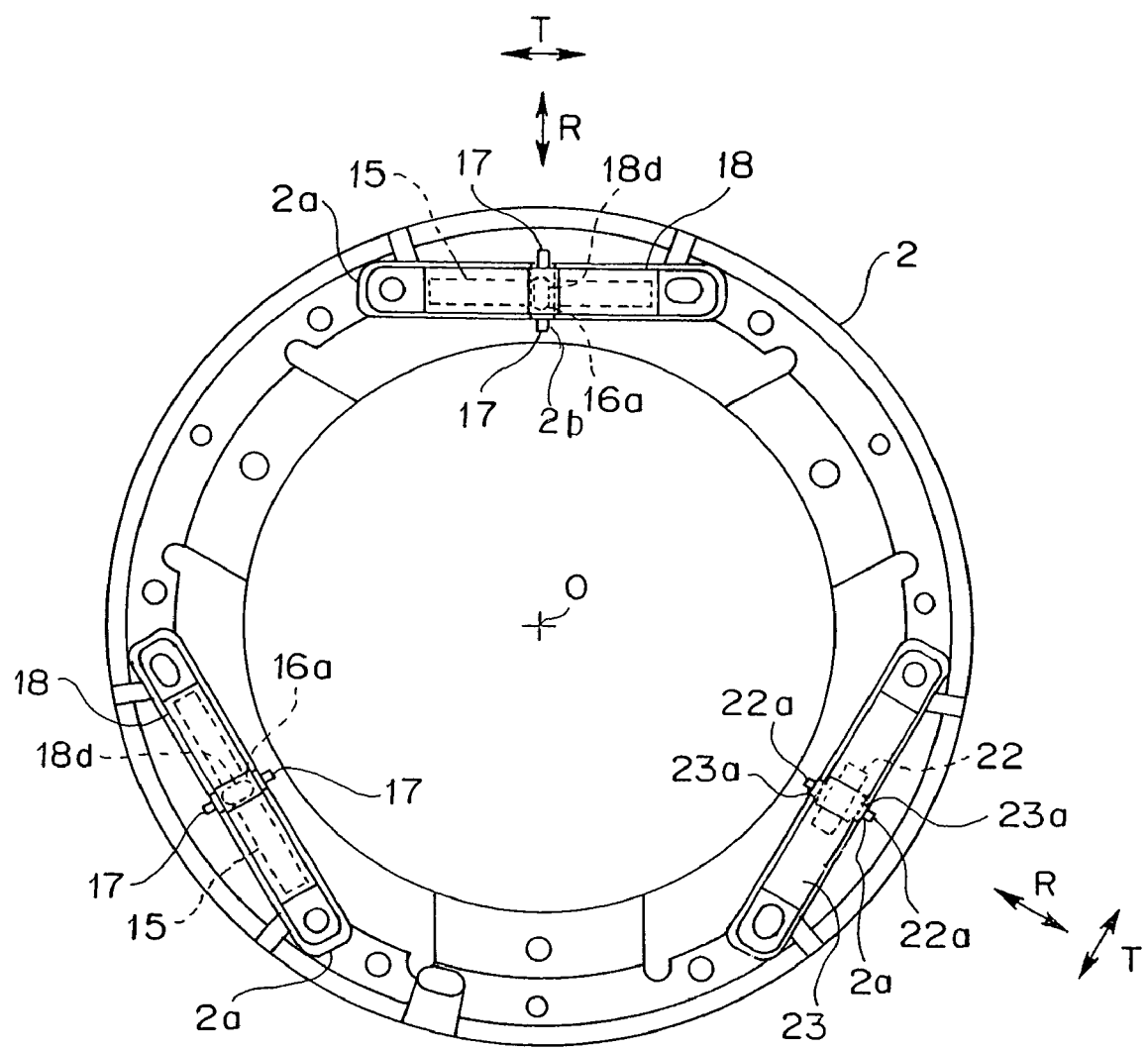
FIG. 8 illustrates the vibrator unit urged by the leaf spring in the housing shown in FIG. 7 when viewed in the rotation axis direction.
Figure 9:
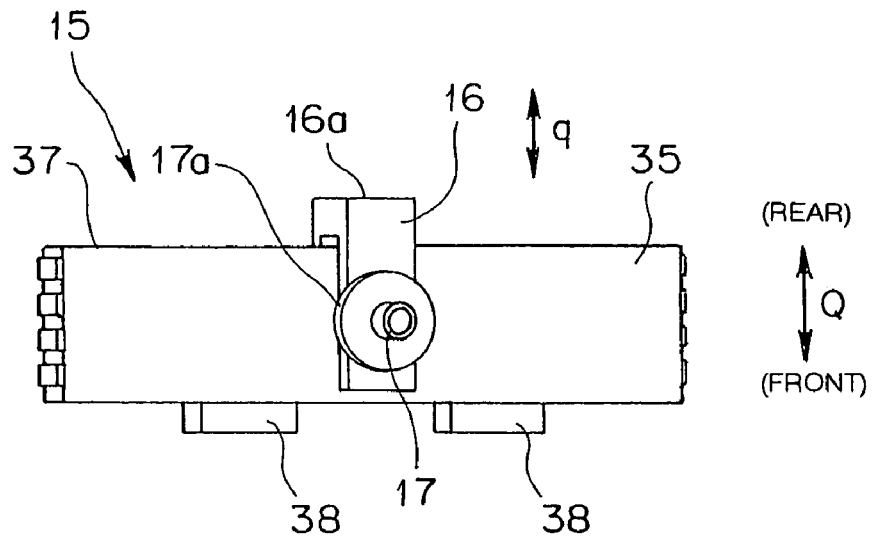
FIG. 9 is a side perspective view of the vibrator unit applied to the vibration wave motor shown in FIG. 1.
Figure 10:
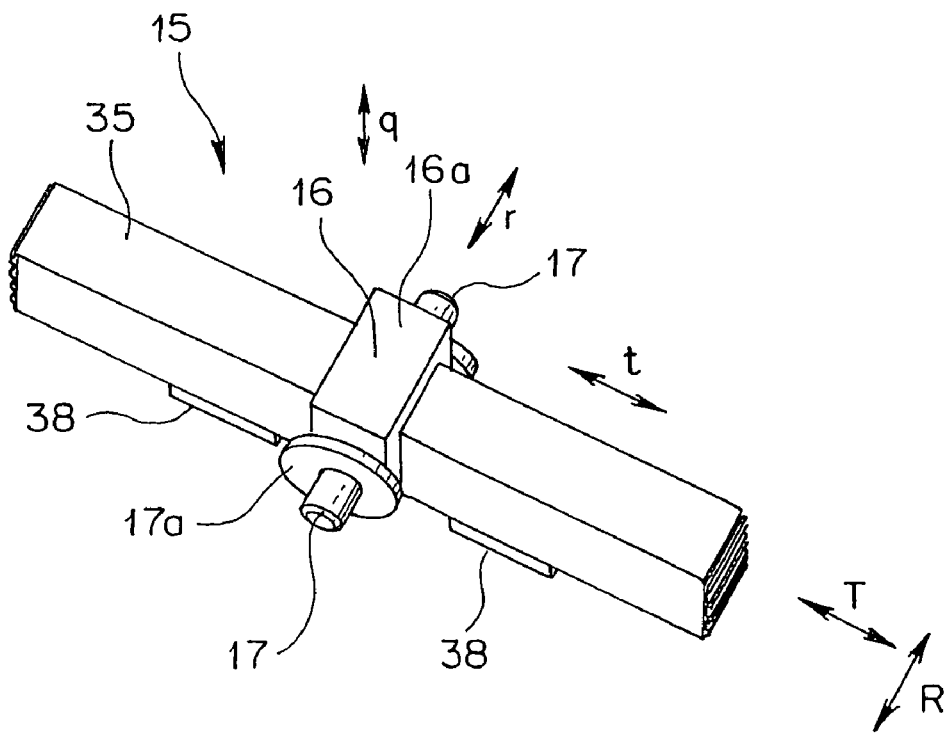
FIG. 10 is a top perspective view of the vibrator unit shown in FIG. 9 of the vibration wave motor shown in FIG. 1.

FIG. 2 is a side view, partly in section including a rotation axis, of the vibration wave motor. FIG. 3 is a sectional view taken along the line B-B of FIG. 2. FIG. 4 is an enlarged sectional view along the rotation axis about the vibrator unit of the vibration wave motor. FIG. 5 is an enlarged sectional view along the rotation axis about a roller of the vibration wave motor. FIG. 6 is an exploded perspective view of the housing, the vibrator unit, the leaf spring, and the presser plate. FIG. 7 illustrates a state that the vibrator unit is inserted into the housing of the vibration wave motor when viewed in the rotation axis direction. FIG. 8 illustrates the vibrator unit of the vibration wave motor shown in FIG. 7 urged by the leaf spring when viewed in the rotation axis direction. FIG. 9 is a side perspective view of the vibrator unit applied to the vibration wave motor. FIG. 10 is a top perspective view of the vibrator unit shown in FIG. 9 of the vibration wave motor.

Figure 11A:
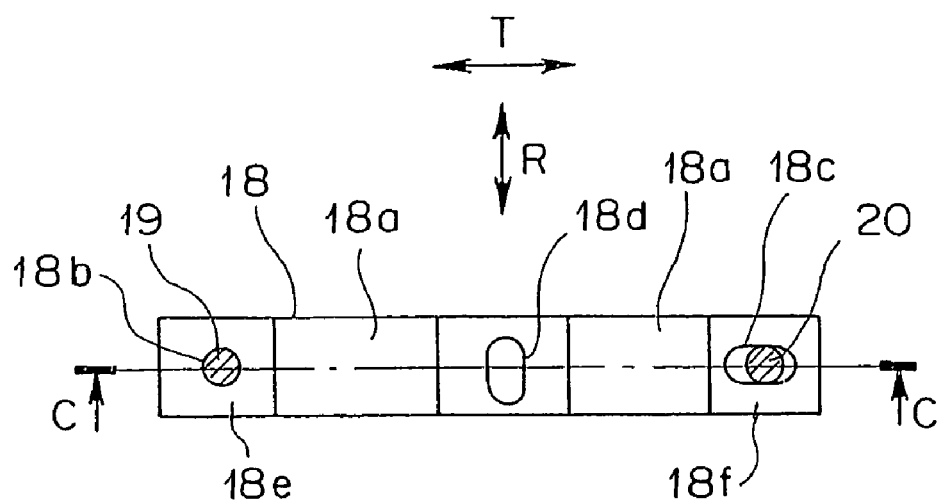
FIG. 11A is a plan view of the leaf spring applied to the vibration wave motor shown in FIG. 1.
Figure 11B:
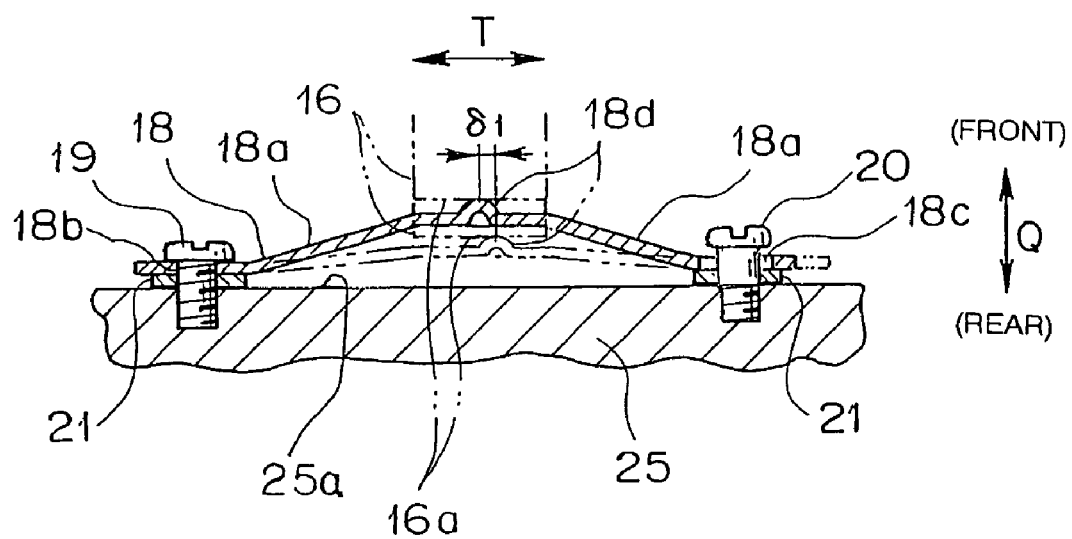
FIG. 11B is a sectional view taken along the line C-C of FIG. 11A when the leaf spring is attached to a presser plate and is deformed by pressure applied from a vibrator holder of the vibrator unit.
Figure 12:
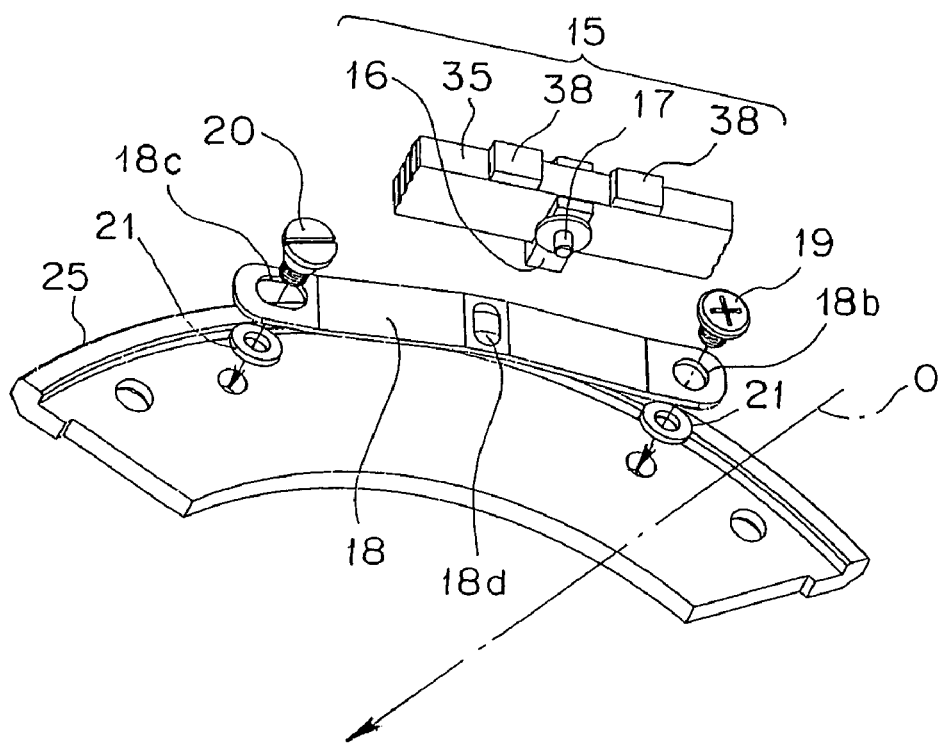
FIG. 12 is an exploded perspective view of the vibrator unit, the leaf spring, and the presser plate of the vibration wave motor shown in FIG. 1.
Figure 13:
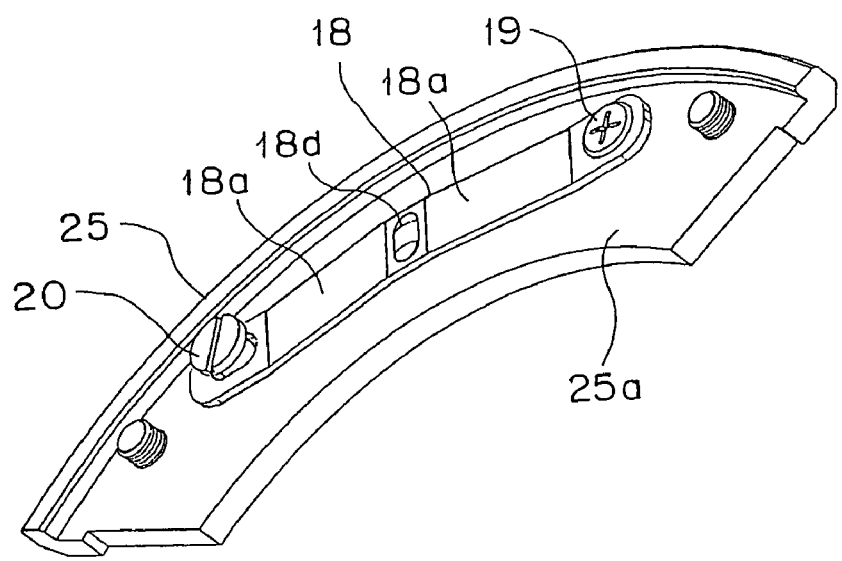
FIG. 13 is a perspective view of the leaf spring attached to the presser plate in the vibration wave motor shown in FIG. 1.
Figure 14:
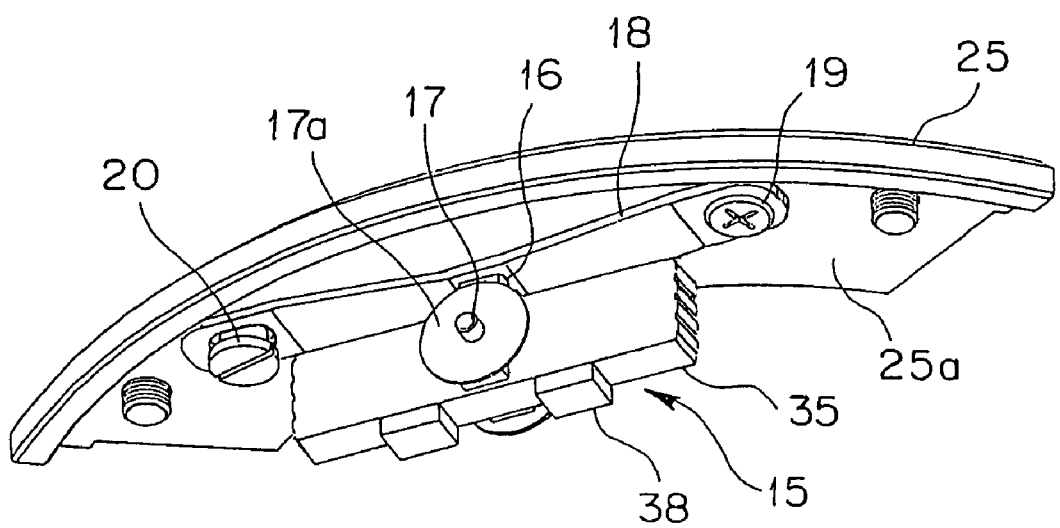
FIG. 14 is a perspective view of the vibrator unit urged against the leaf spring shown in FIG. 13.
Figure 15A:
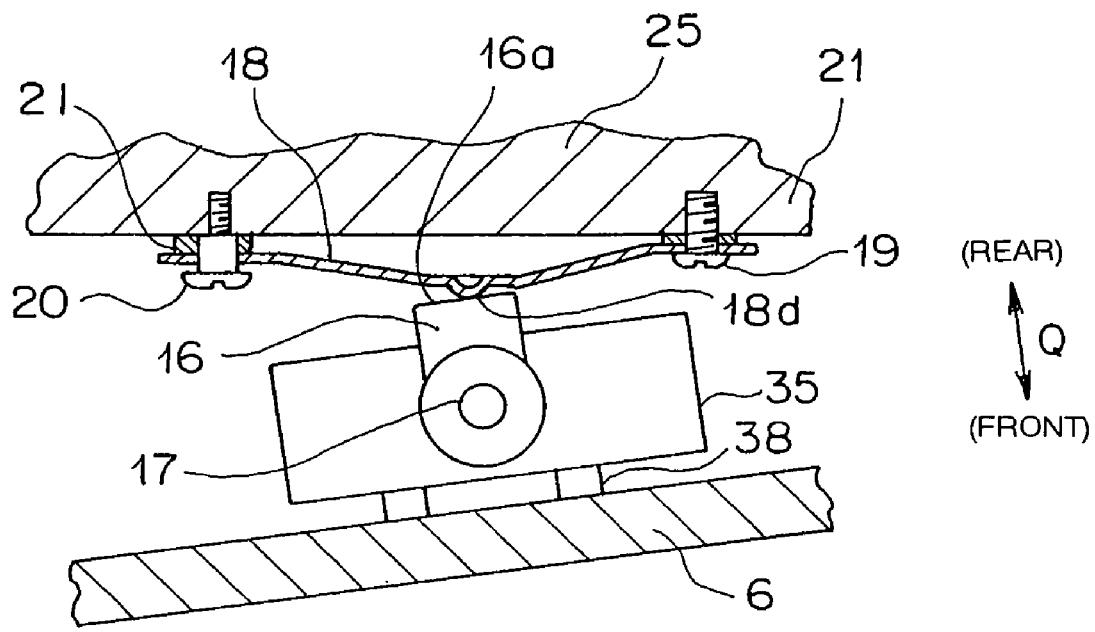
FIG. 15A is a side view illustrating one of the pressing states in accordance with the postures of the assembled rotor plate, presser plate, leaf spring, and vibrator unit in the vibration wave motor shown in FIG. 1.
Figure 15B:
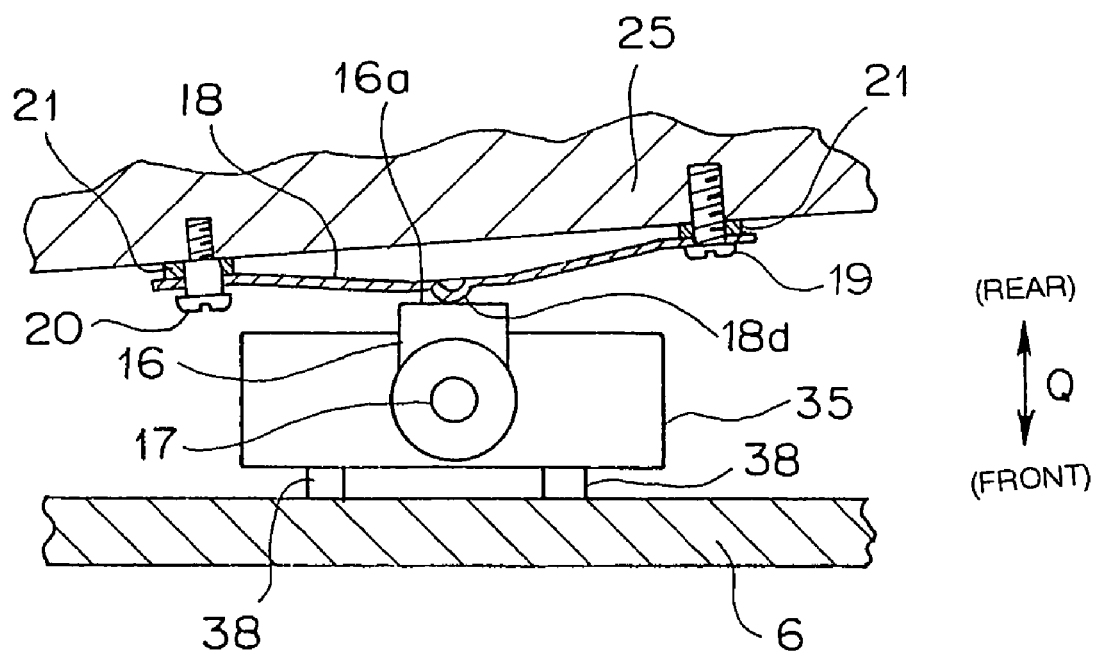
FIG. 15B is a side view illustrating another pressing state in accordance with the postures of the assembled rotor plate, presser plate, leaf spring, and vibrator unit in the vibration wave motor shown in FIG. 1.
Figure 16:
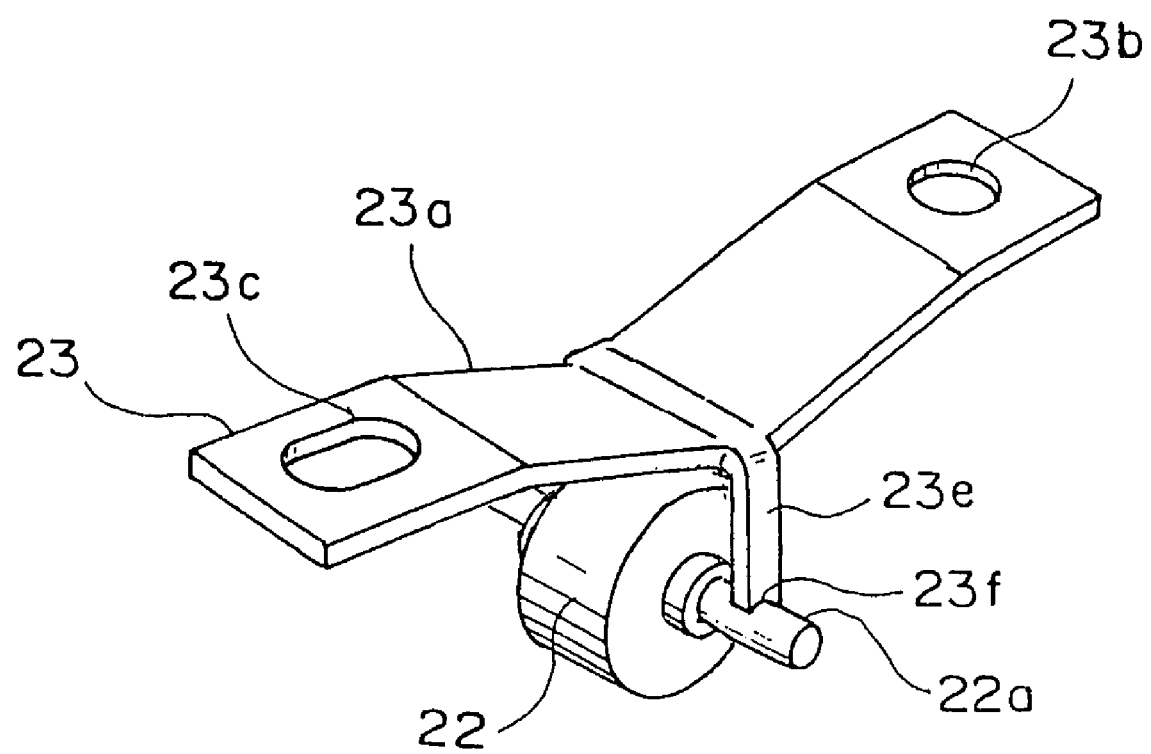
FIG. 16 is a perspective view of a roller and the presser plate applied to the vibration wave motor shown in FIG. 1.

FIGS. 11A and 11B illustrate the leaf spring applied to the vibration wave motor, where FIG. 11A is a plan view of the leaf spring and FIG. 11B is a sectional view taken along the line C-C of FIG. 11A when the leaf spring is attached to the presser plate and is deformed by pressure applied from a vibrator holder of the vibrator unit. FIG. 12 is an exploded perspective view of the vibrator unit, the leaf spring, and the presser plate of the vibration wave motor. FIG. 13 is a perspective view of the leaf spring attached to the presser plate in the vibration wave motor. FIG. 14 is a perspective view of the vibrator unit urged against the leaf spring shown in FIG. 13. FIGS. 15A and 15B illustrate the change in contact conditions between the leaf spring and the vibrator holder of the vibrator unit in accordance with the posture of the assembled housing and presser plate. FIG. 16 is a perspective view of the roller and the presser plate applied to the vibration wave motor.

The housing 2 is a ring-shaped support member. As shown in FIGS. 1, 2, 4, and 7, the housing 2 includes three insertion openings 2a for inserting the vibrator and the roller. The three insertion openings 2a are circumferentially spaced apart substantially in an equiangular manner from each other (i.e., substantially at 120° intervals). Each of the insertion openings 2a extends in the Q direction (i.e., the direction parallel to the rotation axis direction O) to pass through the housing 2. In each of the insertion openings 2a, two guide grooves 2b are formed while being opposed to each other in the R direction at the center of the insertion opening 2a and while passing through the housing 2 in the Q direction. The guide grooves 2b function as fitting grooves (a guide support portions) for guiding a support shaft of the vibrator. The three insertion openings 2a have substantially the same shape. Also, the guide grooves 2b have substantially the similar positions in the insertion openings 2a and have substantially the same shape.

As shown in FIGS. 1 and 4, in the rotor 3, an annular-shaped rotor plate 6 functioning as a friction member, and a ring-shaped spacer 7 formed with resilient plate member and functioning as a spacer member, and an annular-shaped rotor body 4 functioning as a moving member are integrated. The rotor 3 is rotatably supported by the bearing member 8 about the rotation axis O.

The rotor plate 6 is formed from a wear-resistant and high-hardness ceramic plate material (e.g., zirconia). The rotor plate 6 is in contact with a vibrator 35 (more specifically, a driving element 38 shown in FIG. 9) of the vibrator unit 15. Elliptical vibration, which is a composition of a longitudinal vibration and a bending vibration, excited by the vibrator 35, causes the rotor plate 6 to rotate about the rotation axis O. The rear side of the rotor plate 6 in the Q direction, that is, the side adjacent to the vibrator is a friction contact surface 6a, which is in contact with the driving element 38 in a thrust direction (the Q direction). The driving element 38 is a friction contact portion of the vibrator 35 urged by the leaf spring 18. A direction in which the rotor plate 6 is in contact with the vibrator 35 coincides with a direction of the amplitude of the bending vibration of the vibrator 35. This direction is perpendicular to the moving direction of a driven member. The friction contact surface 6a is also in rolling contact with the roller 22 urged by the leaf spring 23 in the thrust direction (the Q direction). In order to reliably transform the vibration of the vibrator 35 to the torque of the rotor, the rotor plate 6 has a rigidity so that deformation or deflection of the rotor plate 6 is sufficiently small compared to the vibration amplitude of the vibrator 35, thus providing stable rotation.

The ring-shaped spacer 7 is formed from a vibration-resistant resilient plate material (e.g., elastomer or felt). On a surface of the ring-shaped spacer 7, a double-faced adhesive tape is attached. The ring-shaped spacer 7 is brought into tight contact with the rotor plate 6 and the rotor body 4 so that the ring-shaped spacer 7 is bonded and fixed to the rotor plate 6 and the rotor body 4. The double-faced adhesive tape is also formed from a vibration-resistant resilient plate material. Consequently, the double-faced adhesive tape may function as the ring-shaped spacer 7 by itself.

The ring-shaped spacer 7 is a member to insulate the vibration of the vibrator 35. In addition, the spacer 7 serves as a second pressing strength adjustment means (a pressing strength adjustment mechanism). That is, by selecting a thickness of the spacer 7, the contact force between the two vibrators 35 and the rotor plate 6 can be adjusted so as to obtain an appropriate frictional contact force therebetween. Also, the contact force between the roller 22 and the rotor plate 6 can be adjusted so as to obtain an appropriate frictional contact force therebetween. Since the ring-shaped spacer 7 is in tight contact with the rotor body 4, the double-faced adhesive tape can be eliminated if the frictional force caused by the contact is sufficiently higher than the driving force output from the vibration wave motor 1.

The rotor body 4 is formed from a wear-resistant and high-hardness plate material. On the surface of the rotor body 4 on the front side (adjacent to the bearing member 8), a V groove 4b is formed in which balls 9 roll along the circumference of the rotor body 4. Additionally, a protrusion 4a for connection is formed on the inner peripheral surface of the rotor body 4 while extending towards the center of the ring. Furthermore, on the outer peripheral surface of the rotor body 4, a magnetic sheet 5 (see FIG. 4) is bonded. The magnetic sheet 5 is in sliding contact with a magnetic sensor 54 (see FIG. 29) fixed to the inner peripheral surface of the housing 2. The magnetic sensor 54 detects a rotational amount of the rotor.

As shown in FIGS. 4 and 5, the connection rod 28 for transferring output power is engaged with the protrusion 4a and is latched in order to drive an electronic apparatus to which the vibration wave motor 1 is applied. For example, when the vibration wave motor 1 is used as a power source of the lens barrel 60, a fork end 28a of the connection rod 28 provided in the lens barrel 60 is engaged with the protrusion 4a. The lens barrel 60 will be described below with reference to FIG. 25. As described below with reference to FIG. 27, the connection rod 28 is fixed, with a screw, to the LD ring 27 rotatably disposed in the lens barrel 60 so that the connection rod 28 transfers the torque of the rotor body 4 to a second zoom frame 65 of the lens barrel 60.

In this embodiment, the rotor 3 includes three members. However, the present invention can be applied to a rotor integrated as a single resin ring member.

As shown in FIGS. 1 and 4, the bearing member 8 includes a plurality of the balls 9 and a ring-shaped retainer 10. In the retainer 10, a plurality of holes for holding the balls 9 is formed. The number of the holes may be greater that the number of the balls 9. In this embodiment, the bearing member 8 is of a thrust type which receives a force in the rotation axis. However, the bearing member 8 may be a radial-thrust ball bearing which can receive a force in both the rotation axis O direction and a direction perpendicular to the rotation axis O.

The bearing holder 11 is a ring-shaped member. The bearing holder 11 is formed from a wear-resistant and high-hardness plate material. As shown in FIGS. 1 and 4, on the surface of the bearing holder 11 on the rear side (adjacent to the bearing member 8), a V groove 11a is formed so that the balls 9 can roll along the circumference of the bearing holder 11. The bearing holder 11 is fixed to the front surface of the housing 2 with a screw so as to be integrated into the housing 2. The balls 9 of the bearing member 8 are in contact with the V groove 11a of the bearing holder 11 in a thrust direction (the Q direction). The rotor body 4, the ring-shaped spacer 7, and the rotor plate 6 are disposed on the rear of the balls 9.

As shown in FIGS. 1 and 4, the driving element 38 of the vibrator 35 or the roller 22 disposed in each of the insertion openings 2a of the housing 2 is in contact with the rotor plate 6. The leaf springs 18 and 23, which urge the vibrator 35 and the roller 22 against the rotor plate 6, are disposed on the side of the vibrator 35 and the roller 22 opposed to the rotor 3, respectively. In the assembled vibration wave motor 1, the leaf springs 18 and 23, the vibrator 35, the roller 22, and the rotor 3 are clamped by the rear presser plates 25 and the front bearing holder 11. While being clamped, the rotor 3 is rotatably supported by the housing 2 and the bearing holder 11 via the balls 9 disposed in the V grooves 4b and 11a. Thus, the bearing holder 11 prevents the vibrator unit 15, the roller 22, and the rotor 3 from dropping off the housing 2.

It should be noted that the bearing holder 11 and the retainer 10 may be formed from a resin molding member.

Figure 17:
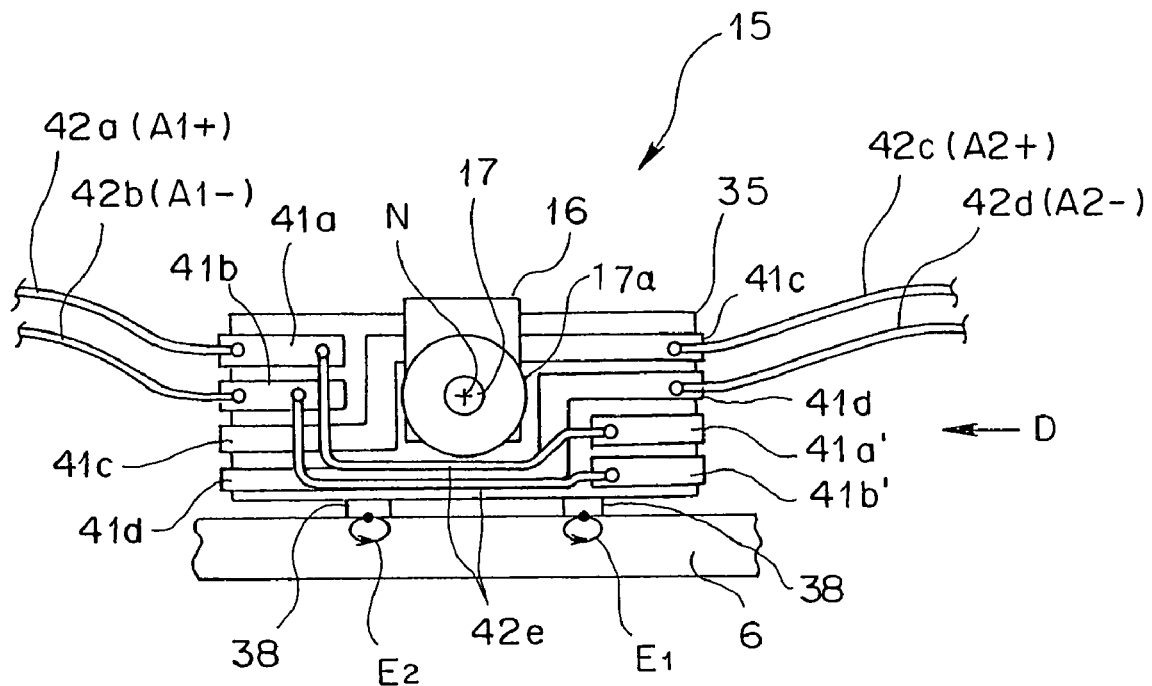
FIG. 17 is an external perspective view of the vibrator unit when viewed from the outer periphery of the vibration wave motor shown in FIG. 1.

As shown in FIGS. 9, 10, and 17, the vibrator unit 15 includes the vibrator 35, which excites elliptical vibration by composition of the longitudinal vibration and bending standing wave vibration, and the vibrator holder 16. The vibrator unit 15 serves as a contacting member in contact with the rotor 3.

The amplitude direction of bending standing wave vibration of the vibrator unit 15 (hereinafter referred to as the "q direction") is substantially perpendicular to the amplitude direction of longitudinal vibration of the vibrator unit 15 (hereinafter referred to as "t direction"). In the vibration wave motor 1 with the vibrator unit 15 assembled, the amplitude direction of bending standing wave vibration is substantially parallel to the rotation axis O (the Q direction), and the amplitude direction of longitudinal vibration is substantially parallel to a direction of tangent which touches a circumference of a circle whose center is the rotation axis O (the T direction).

As shown in FIGS. 9, 10, and 17, the vibrator 35 includes a laminated-piezoelectric substance 37 in which a plurality of piezoelectric sheets are laminated and two of the driving elements 38 serving as two driving units that are affected by the above-described elliptical vibration.

The piezoelectric sheets are laminated in a direction (r direction) perpendicular to the amplitude direction of the bending standing wave vibration and the amplitude direction of the longitudinal vibration. In the vibration wave motor 1 with the vibrator unit 15 assembled, the direction of laminating the piezoelectric sheets is the same as the radial direction (R direction) with respect to the rotation axis O.

The structure and operation of the vibrator 35 will be described in detail below with reference to FIGS. 17 to 24.

Figure 19:
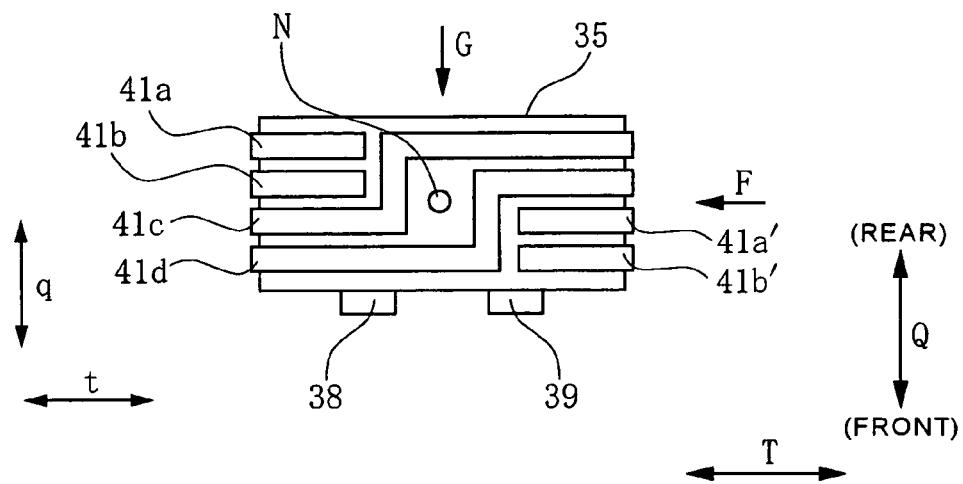
FIG. 19 is an external view of the vibrator, in which a lead wire and a vibrator holder are removed from the vibrator unit shown in FIG. 17.

As shown in FIGS. 9 and 10, the vibrator holder 16 is formed from a U-shaped stainless plate. The vibrator holder 16 is attached to the laminated piezoelectric substance 37 of the vibrator 35 so that the vibrator holder 16 clamps the laminated piezoelectric substance 37 in the r direction. The vibrator holder 16 is fixed to the laminated piezoelectric substance 37 by, for example, bonding, such that the vibrator holder 16 does not prevent the vibration of the vibrator 35. A round support shaft 17, which includes a flange portion 17a and functions as a support protrusion and a center shaft, fits to each side of the U-shaped vibrator holder 16 so that the round support shafts 17 coaxially protrude from both side of the vibrator holder 16 in the r direction. The round support shafts 17 are fixed to the vibrator holder 16 by, for example, caulking. The round support shafts 17 are formed from a stainless material. The round support shaft 17 is bonded and fixed to the vibrator holder 16 so that the center axis of the round support shafts 17 is positioned on the extension of a node line N (which is indicated in FIGS. 4, 17 and 19) of vibration of the vibrator 35 in the r direction. Additionally, the vibrator holder 16 is supported so that an end surface 16a of the U-shaped vibrator holder 16 in the q direction is in a plane defined by the r and t directions (i.e., a plane orthogonal to the q direction) and the center of the end surface 16a is located on the extension of a line in the q direction that passes through the midpoint of the width of the line N of vibration node of the vibrator 35 in the r direction (i.e., the midpoint between the support shafts).

The line N of the vibration node neither vibrates in the amplitude direction (q direction) of the bending standing wave vibration nor vibrates in the amplitude direction (t direction) of the longitudinal vibration.

In the vibration wave motor 1 with the vibrator unit 15 assembled, the round support shafts 17 are disposed along the R direction, and the end surface 16a is disposed in a plane defined by the R and T directions (a plane orthogonal to the Q direction).

As shown in FIG. 4 or 7, the two sets of vibrator units 15 are disposed in the two insertion openings 2a of the housing 2, respectively. The vibrator units 15 can be inserted into the insertion openings 2a from either front or rear side of the housing 2 in the Q direction. The round support shafts 17 rotatably and slidably fit into the guide grooves 2b while eliminating any backlash. The vibrator 35 is supported by the housing 2 so that the vibrator 35 is restricted to move except in the Q direction relative to the housing 2. That is, when the vibrator unit 15 is assembled into the housing 2, the vibrator unit 15 is allowed to move in the amplitude direction of the bending standing wave vibration (q direction) and is restricted to move in the amplitude direction of the longitudinal vibration (t direction) and the lamination direction (the r direction). When the vibrator holder 16 fits in the guide grooves 2b, the two driving elements 38 are disposed along the T direction in the plane defined by the R and T directions so that the two driving elements 38 can be in contact with the friction contact surface 6a perpendicular to the rotation axis O of the rotor plate 6 of the rotor 3 (the R-T plane) from the rear in the Q direction. That is, the driving elements 38 are in contact with the friction contact surface 6a of the rotor plate 6 in the amplitude direction of the bending standing wave vibration of the vibrator unit 15.

In the vibrator unit 15 assembled in the housing 2, if a gap S (see FIG. 4) is formed between the outer surface of the flange portion 17a of the vibrator holder 16 and the inner surface of the insertion opening 2a of the housing 2 in the R direction, a gap adjustment washer (not shown) formed from a slippery material is disposed therebetween so that the vibrator holder 16 is supported without any gap (i.e., backlash) in the R direction. Alternatively, by increasing the width of the vibrator holder 16 in the support shaft direction, the gap S can be eliminated. Power and lead wires 42a, 42b, 42c, and 42d provided to the vibrator 35 (see FIG. 17) externally extend through two lead wire grooves 2c (see FIG. 1) of the housing 2.

In the vibrator 35 disposed as described above, since the direction of the round support shafts 17 is orthogonal to the rotational direction of the rotor 3, the rotation of the rotor 3 is caused to resist being impeded by the vibrator 35.

As shown in FIGS. 11A and 11B, the leaf spring 18 is formed from a resiliently deformable metallic plate. The leaf spring 18 extends in the T direction. On the middle flat section of the leaf spring 18, an oval stepped portion 18d is formed as a pressing portion protruding towards the vibrator unit 15 in the Q direction. In the leaf spring 18, both sides of the oval stepped portion 18d are slightly bent to form arm portions 18a, which are resiliently deformable pressurizing portions. A circular hole 18b is formed at a first end 18e, which is one end of the leaf spring 18, and a slot 18c extending in the T direction is formed at a second end 18f, which is the other end of the leaf spring 18. The oval stepped portion 18d is located at a position where the center axis of the round support shaft 17 is translated in the Q direction. The longitudinal direction of the oval stepped portion 18d is directed along the R direction. The cross-section of the oval stepped portion 18d in the T direction is a semicircular arch or a circular arc (see FIG. 11B). The oval stepped portion 18d is in line contact with substantially the middle portion of the end surface 16a of the vibrator holder 16 when assembled. The position where the oval stepped portion 18d is in line contact with the end surface 16a in the amplitude direction of the longitudinal vibration of the vibrator 35 coincides with the position of the node line N of the vibrator 35. Accordingly, even when a signal is applied to the vibrator 35 to vibrate, the leaf spring 18 can stably urge the vibrator unit 15 against the rotor plate 6.

The two ends of each of the two leaf springs 18 are attached to a front surface 25a of one of the two presser plates 25 with a setscrew 19 and a supporting shoulder screw 20. More specifically, as shown in FIGS. 11B, 12, and 13, the first end 18e, which functions as the leaf spring support mechanism, is fixed to the presser plate 25 by the setscrew 19 passing through the circular hole 18b. On the other hand, the second end 18f, which functions as the leaf spring support mechanism, is supported by the shoulder screw 20 passing through the slot 18c so that the second end 18f can slide on the presser plate 25 in the T direction.

The presser plate 25 on which the leaf spring 18 is attached is fixed to the rear surface of the housing 2 (the surface opposed to the rotor 3) with screws. By fixing the presser plate 25 to the housing 2, the leaf spring 18 is attached, as shown in FIGS. 8 and 14, so that the oval stepped portion 18d presses against, at a predetermined pressing strength, the middle portion of the end surface 16a of the vibrator holder 16 of the vibrator unit 15 inserted to the housing 2. Like the vibrator unit 15, while maintaining the contact, the leaf spring 18 is inserted into the insertion opening 2a of the housing 2 and is held in the insertion opening 2a.

As stated above, the oval stepped portion 18d of the leaf spring 18 is in contact with the end surface 16a of the vibrator holder 16 to press against the vibrator holder 16. Accordingly, the leaf spring 18 deforms, and one end of the leaf spring 18 slides on the shoulder screw 20 along the slot 18c so as to resiliently deform. The oval stepped portion 18d caused by the resilient deformation moves substantially in parallel movement in the Q direction while pressing against the vibrator holder 16 with the pressing strength in the Q direction. At that time, since the leaf spring 18 deforms and extends in the T direction, the position of the oval stepped portion 18d is slightly displaced by a distance δ1. It is desirable that the oval stepped portion 18d is in contact with the middle portion of the end surface 16a in the T direction at a position determined while considering the displacement δ1. However, since it is determined that the oval stepped portion 18d is in contact with the middle portion of the end surface 16a in the amplitude direction of the longitudinal vibration of the vibrator 35 (t direction) at substantially the same position as that of the node line N of the vibrator 35, a stable pressing strength can be obtained even when the position is slightly shifted.

As shown in FIG. 11B, for example, by inserting an adjustment washer 21 having an appropriate thickness and serving as first pressing strength adjustment means (a pressing strength adjustment mechanism) between the bottom surface of the end of the leaf spring 18 and the presser plates 25, the position of the leaf spring 18 in the Q direction can be changed, and therefore, the pressing strength, that is, a strength of a frictional contact force between the driving element 38 and the rotor plate 6 can be adjusted for each vibrator unit. When the pressing strength is thus adjusted, the oval stepped portion 18d is translated, as shown in FIG. 11B. Accordingly, the posture of the oval stepped portion 18d remains unchanged. Therefore, even when the pressing strength is adjusted using the first pressing strength adjustment means, the oval stepped portion 18d can apply pressure without changing the posture thereof in the Q direction (i.e., pressing strength application direction).

Additionally, in some cases of an assemble stage, the precision of the surface of the rotor plate 6, which is in contact with the driving element 38 of the vibrator 35, with respect to the presser plates 25, to which the leaf spring 18 is attached, may be low. In particular, as shown in FIGS. 15A and 15B, the degree of parallelization in the direction (T direction) orthogonal to the Q direction may be low. Even in such cases, since the semicircular arch or circular arc of the oval stepped portion 18d of the leaf spring 18 is in contact with the end surface 16a of the vibrator holder 16 of the vibrator unit 15, the leaf spring 18 is not in contact with the vibrator holder 16 at one side, and therefore, a normal contact therebetween can be obtained. Furthermore, since the end surface 16a is in line contact with the oval stepped portion 18d, the vibrator 35 does not rotate about an axis in the tangential direction T of the rotor 3 or does not fall down. Thus, the stable contact therebetween can be obtained.

When the vibration wave motor 1 is driven, the vibrator 35 pressed by the leaf spring 18 excites a vibration by composition of the bending standing wave vibration with longitudinal vibration, as shown in FIG. 23A to 23D. The vibration changes the posture of the vibrator holder 16 at the vibrator side. However, since the end of the oval stepped portion 18d of the leaf spring 18 is always in line contact with substantially the middle portion of the end surface 16a of the vibrator holder 16, the pressing strength of the leaf spring 18 against the two driving elements 38 of the vibrator 35 remains almost unchanged in all the cases shown in FIG. 23A to 23D. Therefore, the rotor plate 6, which the driving elements 38 are in contact with, evenly receives stable frictional force caused by the elliptical vibration of the two driving elements 38, and therefore, the superior driving force is obtained without a fluctuation in rotation speed, a difference between strengths of forces in the forward and backward directions, and a fluctuation in driving torque. This is because the oval stepped portion 18d is in contact with the middle portion of the end surface 16a in the amplitude direction of the longitudinal vibration of the vibrator 35 (t direction) at substantially the same position as that of the node line N of the vibrator 35.

In the above-described example, the oval stepped portion 18d of the leaf spring 18 presses against the end surface 16a of the vibrator holder 16 in the Q direction. However, a structure different from that of the leaf spring 18 can be applied. For example, the leaf spring 23, which is used to press against the roller 22 shown in FIG. 16, can be applied, in which protrusions 23e are formed at the center of the leaf spring 23 in longitudinal direction and are bent from both side of the leaf spring 23, respectively, towards a vibrator. A top recess part 23f of the protrusion 23e directly presses against a support shaft of the vibrator, as will be described below with reference to FIG. 32. In this case, the vibrator holder 16 can be eliminated.

As shown in FIGS. 5 and 6, the roller 22 includes a support shaft 22a protruding from each end thereof. The roller 22 is disposed in one of the insertion openings 2a of the housing 2. The support shaft 22a slidably and rollably fits in the guide grooves 2b of the housing 2 without backlash (see FIG. 7). In the housing 2, the roller 22 is pressed by the leaf spring 23 from the rear of the housing 2 in the Q direction and is in contact with the friction contact surface 6a of the rotor plate 6 of the rotor 3. The friction contact-surface 6a is perpendicular surface (R-T surface) to the rotation axis O. The roller 22 serves as a contacting member that is in contact with the rotor 3.

As shown in FIGS. 5 and 16, a part of the leaf spring 23 has the same shape as the leaf spring 18. However, the leaf spring 23 has no oval stepped portion 18d shown in FIGS. 11A and 11B. Instead, the leaf spring 23 has two protrusions protruding from the center thereof towards the rotor plate 6 in the Q direction. More specifically, the leaf spring 23 is a resiliently deformable metallic leaf spring extending in the T direction. In the leaf spring 23, both sides of a middle flat portion are slightly bent to form arm portions 23a, which are resiliently deformable pressurizing portions extending in the T direction. A circular hole 23b is formed at a first end, which is one end of the leaf spring 23, and a slot 23c extending in the T direction is formed at a second end, which is the other end of the leaf spring 23. Additionally, a protrusion 23e is formed at the middle flat portion and from the both sides of the leaf spring 23 i.e., in the R direction and is bent towards the rotor plate 6 in the Q direction. A recess part 23f is formed at the top end of the protrusion 23e so that the recess part 23f is engaged with the support shaft 22a.

Like the leaf spring 18, two ends of the leaf spring 23 are attached to a front surface 25a of the presser plate 25 with a setscrew 19 and a supporting shoulder screw 20. That is, the first end of the leaf spring 23 is fixed to the presser plates 25 by the setscrew 19 passing through the circular hole 23b. On the other hand, the second end of the leaf spring 23 is supported by the shoulder screw 20 passing through the slot 23c so that the second end can slide on the presser plate 25 in the T direction. The presser plate 25 on which the leaf spring 23 is attached are fixed to the rear surface of the housing 2 with screws.

The protrusion 23e of the leaf spring 23 attached to the presser plate 25 is inserted into the insertion opening 2a of the housing 2 and the recess parts 23f press against the support shaft 22a of the roller 22 disposed in the housing 2 so that the roller 22 presses against the rotor plate 6 at a predetermined pressing strength (see FIG. 5). After the protrusions 23e are inserted into the insertion opening 2a, the protrusions 23e may be inserted into the guide grooves 2b. Like the pressing strength adjustment method of the leaf spring 18 against the vibrator 35, by inserting the adjustment washer 21 having an appropriate thickness and serving as the first pressing strength adjustment means (a pressing strength adjustment mechanism) between the bottom surface of the end of the leaf spring 23 and the presser plate 25, the pressing strength of the leaf spring 23 against the roller 22 can be adjusted. By inserting the roller 22 into one of the insertion openings 2a of the housing 2, the rotor plate 6 is pressed at three points in the Q direction by two vibrators 35 and one roller 22. Thus, the rotor 3 is stably pressed, thereby providing a stable rotation.

As described above, the three presser plates 25 are attached to the rear surface of the housing 2 with screws. Between the housing 2 and the three presser plates 25, an adjustment washer 26 having an appropriate thickness and serving as the first pressing strength adjustment means (pressing strength adjustment mechanism) is inserted as needed. By using the adjustment washer 26, the pressing strength of the two leaf springs 18 against the two vibrators 35 can be independently and precisely adjusted. Also, the pressing strength of the leaf spring 23 against the roller 22 can be fine adjusted.

According to this embodiment, the vibration wave motor 1 can provide two types of pressing strength adjustment means of the leaf springs 18 and 23 against the vibrator 35 and the roller 22: first pressing strength adjustment means and second pressing strength adjustment means.

The first pressing strength adjustment means can independently adjust the pressing strength of a leaf spring. In this embodiment, as described above, two types of methods are provided: (1) The structure in which the adjustment washer 21 is inserted between the leaf spring and the presser plates 25; and (2) The structure in which the adjustment washer 26 is inserted between the presser plates 25 and the housing 2. Additionally, the first pressing strength adjustment means may include both structure (1) and (2), or the first pressing strength adjustment means may include either one of the structure (1) and (2). By providing the first pressing strength adjustment means, the pressing strength of the three leaf springs can be independently adjusted. Accordingly, each of contact pressures of the vibrator 35 and the roller 22 against the rotor plate 6 can be properly adjusted.

The second pressing strength adjustment means can totally adjust the pressing strength of the leaf springs. In this embodiment, by changing the thickness of the ring-shaped spacer 7, the pressing strength can be adjusted. According to this second pressing strength adjustment means, the pressing strength of the three leaf springs can be totally adjusted, thus facilitating assembly. Additionally, the first and second pressing strength adjustment means may be provided at the same time, or either one of the first and second pressing strength adjustment means may be provided.

The structures and operations of the vibrator unit 15, the vibrator 35, and the driving circuits thereof are described below with reference to FIGS. 17 through 24.

Figure 18:
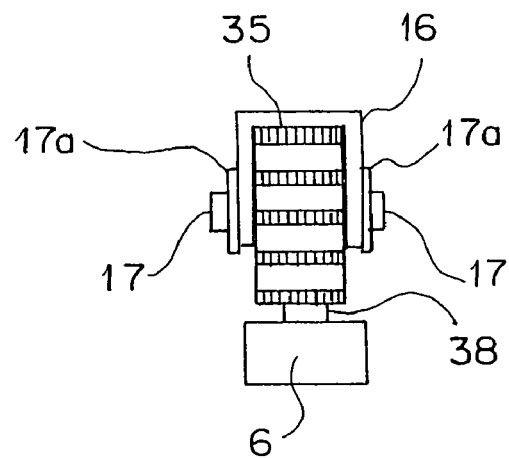
FIG. 18 is a view in the direction of the arrow D of FIG. 17.
Figure 20:
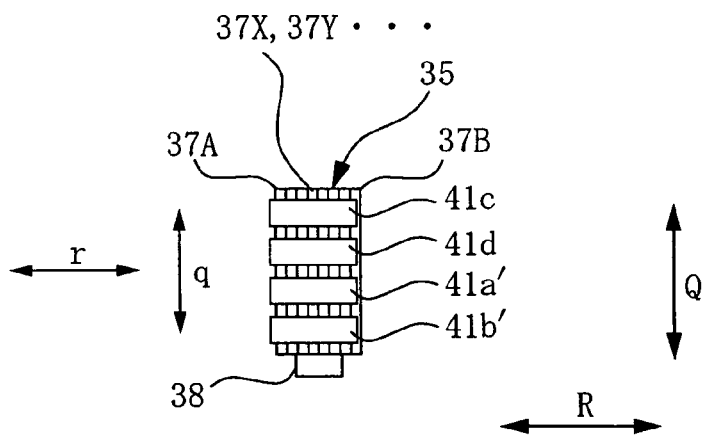
FIG. 20 is a view in the direction of the arrow F of FIG. 19.
Figure 21:
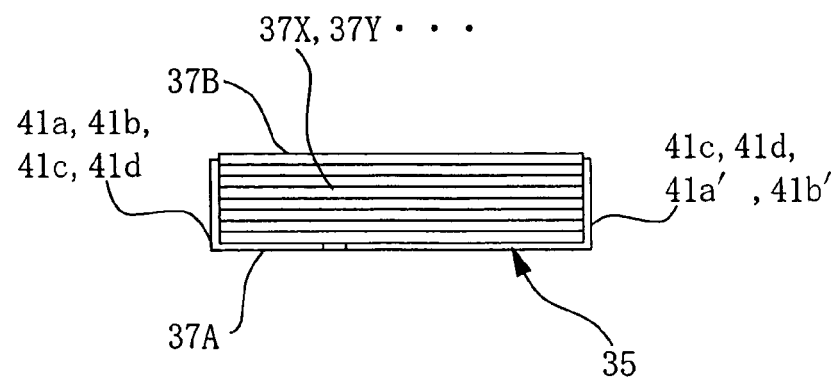
FIG. 21 is a view in the direction of the arrow G of FIG. 19.
Figure 22:
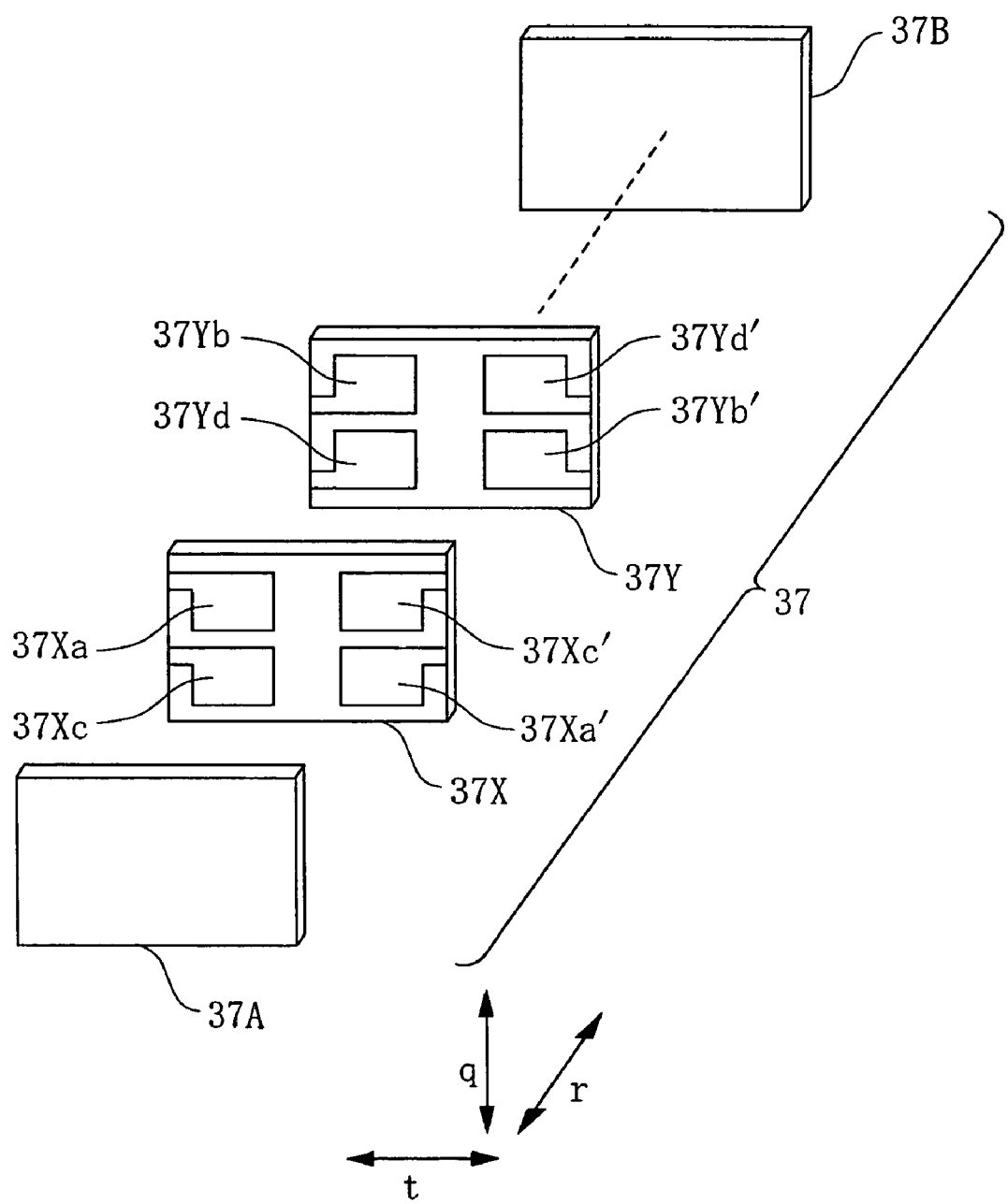
FIG. 22 is an exploded perspective view of a piezoelectric device unit and an insulating plate included in a laminated piezoelectric substance of the vibrator shown in FIG. 19 before sintering the laminated piezoelectric substance.
Figure 23A:
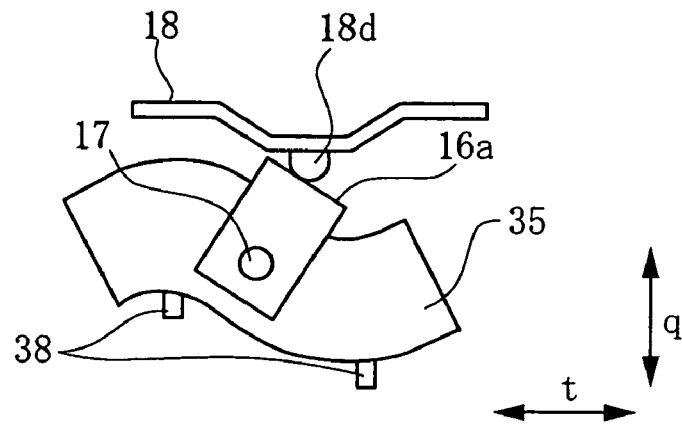
FIG. 23A is an enlarged view of a bending state of the vibrator shown in FIG. 19 when the vibrator is deformed due to a composite vibration composed of a bending vibration and a longitudinal vibration.
Figure 23B:
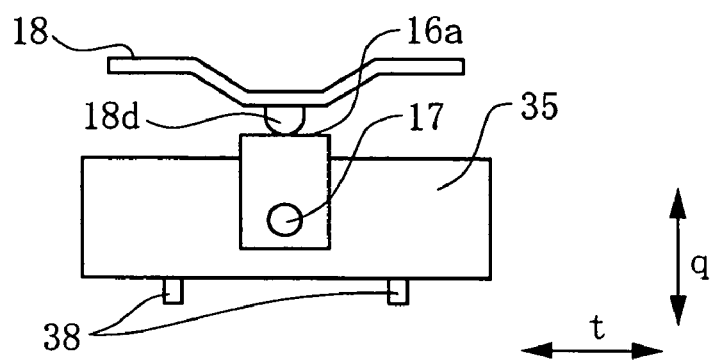
FIG. 23B is an enlarged view of an expanding state of the vibrator shown in FIG. 19 when the vibrator is deformed due to the composite vibration composed of the bending vibration and the longitudinal vibration.
Figure 23C:
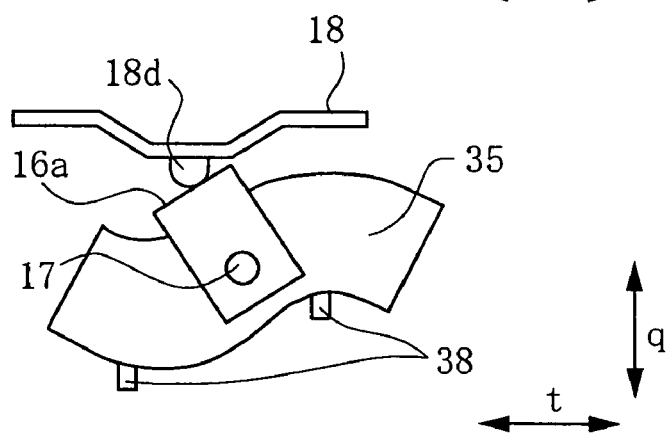
FIG. 23C is an enlarged view of the bending state of the vibrator shown in FIG. 19 when the vibrator is deformed due to the composite vibration composed of the bending vibration and the longitudinal vibration.
Figure 23D:
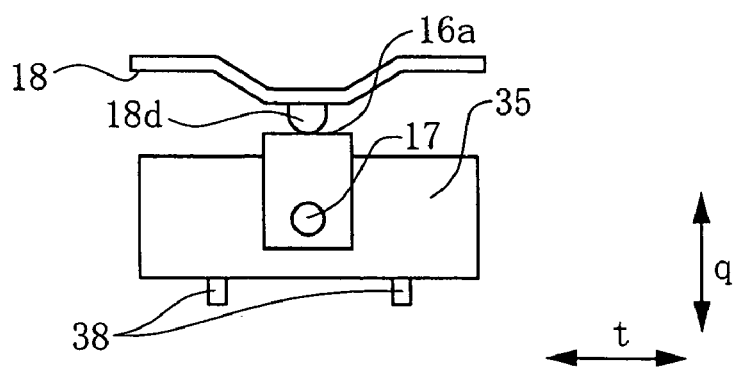
FIG. 23D is an enlarged view of a retraction state of the vibrator shown in FIG. 19 when the vibrator is deformed due to the composite vibration composed of the bending vibration and the longitudinal vibration.
Figure 24:
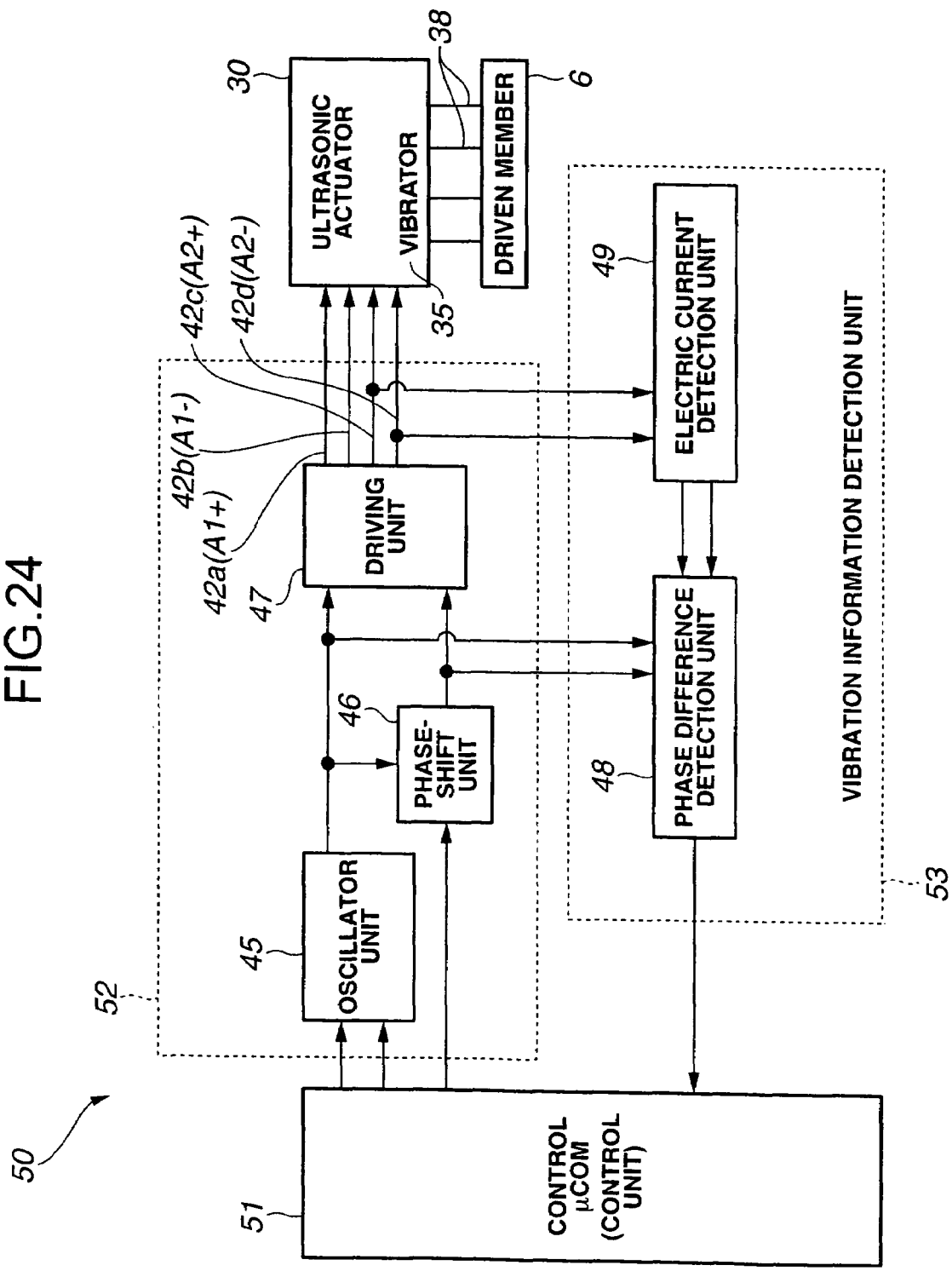
FIG. 24 is a block diagram of a drive control circuit unit for driving the vibrator.

FIG. 17 is an external perspective view of the vibrator unit when viewed from the outer periphery of the vibration wave motor. FIG. 18 is a view on arrow D of FIG. 17, in which the lead wire is removed. FIG. 19 is the external view of the vibrator, in which the lead wire and the vibrator holder are removed from the vibrator unit shown in FIG. 17. FIG. 20 is a view on arrow F of FIG. 19. FIG. 21 is a view on arrow G of FIG. 19. FIG. 22 is an exploded perspective view of a piezoelectric device unit and an insulating plate included in a laminated piezoelectric substance of the vibrator before sintering the laminated piezoelectric substance. FIGS. 23A-23D are enlarged views illustrating the change in shape of the vibrator and also illustrating the vibrator unit and a leaf spring applying pressure to the vibrator unit when the bending vibration and the longitudinal vibration are composed, where FIG. 23A illustrates a bending state of the vibrator, FIG. 23B illustrates an expanding state of the vibrator, FIG. 23C illustrates a bending state of the vibrator, and FIG. 23D illustrates a retraction state of the vibrator. FIG. 24 is a block diagram of a drive control circuit unit for driving the vibrator. It is noted that the R, T, Q directions in the drawings denote the directions in the vibration wave motor 1 assembled with the vibrator 35.

As shown in FIG. 22, the laminated piezoelectric substance 37, which forms the vibrator 35, includes two types of a plurality of piezoelectric sheets 37XX and 37Y, which are electric/mechanical energy transducers, and two insulating sheets 37A and 37B. On a surface of the laminated piezoelectric substance 37, an electrode pattern is formed from conductive silver paste. The electrode pattern includes electrodes 41a, 41b, 41c, 41d, 41a', and 41b'.

Each of the piezoelectric sheets 37XX and 37Y is formed from a rectangular piezoelectric device having a thickness of about 100 μm. A surface of the piezoelectric sheet 37X is divided into four areas, which are electrically insulated to each other. A silver-paradigm alloy having a thickness of about 10 μm is applied to the surfaces of the divided areas on one surface to form first internal electrodes 37Xa, 37Xc, 37Xc', and 37Xa', respectively. As shown in FIG. 22, the upper end of each internal electrode extends to the side of the piezoelectric sheet in the longitudinal direction. This longitudinal direction is the amplitude direction of the longitudinal vibration of the vibrator 35.

On the other hand, a surface of the piezoelectric sheet 37Y is divided into four areas, which are electrically insulated to each other. A silver-paradigm alloy having a thickness of about 10 μm is applied to the surfaces of the divided areas on one surface to form second internal electrodes 37Yb, 37Yd, 37Yd', and 37Yb', respectively. As shown in FIG. 22, the lower end of each internal electrode extends to the side of the piezoelectric sheet in the longitudinal direction. The piezoelectric sheets 37X and 37Y are laminated so that the surfaces including the first internal electrodes 37Xa, 37Xc, 37Xc', and 37Xa' are not in contact with the surfaces including the second internal electrodes 37Yb, 37Yd, 37Yd', and 37Yb'.

In the neighboring piezoelectric sheets 37X and 37Y, the arrangement of the first internal electrodes 37Xa, 37Xc, 37Xc', and 37Xa' is substantially the same as that of the second internal electrodes 37Yb, 37Yd, 37Yd', and 37Yb'. When the piezoelectric sheets 37X and 37Y are laminated, the rectangular portions of the electrodes are arranged so as to overlap each other. However, the ends of the electrodes are upside down. Two types of piezoelectric sheets 37X and 37Y having such arrangements of the electrodes are alternately layered up to about forty layers.

In FIG. 22, on the left side of the piezoelectric device in which the piezoelectric sheets are layered, internal electrode exposed portions are formed in which the ends of the first internal electrodes 37Xa and 37Xc and the second internal electrodes 37Yb and 37Yd are exposed. On the right side of the piezoelectric device in which the piezoelectric sheets are layered, internal electrode exposed portions are formed in which the ends of the first internal electrodes 37Xc' and 37Xa' and the second internal electrodes 37Yd' and 37Yb' are exposed. Additionally, on each of the internal electrode exposed portions, an independent four external electrode made of conductive silver paste is formed on both sides to communicate with the internal electrode.

The insulating sheets 37A and 37B have the same rectangular shape as that of the piezoelectric sheets 37X and 37Y and are arranged so that the insulating sheets 37A and 37B sandwich the above-described layered piezoelectric sheets so as to form the laminated piezoelectric substance 37. Thereafter, the laminated piezoelectric substance 37, in which the sheets are layered, is sintered, and electrodes are polarized using the above-described electrodes to form the vibrator 35.

On a surface of the insulating sheet 37A of the vibrator 35, electrodes 41a, 41b, 41c, 41d, 41a', and 41b' are formed from conductive silver paste (see FIG. 19). The internal electrodes exposed on both sides of the laminated piezoelectric sheets are connected to the electrodes 41a, 41b, 41c, 41d, 41a', and 41b'. That is, the electrode 41a is electrically connected to the first internal electrode 37Xa. The electrode 41b is electrically connected to the second internal electrode 37Yb. The electrode 41c is electrically connected to the first internal electrodes 37Xc and 37Xc'. The electrode 41d is electrically connected to the second internal electrodes 37Yd and 37Yd'. The electrode 41a' is electrically connected to the first internal electrode 37Xa'. The electrode 41b' is electrically connected to the second internal electrode 37Yb'.

On the insulating sheet 37A, the electrodes 41a and 41b are electrically connected to the electrodes 41a' and 41b' via two lead wires 42e, respectively. Furthermore, a lead wire 42a is connected to the electrode 41a. A lead wire 42b is connected to the electrode 41b. A lead wire 42c is connected to the electrode 41c. A lead wire 42d is connected to the electrode 41d. These lead wires 42a, 42b, 42c, and 42d are connected to a vibrator driving signal output terminal of a driving unit 47 of a vibrator driving circuit 52, which is described later in FIG. 24. More specifically, the lead wire 42a is connected to a signal line A1 "+" phase. The lead wire 42b is connected to a signal line A1 "−" phase. The lead wire 42c is connected to a signal line A2 "+" phase. The lead wire 42d is connected to a signal line A2 "−" phase. The signal lines A1 "+", A1 "−", A2 "+", and A2 "−" are the vibrator driving signal lines (output terminals) of the driving unit 47.

Two driving elements 38 are bonded to the front surface of the laminated piezoelectric substance 37, which forms the vibrator 35, in a direction (q direction) orthogonal to the lamination direction of the laminated piezoelectric substance 37 at positions of antinodes of vibration spaced in the longitudinal direction (t direction). The driving element 38 is formed by dispersing alumina in a high-polymer material.

As stated above, the vibrator holder 16 including the round support shafts 17 is bonded to the outer surfaces of the vibrator 35 while bridging over the vibrator 35 in the lamination direction (r direction). Each of the round support shafts 17 outwardly extends in the r direction. The center point of the round support shafts 17 is positioned at the node of vibration. At that time, the round support shafts 17 are positioned at the center point between the two driving elements 38 in the longitudinal direction of the vibrator 35. In the vibration wave motor 1 in which the vibrator 35 is assembled as the vibrator unit 15, the vibrator 35 is disposed so that the lamination direction of the piezoelectric sheets is parallel to the radial direction with respect to the rotation axis O. Also, in the vibration wave motor 1 in which the vibrator unit 15 is assembled, the electrodes 41a, 41b, 41a', and 41b' on the insulating sheet 37A are arranged towards the outer periphery of the housing 2. Accordingly, the lead wires 42a, 42b, 42c, and 42d are easily led to outside the housing 2 while passing through the lead wire grooves 2c.

As shown in FIG. 24, when the vibration wave motor 1 is used for a power source, a drive control unit 50 for controlling the drive of the vibrator 35 includes a control microcomputer 51 (hereinafter referred to as a "control μcom") for controlling each circuit unit; a vibrator driving circuit 52 including an oscillator unit 45, a phase-shift unit 46, and a driving unit 47; and a vibration information detection unit 53 including a phase difference detection unit 48 and an electric current detection unit 49.

To drive the vibration wave motor 1, a drive signal output from the oscillator unit 45 is phase-controlled by the phase-shift unit 46, and is applied to the driving unit 47 in the vibrator driving circuit 52 controlled by the control μcom 51. The drive signal is output from driving unit 47 and applied to the electrodes 41a (41a'), 41b (41b'), 41c, and 41d of the vibrator 35 via the lead wires 42a to 42d.

More specifically, the signal from the oscillator unit 45 is directly input to the signal lines A1 "+" phase and A1 "−" phase via the driving unit 47. The signal output from the oscillator unit 45 and phase-changed by 90° by the phase-shift unit 46 is input to the signal lines A2 "+" phase and A2 "−" phase via the driving unit 47. That is, one of the signals not passing through the phase-shift unit 46 is voltage-amplified while maintaining the original phase, and is output as a first signal (A1 "+" phase). This signal is applied to the electrode 41a (41a'). The other signal not passing through the phase-shift unit 46 is voltage-amplified while the original phase is time-shifted by 180° from the first signal and the original voltage is reversed to a minus side, and is then output as a second signal (A1 "−" phase). This signal is applied to the electrode 41b (41b').

In contrast, one of the signals passing through the phase-shift unit 46 and phase-changed by 90° is voltage-amplified while maintaining the phase, and is output as a third signal (A2 "+" phase). This signal is applied to the electrode 41c. The other signal is voltage-amplified while the phase is time-shifted by 180° from the third signal and the voltage is reversed to a minus side, and is then output as a fourth signal (A2 "−" phase). This signal is applied to the electrode 41d.

By inputting the first to fourth signals to the vibrator 35, the vibrator 35 generates vibration in which bending vibration is composed with longitudinal vibration. That is, the vibration in which the bending standing wave vibration is composed with the longitudinal vibration shown in FIGS. 23A to 23D is generated so that top ends of the upper and lower driving elements 38 generate elliptical vibrations whose phases are shifted 180° from each other (elliptical vibrations of loci E1 and E2 shown in FIG. 17 or elliptical vibrations of trajectories of the opposite direction).

The moving direction of the rotor 3 is determined by the rotational direction of the elliptical vibrations of the driving elements 38. The rotational direction of the elliptical vibrations is determined by the phase difference determined by the phase-shift unit 46.

To detect an electric current of cyclic signal applied to the vibrator 35, which is a parameter indicating a vibration state, the electric current detection unit 49 in the vibration information detection unit 53 is connected to a drive signal line of the vibrator 35. The phase difference detection unit 48 in the vibration information detection unit 53 is connected to the electric current detection unit 49 in order to detect a phase difference between the voltage of the cyclic signal from the oscillator unit 45 and the electric current detected by the electric current detection unit 49. The control μcom 51 is connected to the phase difference detection unit 48 in order to receive the phase difference signal between the detected electric current and voltage. Furthermore, the oscillator unit 45 is connected to the control μcom 51.

The phase difference detection unit 48 detects the phase difference between the electric current and the voltage as a parameter indicating the vibration state of the vibrator 35. Using the phase difference between the electric current and the voltage, the control μcom 51 detects a frequency in the vicinity of the resonance frequency of the vibrator 35 whose vibration state is changed due to the external environment change. The control μcom 51 feeds back the detected frequency in the vicinity of the resonance frequency to the oscillator unit 45.

In this embodiment, the driving signal applied to the vibrator 35 is a cyclic signal. However, a square wave signal, a sine wave signal, or a sawtooth wave signal may be used. Also, in this embodiment, the phase difference detected by the phase difference detection unit 48 is determined to be the phase difference between the voltage of the cyclic signal from the oscillator unit 45 and the electric current of the cyclic signal applied to the vibrator 35. The method for detecting the phase difference may be applied by other method, for example, by using the phase difference between the voltage and the electric current of the cyclic signal applied to the vibrator 35.

As described above, in the vibration wave motor 1, by inputting the phase difference between the electric current of the cyclic signal applied to the vibrator 35, which is a signal detected by the phase difference detection unit 48, and the voltage of the cyclic signal from the oscillator unit 45, the frequency in the vicinity of the resonance frequency of the vibrator 35 is detected when the frequency detection operation is carried out. The detection result is fed back to the oscillator unit 45 so that the vibrator 35 can be driven by the detected frequency in the vicinity of the resonance frequency even when the resonant state of the vibrator 35 changes due to the change in the external environment. Accordingly, the vibrator 35 can be advantageously driven in conditions that provide high drive efficiency.

The vibration wave motor 1 having such a structure is integrated into a unit, as shown in FIG. 1. The unit can be assembled as an actuator of, for example, a lens barrel. In the assembled unit, the vibrator 35 is driven by the vibrator driving circuit 52 and the driving element 38 generates the elliptical vibration. Thus, the rotor plate 6 of a driven member in contact with the driving element 38 rotates about the rotation axis O in a desired direction together with the rotor body 4. In this embodiment, the torque of the rotation rotates the connection rod 28 engaged with the rotor body 4. For example, a lens drive frame of the lens barrel is rotated by the connection rod 28 so that the lens drive frame moves forward and backward.

The structure and operation of the vibration wave motor 1 is described next with reference to FIGS. 25 through 29 when the vibration wave motor 1 is assembled to a lens barrel of an interchangeable zoom lens of a single-lens reflex camera.

Figure 25:
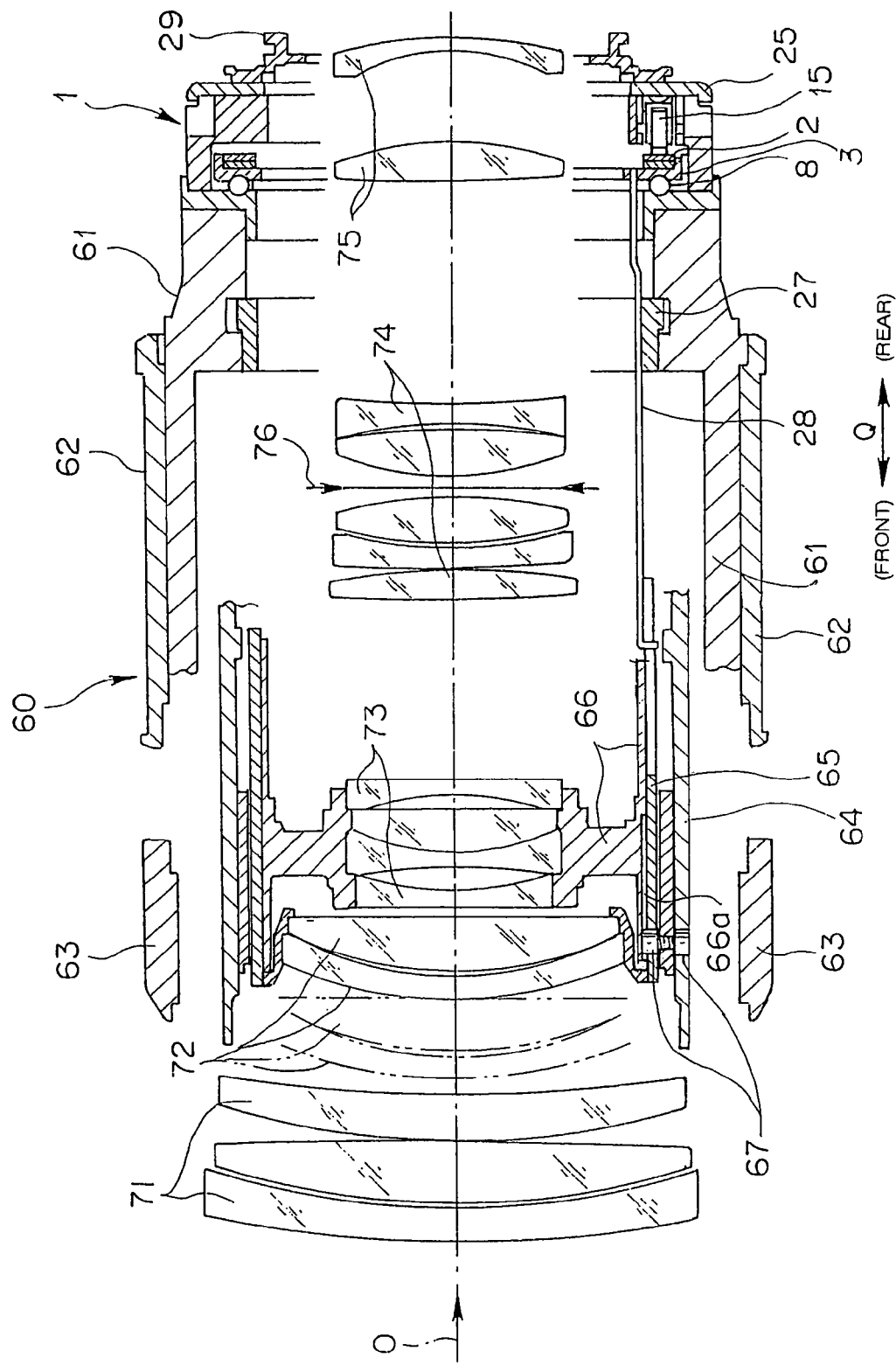
FIG. 25 is a longitudinal sectional view of a lens barrel to which the vibration wave motor shown in FIG. 1 is applied as a driving source and the view including an optical axis when the lens barrel is in a wide-angle state.
Figure 26:
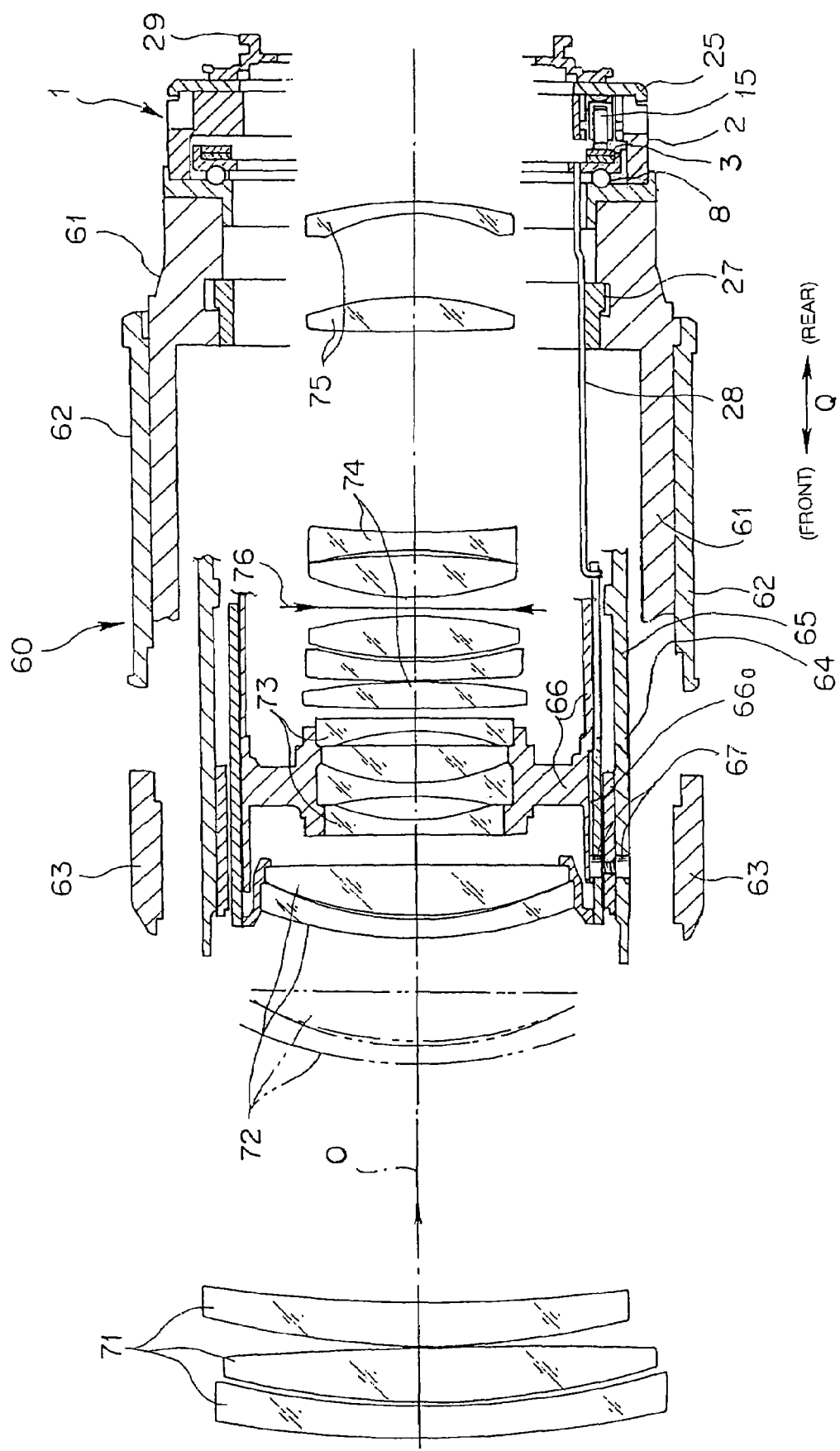
FIG. 26 is a longitudinal sectional view of the lens barrel including the optical axis when the lens barrel shown in FIG. 25 is in a telescopic state.
Figure 27:
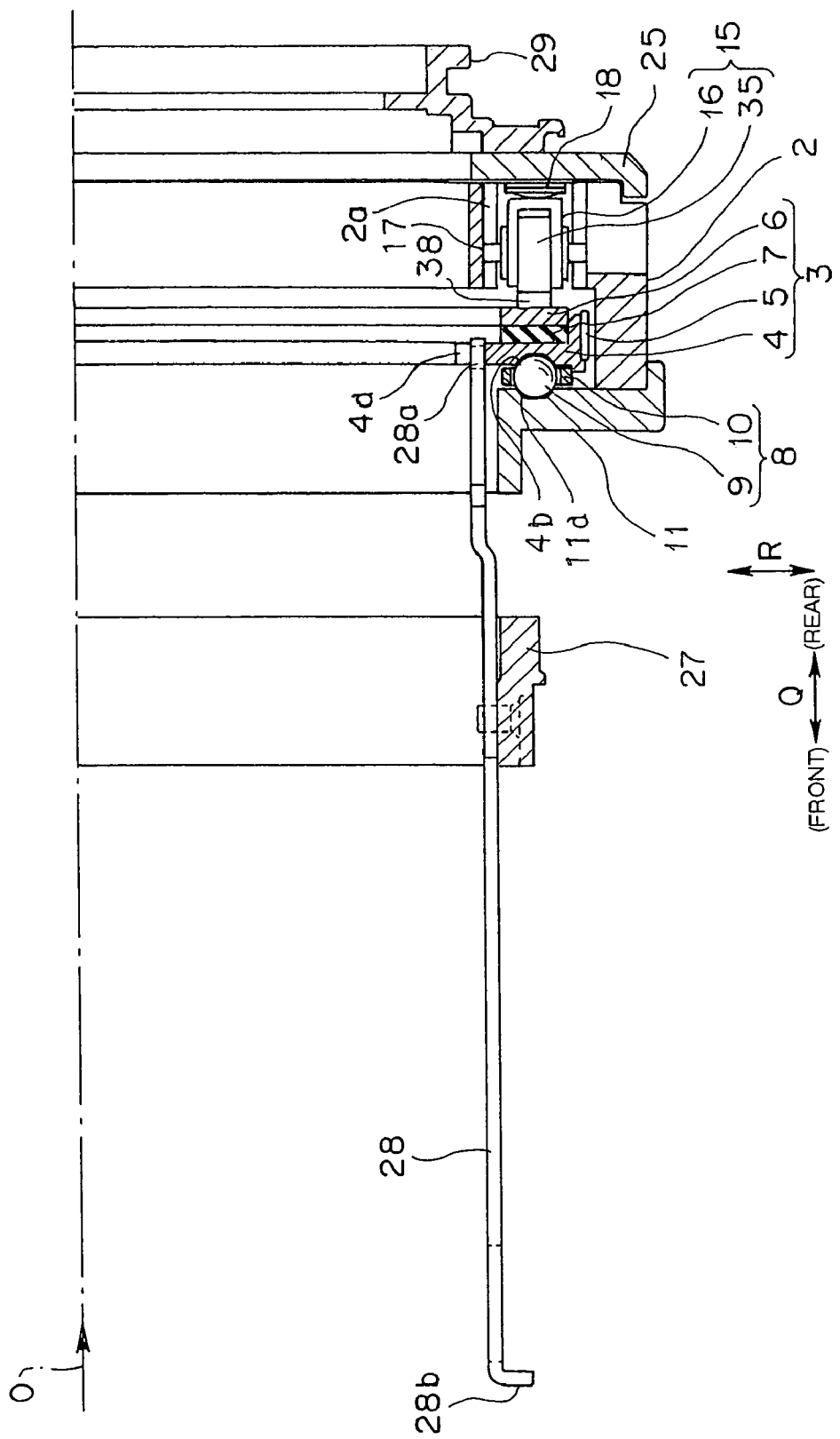
FIG. 27 is a sectional view of the vibration wave motor, a lens mount and an LD ring including an optical axis in the lens barrel shown in FIG. 1.
Figure 28:
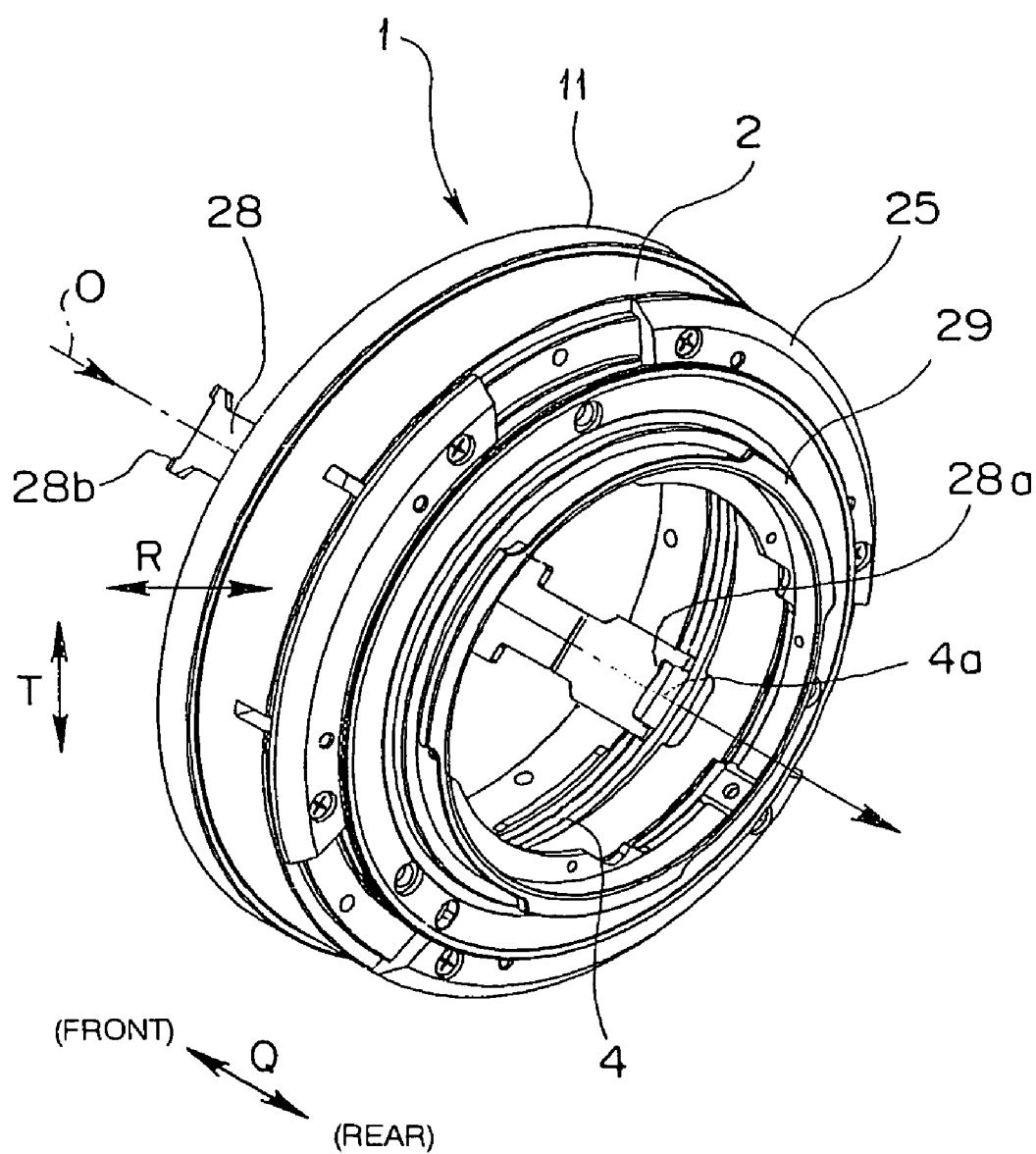
FIG. 28 is a perspective view of the vibration wave motor in the lens barrel shown in FIG. 1 when a connection rod and the lens mount are attached to the vibration wave motor.
Figure 29:
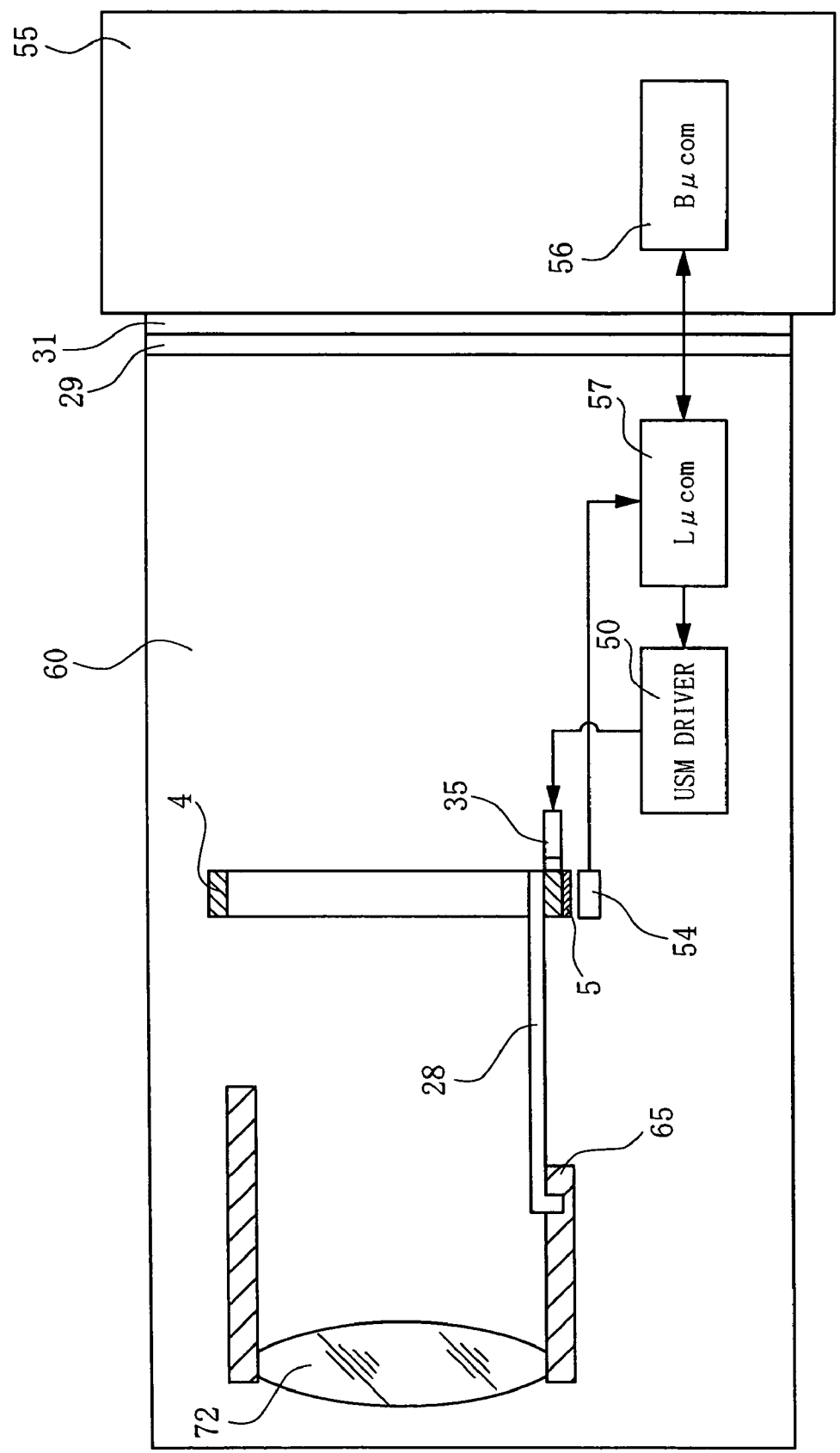
FIG. 29 is a block diagram of a vibration wave motor control apparatus incorporated in the lens barrel shown in FIG. 25 and a camera body to which the lens barrel is mounted.

FIG. 25 is a longitudinal sectional view of the lens barrel including an optical axis when the lens barrel is in a wide-angle state. FIG. 26 is a longitudinal sectional view of the lens barrel including an optical axis when the lens barrel is in a telescopic state. FIG. 27 is a sectional view of the vibration wave motor and an LD ring including the optical axis in the lens barrel. FIG. 28 is a perspective view of the vibration wave motor in the lens barrel when a connection rod and the lens mount are attached to the vibration wave motor. FIG. 29 is a block diagram of a vibration wave motor control apparatus incorporated in the lens barrel and a camera body.

An interchangeable lens barrel 60 is mounted to a camera body 55 (see FIG. 29) and is capable of zooming and focusing. As shown in FIGS. 25 and 26, the interchangeable lens barrel 60 includes a fixed frame 61, the vibration wave motor 1 serving as a drive source unit mounted on the fixed frame 61, and a zoom operation ring 62 and a distance operation ring 63 rotatably supported by the fixed frame 61. The interchangeable lens barrel 60 further includes a first group lens 71, a second lens group 72 serving as a focus lens, a third group lens 73, a fourth group lens 74 including an aperture 76, and a fifth group lens 75 from the front, all of which have the same optical axis O. The interchangeable lens barrel 60 further includes a first group frame holding the first group lens 71 movable forward and backward, a second zoom frame 65 holding the second lens group 72 also movable forward and backward, a third group frame 66 which is fixed to the fixed frame 61 and which includes a linear guide 66a for a cam follower 67 and which holds the stationary third group lens 73, a fourth group frame for holding the fourth group lens 74 and the fifth group lens 75 movable forward and backward, a rotatable cam frame 64, the cam follower 67 engaged with the second zoom frame 65 and a cam groove of the cam frame 64, the lens driving ring (LD ring) 27 rotatively supported by the fixed frame 61 and to which the connection rod 28 is fixed, and a lens mount 29 fixed to the rear surface of the housing 2 with screws.

Thus, the vibration wave motor 1 is incorporated in the lens barrel 60 so that the housing 2 faces the mount 29 of the interchangeable lens barrel 60 and the rotor 3 faces the lenses. Since the rotor 3 of the vibration wave motor 1 is arranged to face the lens, which is a driving target, a driving force transfer mechanism in the lens barrel 60 can be simplified.

In addition, the connection rod 28 supported by the LD ring 27 is assembled so that the rear fork end 28a adjacent to the vibration wave motor 1 is engaged with the protrusion 4a of the rotor body 4 of the vibration wave motor 1, and a front fork end 28b is engaged with the second zoom frame 65 only relatively slidably in the Q direction. Accordingly, when the rotor 3 of the vibration wave motor 1 is driven to rotate, the connection rod 28 rotates along with the LD ring 27, and therefore, the second zoom frame 65 is driven to rotate. As the second zoom frame 65 rotates, the second zoom frame 65 is driven to move forward and backward along the cam groove engaged with the cam follower 67.

As shown in FIG. 29, a vibration wave motor drive control unit for driving the vibration wave motor 1 in the lens barrel 60 includes a Bμcom 56 in the camera body 55, an Lμcom 57 in the lens barrel 60, a USM driver 52 (corresponding to the drive control unit 50 in FIG. 24), the magnetic sensor 54 for detecting the rotational amount of the rotor 3, and the vibrator 35. The Lμcom 57 is electrically connected to the camera body 55 via a body mount 31 and the lens mount 29.

In the lens barrel 60 to which the camera body 55 is mounted, when the zoom operation ring 62 is rotated, a zooming operation is performed. That is, when the cam frame 64 is rotated by the zooming operation, the second zoom frame 65 moves forward or backward via the cam follower 67, and therefore, the second lens group 72 moves to a zooming position. Simultaneously, the first group lens 71, the fourth group lens 74, and the fifth group lens 75 move to the zooming positions thereof via a cam follower (not shown). However, the third group lens 73 does not move forward and backward. FIGS. 25 and 26 illustrate the lens barrel 60 when the lens barrel 60 is driven by the zooming operation so as to move forward or backward to a wide-angle position or a telescopic position.

If the distance operation ring 63 is rotated or if a focusing operation is performed on the basis of measured distance data from a ranging unit, the group lenses at the zooming positions shown in FIG. 25 or FIG. 26 are driven for focusing. That is, the Bµcom 56 computes data of an amount of movement of the second lens group 72 on the basis of data of the rotational amount of the distance operation ring 63 from the Lµcom57 or the measured distance data from the ranging unit. In accordance with the displacement data, the Lµcom57 drives the drive control unit 50 so that the vibrator 35 of the vibration wave motor 1 excites ultrasonic vibration. The vibration of the vibrator 35 rotates the rotor body 4, which in turn rotates the second zoom frame 65 via the connection rod 28. The rotation of the second zoom frame 65 moves the second lens group 72 forward or backward via the cam follower 67. When the magnetic sensor 54 detects the rotation of the rotor body 4 corresponding to the displacement data, that is, when the second lens group 72 moves to a predetermined focusing position, the ultrasonic vibration of the vibrator 35 is stopped and the focusing operation stops.

In this embodiment, as shown in FIGS. 1 and 2, the vibration wave motor 1 is integrated into a unit serving as a power source. The unit can be applied to a lens barrel and other electronic apparatuses. In the vibration wave motor 1, the vibrator 35 reliably presses against the rotor 3 so as to increase the power conversion efficiency of the motor. That is, by employing the leaf spring 18 of the shape shown in FIGS. 11A and 11B as a vibrator urging member, the oval stepped portion 18d presses against the center (upper position of the node of vibration) of the end surface 16a of the vibrator holder 16 in the Q direction. Accordingly, the vibrator 35 can be pressed without preventing the vibration. In addition, since the leaf spring 18 presses against the vibrator 35 without pressing only one side of the vibrator 35, the two driving elements 38 can be more evenly pressed against the rotor plate 6 and can be stably pressed against the rotor plate 6 in a direction perpendicular to the friction contact surface. Thus, a vibration wave motor can be achieved that provides a high conversion efficiency by eliminating a fluctuation in rotation speed, a difference between strengths of forces in the forward and backward directions, and a fluctuation in driving torque.

Furthermore, by selectively using the adjustment washer 21 inserted into the leaf spring 18, and the adjustment washer 26 inserted into the presser plates 25 and the ring-shaped spacer 7 as a pressing strength adjustment mechanism, the pressing strength can be reliably adjusted.

Still furthermore, since the vibration wave motor 1 is integrated into a unit serving as a power source, the vibration wave motor 1 can be easily assembled in a variety of types, a variety of specifications of lens barrels or electronic apparatuses.

In the above-described examples, two vibrators 35 and one roller 22 are inserted into the three insertion openings 2a of the housing 2 to assemble them. However, by changing the number of the inserted vibrators 35 as needed, the output of the vibration wave motor 1 can be easily increased or decreased. For example, one or three vibrators can be assembled into the housing 2. At that time, by inserting the roller 22 into the insertion opening 2a to which the vibrator is not inserted, in place of vibrator, the pressing strength is applied to the rotor 3 in a balanced manner. Additionally, in this embodiment, since the three insertion openings 2a have the same shape, the vibrator can be easily replaced with the roller.

The number of the insertion openings 2a of the housing 2 can be increased or decreased to insert the vibrator 35 as needed. That is, the number of the insertion openings may be provided other than three, the vibrators may be increased or decreased. Thus, the required output of the vibration wave motor 1 can be obtained.

In the first pressing strength adjustment mechanism, the pressing strength of the vibrator 35 may be adjusted by either one of the adjustment washer 21 and the adjustment washer 26. Furthermore, the pressing strength of the vibrator 35 may be adjusted by either one of the first pressing strength adjustment mechanism and the second pressing strength adjustment mechanism using the ring-shaped spacer 7.

Various modifications of each component of the vibration wave motor 1 of the above-described embodiment are described next. A vibration wave motor according to each modification has the same structure as the vibration wave motor 1 according to the above-described embodiment except for the points described below.

The modification of the vibrator unit is described with reference to FIG. 30 in which a flexible printed circuit board (FPC) is applied to the wires for power supply and control signals in the vibrator unit 15 shown in FIG. 17.

Figure 30:
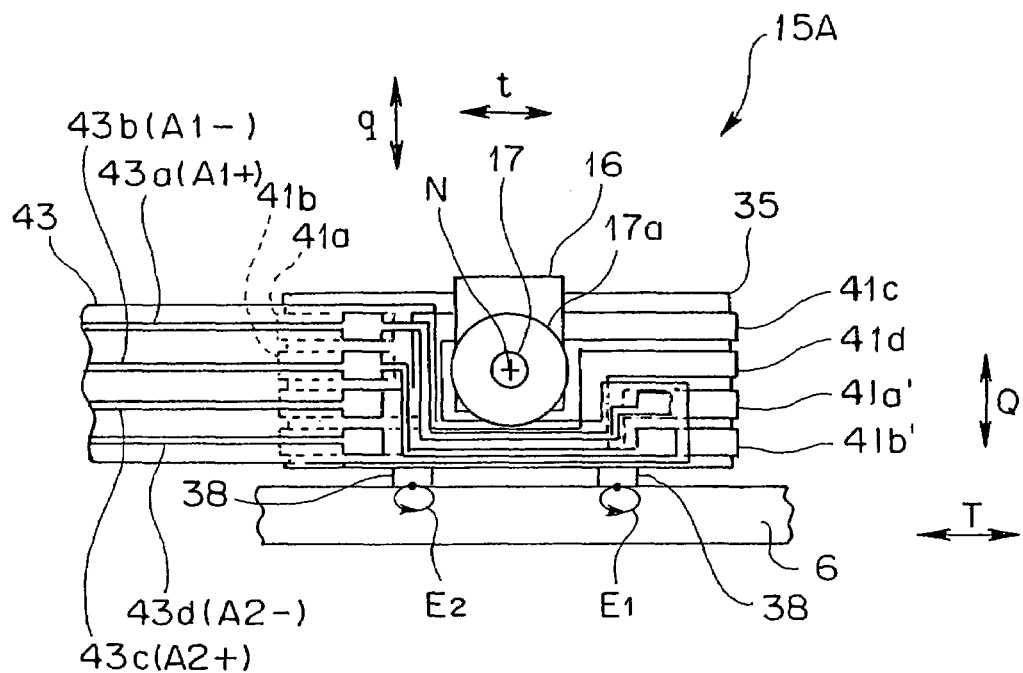
FIG. 30 is a diagram of the vibrator unit including a connection FPC, which is a modification of that of the vibrator unit shown in FIG. 17, when viewed from the outer periphery of the vibration wave motor.

FIG. 30 is a diagram of a vibrator unit 15A, which is a modification of the vibrator unit 15, when viewed from the outer periphery of the vibration wave motor.

As shown in FIG. 30, in the vibrator unit 15A of this modification, a connection FPC 43 is attached to the vibrator 35. A conductive pattern of the connection FPC 43 is electrically connected to each electrode of the vibrator 35. That is, a conductive pattern 43a, which is connected to the signal line A1 "+" of the driving unit 47 (see FIG. 24), is wired to the electrodes 41a and 41a' while avoiding the flange portion 17a. A conductive pattern 43b, which is connected to the signal line A1 "−" of the driving unit 47, is wired to the electrodes 41b and 41b' while avoiding the flange portion 17a. A conductive pattern 43c, which is connected to the signal line A2 "+" of the driving unit 47, is wired to the electrode 41c. A conductive pattern 43d, which is connected to the signal line A2 "−" of the driving unit 47, is wired to the electrode 41d.

The vibrator unit 15A including the connection FPC of this modification eliminates a lead wire that is difficult to handle for wiring, thus facilitating the assembly.

The exemplary connection of a vibrator unit including a connection FPC of a modification is described with reference to a perspective view of the connection FPC in FIG. 31 when a plurality of vibrator units is applied to the vibration wave motor.

Figure 31:
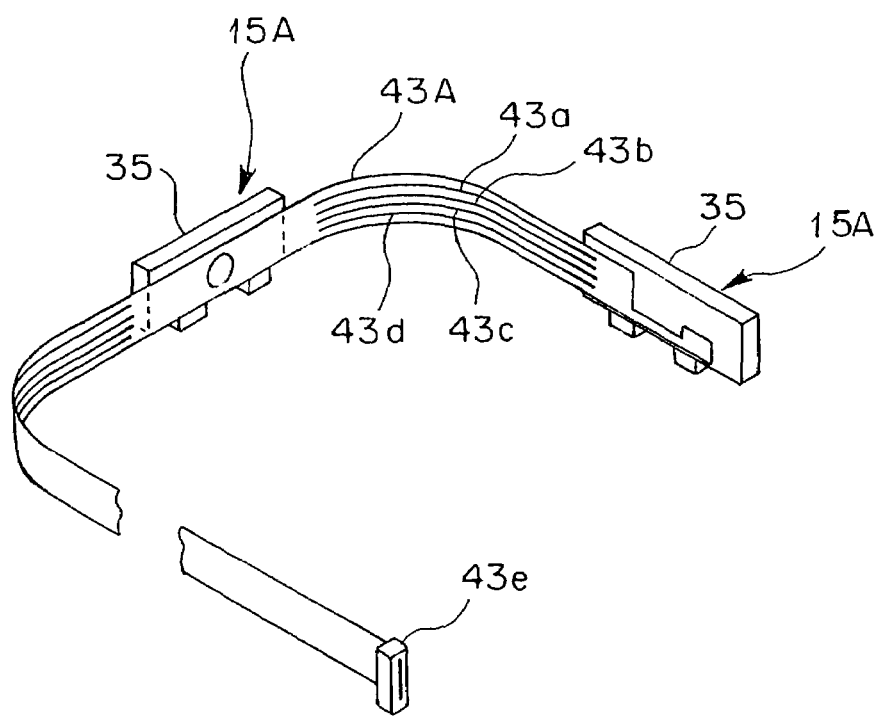
FIG. 31 is a perspective view showing a connection state of the vibrator unit in FIG. 30.

In this example, as shown in FIG. 31, the conductive pattern of a connection FPC 43A is formed so that lines to the vibrator unit 15A are parallel to each other. A connector 43e connected to the vibrator driving circuit 52 is provided at an end of the connection FPC 43A. In this modification, the connection FPC 43A can be formed as a single FPC, and therefore, the vibration wave motor can be easily assembled in an apparatus.

Figure 32:
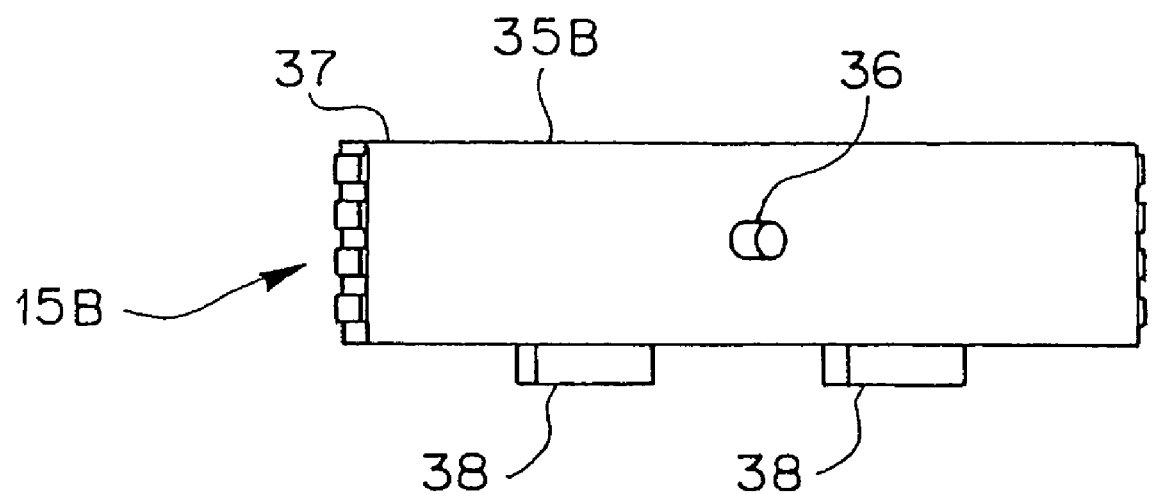
FIG. 32 is a perspective view of a modification of the vibrator unit shown in FIG. 17.
Figure 33:
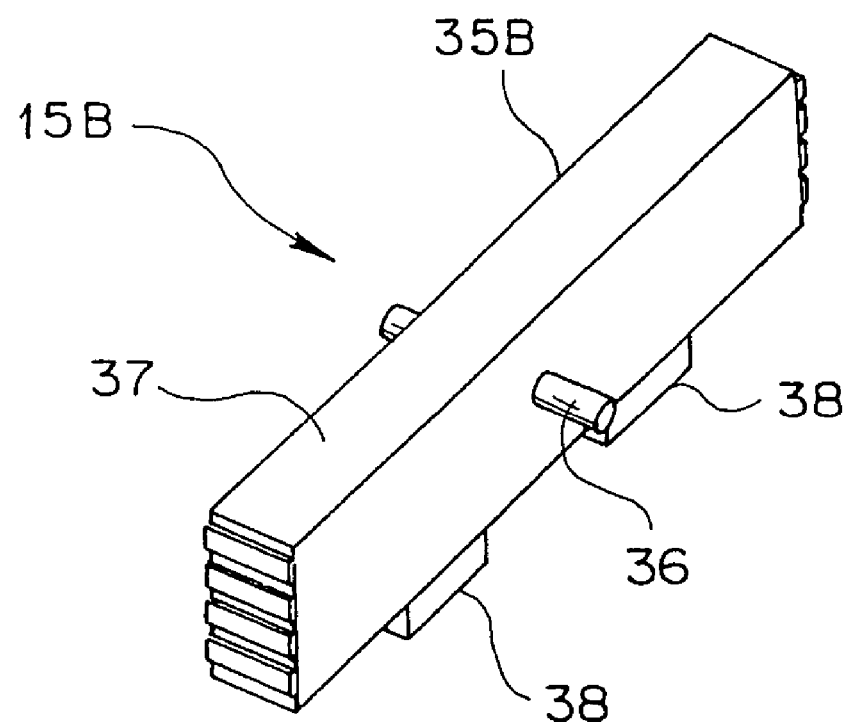
FIG. 33 is a perspective view of the vibrator unit shown in FIG. 32 when viewed in a different direction.

A vibrator unit 15B of a modification in which the vibrator holder 16 is eliminated from the vibrator unit 15 of the above-described embodiment is described next with reference to perspective views of the vibrator unit 15B in FIGS. 32 and 33.

In the vibrator unit 15B of this modification, a support shaft 36 directly passes through a vibrator 35B and is fixed to the vibrator 35B. Like the vibrator unit 15, the support shaft 36 is positioned at the node of vibration of the vibrator 35B. In the vibration wave motor 1 in which the vibrator unit 15B is assembled, a leaf spring having the same shape as the leaf spring 23 for the roller 22 is applied. In this case, the support shaft 36 fitted to the guide groove of the housing 2 is directly pressed by a protrusion of the leaf spring. Like the above-described embodiment, a slippery gap adjustment washer is inserted in a gap between the vibrator 35B and the insertion opening 2a of the housing 2 in the R direction, thus eliminating backlash.

The vibrator unit 15B of this modification eliminates the vibrator holder, and therefore, the number of components can be reduced. Also, the occupancy space of the vibrator unit can be reduced. Accordingly, the size of vibration wave motor can be advantageously reduced.

Figure 34:
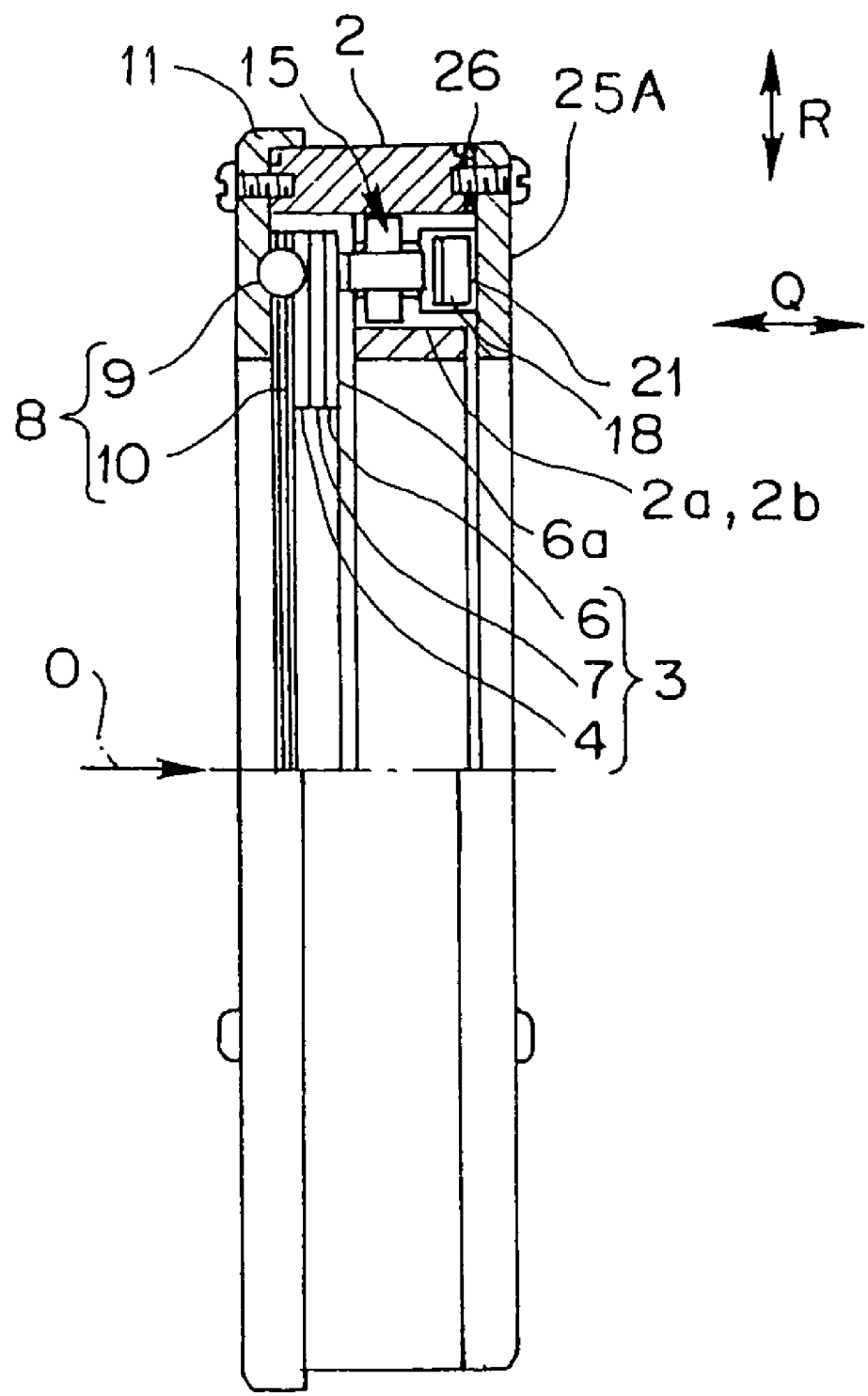
FIG. 34 is a longitudinal sectional view of the vibration wave motor including the rotation axis to which a modification of the presser plate is applied, and is applied to the vibration wave motor shown in FIG. 1.

A modification of the presser plate 25 of the above-described embodiment is described next with reference to FIG. 34. FIG. 34 is a sectional view of a vibration wave motor to which this modification is applied.

In the vibration wave motor 1 of the above-described embodiment, the three presser plates 25 are employed. In this modification, one ring-shaped presser plate 25A is employed. In this case, the presser plate 25A is fixed to the housing 2 with three screws.

In this modification, by changing thicknesses of three adjustment washers inserted between the presser plate 25A and the housing 2 as a pressing strength adjustment mechanism, the pressing strength of two vibrators 35 and one roller 22 can be adjusted at the same time.

In this modification, only one presser plate 25A is attached to the housing 2, thus facilitating the assembly.

A leaf spring 81, which is a modification of the leaf spring 18 of the above-described embodiment, is described next with reference to FIGS. 35A, 35B, and 36. The leaf spring 18 is an urging member (a resilient plate member) which urges the vibrator 35 against the rotor.

Figure 35A:
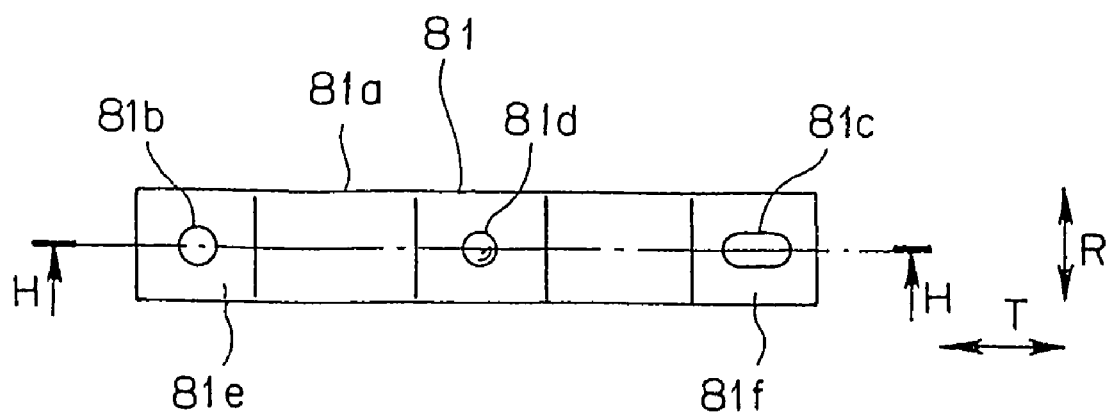
FIG. 35A is a plan view of a modification of the leaf spring shown in FIG. 11.
Figure 35B:
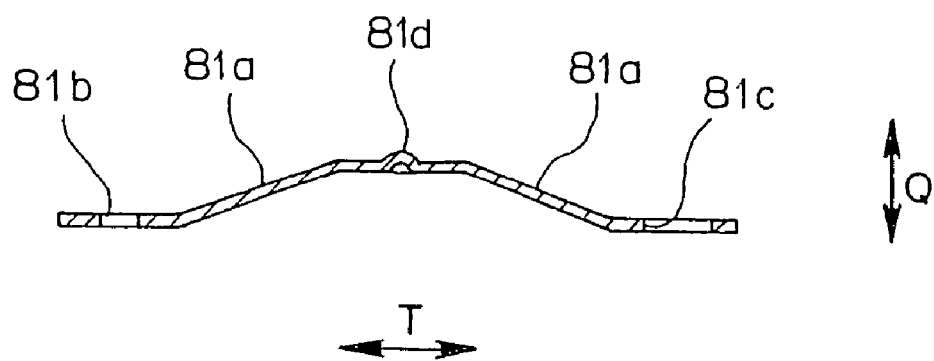
FIG. 35B is a sectional view taken along the line H-H of FIG. 35A.
Figure 36:
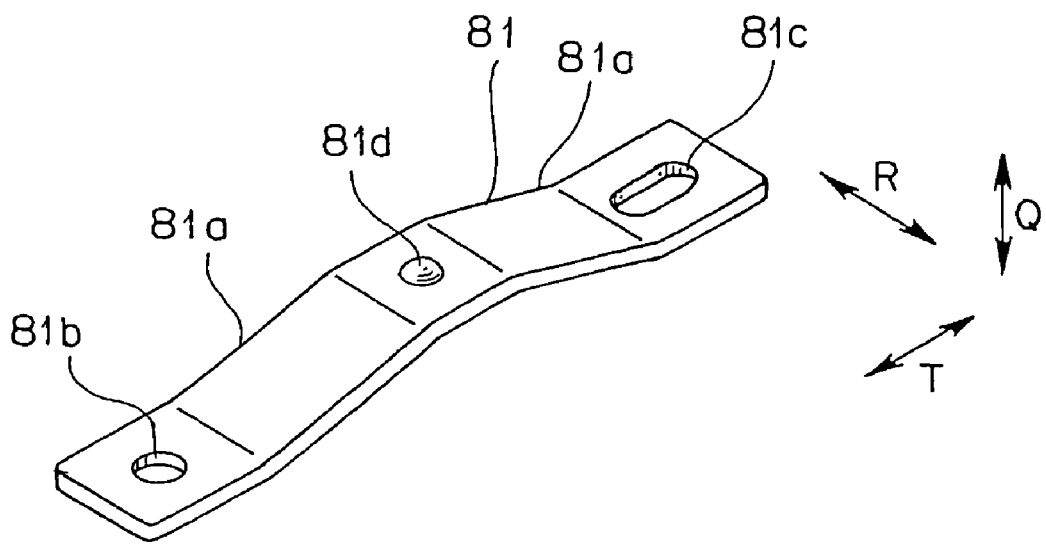
FIG. 36 is a perspective view of the leaf spring shown in FIGS. 35A and 35B.

FIG. 35A is a plan view of the leaf spring of this modification whereas FIG. 35B is a sectional view taken along the line H-H of FIG. 35A. FIG. 36 is a perspective view of the leaf spring.

As shown in FIGS. 35A and 35B, like the leaf spring 18, the leaf spring 81 of this modification is a resiliently deformable metallic leaf spring extending in the T direction. However, instead of the oval stepped portion 18d, which is formed on a middle flat section of the leaf spring 18 while protruding towards the vibrator unit 15 in the Q direction and serves as a pressing portion, a protrusion 81d having a small hemispherical shape is provided. The shapes of the other portions are similar to those of the leaf spring 18. In the leaf spring 81, both sides of the middle flat section are slightly bent to form arm portions 81a, which are resiliently deformable pressurizing portions. A circular hole 81b is formed at a first end 81e, which is one end of the leaf spring 81, and a slot 81c extending in the T direction is formed at a second end 81f, which is the other end of the leaf spring 81. The protrusion 81d is located at a position distant from the middle point of the center axis of the support shaft 17 of the assembled vibrator unit 15 in the Q direction. The protrusion 81d is in point contact with the center of the end surface 16a of the vibrator holder 16. In this case, the position where the protrusion 81d is in point contact with the center of the end surface 16a substantially coincides with the position of the node of the vibrator 35. Accordingly, even when the vibrator 35 is in a vibration state, the leaf spring 81 can stably press against the vibrator unit 15.

The leaf spring 81 is attached to the presser plate 25, as in the case of the leaf spring 18. That is, when the leaf spring 81 presses against the vibrator holder 16, one end of the leaf spring 81 slightly slides on the shoulder screw 20 along the slot 81c so as to resiliently deform. The protrusion 81d displaces in the Q direction by translating the vibrator holder 16 while pressing against the vibrator holder 16 with the pressing strength in the Q direction by the above resilient deformation. When the pressing strength is applied or when the pressing strength is adjusted, the protrusion 81d is slightly displaced in the T direction, as shown in FIG. 11B.

When the leaf spring 81 of this modification is applied and even if the degree of parallelization among the surfaces of the presser plates 25, the leaf spring 81, and the vibrator holder 16 in the T direction and even in the R direction is relatively low, the leaf spring 81 is not in contact with the vibrator holder 16 at one side, since the protrusion 81d, which is a contacting portion, has a small hemispherical shape. Therefore, a normal contact between the top end of the protrusion 81d and the end surface 16a of the vibrator holder 16 can be obtained.

Figure 37:
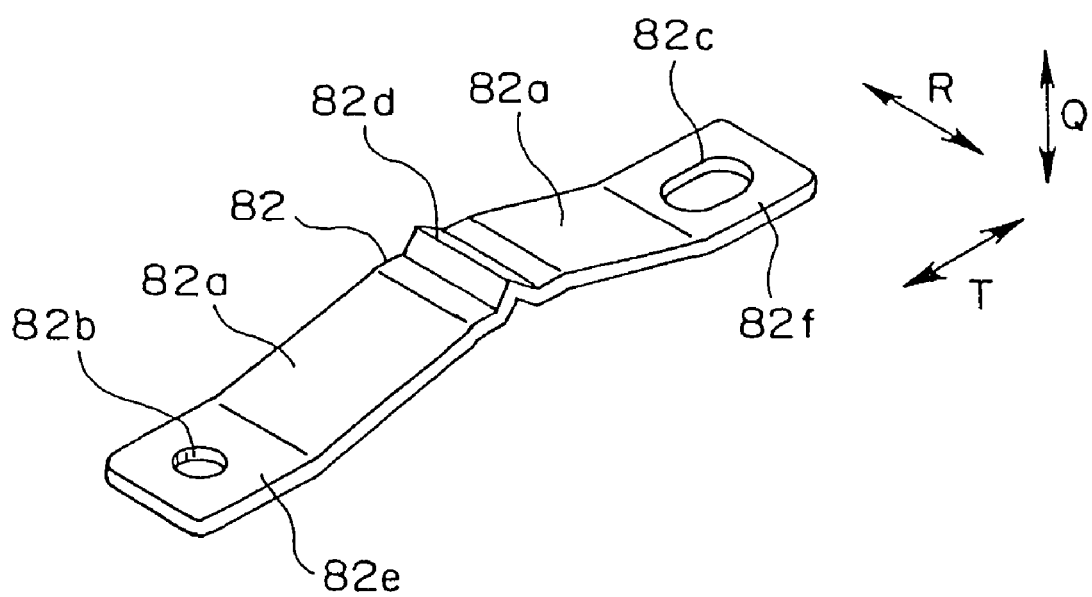
FIG. 37 is a perspective view of another modification of the leaf spring shown in FIG. 11.

A leaf spring 82, which is another modification of the leaf spring 18 of the above-described embodiment, is described next with reference to FIG. 37. The leaf spring 18 is an urging member (a resilient plate member) which urges the vibrator 35 against the rotor. FIG. 37 is a perspective view of the leaf spring 82.

Like the leaf spring 18, the leaf spring 82 of this modification is a resiliently deformable metallic leaf spring extending in the T direction. A mountain-shaped protrusion 82d protruding towards the vibrator unit 15 in the Q direction is formed on a middle flat section of the leaf spring 18 and serves as a pressing portion. The shapes of the other portions are similar to those of the leaf spring 18. In the leaf spring 82, both sides of the middle flat section are slightly bent to form arm portions 82a, which are resiliently deformable pressurizing portions. A circular hole 82b is formed at a first end 82e, which is one end of the leaf spring 82, and a slot 82c extending in the T direction is formed at a second end 82f, which is the other end of the leaf spring 82. The mountain-shaped protrusion 82d has a ridge line on the top in the R direction. The ridge line is located at a position where a center axis of the support shaft 17 is translated in the Q direction. The ridge line of the mountain-shaped protrusion 82d is in line contact with the end surface 16a of the vibrator holder 16 after assembling the leaf spring 82.

In this modification, the position where the mountain-shaped protrusion 82d is in line contact with the end surface 16a substantially coincides with the position of the node of vibration in the vibrator 35.

The leaf spring 82 is attached to the presser plate 25, as in the case of the leaf spring 18. Accordingly, when the leaf spring 82 presses against the vibrator holder 16, one end of the leaf spring 82 slightly slides on the shoulder screw 20 along the slot 82c so as to resiliently deform. The mountain-shaped protrusion 82d displaces in the Q direction by translating while pressing against the vibrator holder 16 with the pressing strength in the Q direction. When the pressing strength is applied or when the pressing strength is adjusted, the mountain-shaped protrusion 82d is slightly displaced in the T direction, as shown in FIG. 11B.

When the leaf spring 82 of this modification is applied, the same advantage as that of the leaf spring 18 is provided. In particular, since the ridge line of the mountain-shaped protrusion 82d is in contact with the vibrator holder 16, the contacting portion becomes a line. Consequently, the leaf spring 82 reliably presses against the center of the vibrator holder 16 along the node of vibration of the vibrator 35.

A leaf spring 83, which is another modification of the leaf spring 18 of the above-described embodiment, is described next with reference to FIGS. 38 through 40. The leaf spring 18 is an urging member (a resilient plate member) which urges the vibrator 35 against the rotor.

Figure 38:
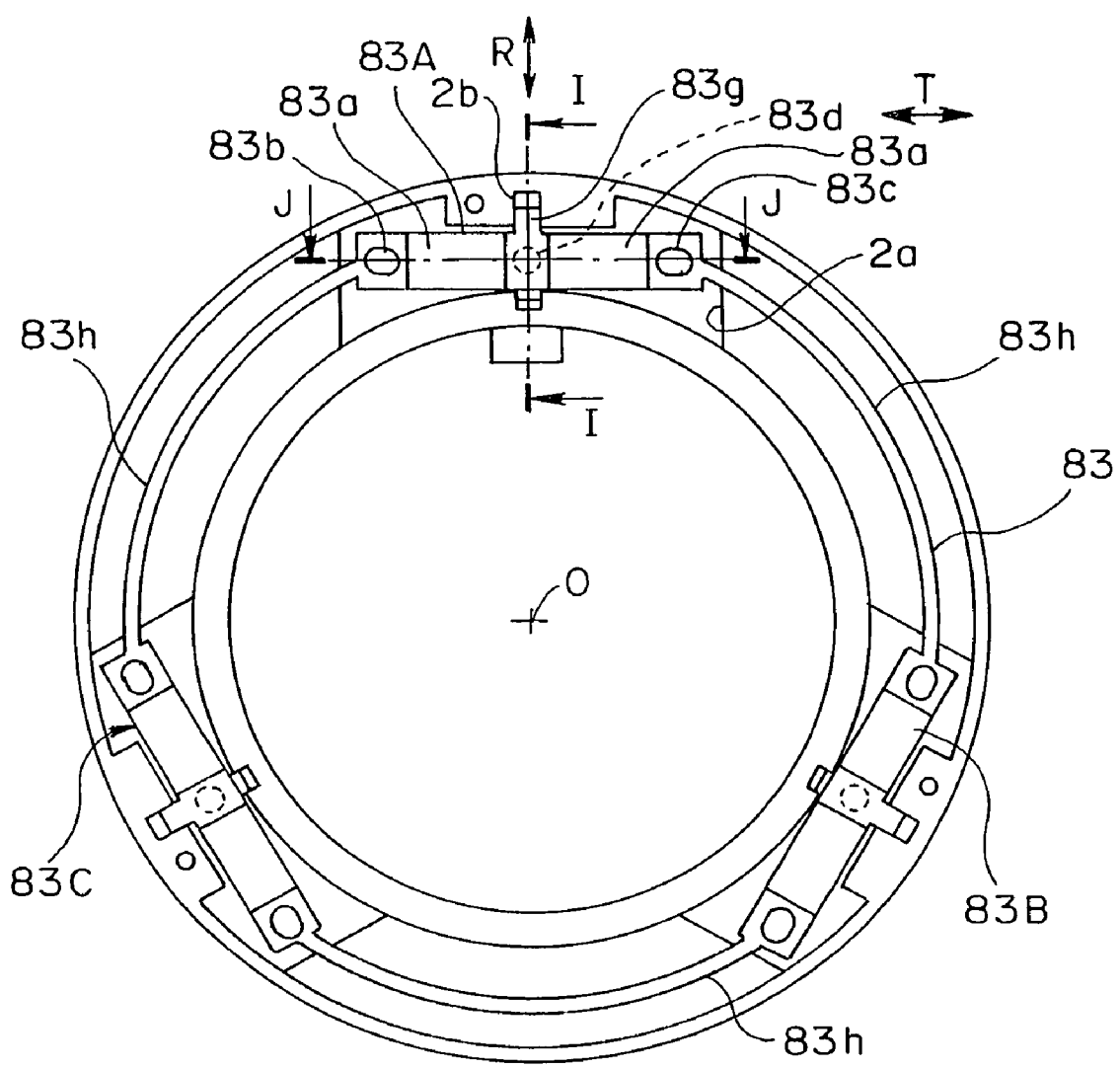
FIG. 38 illustrates another modification of the leaf spring shown in FIG. 11 viewed in a rotation axis direction when the leaf spring is assembled to the housing.
Figure 39:
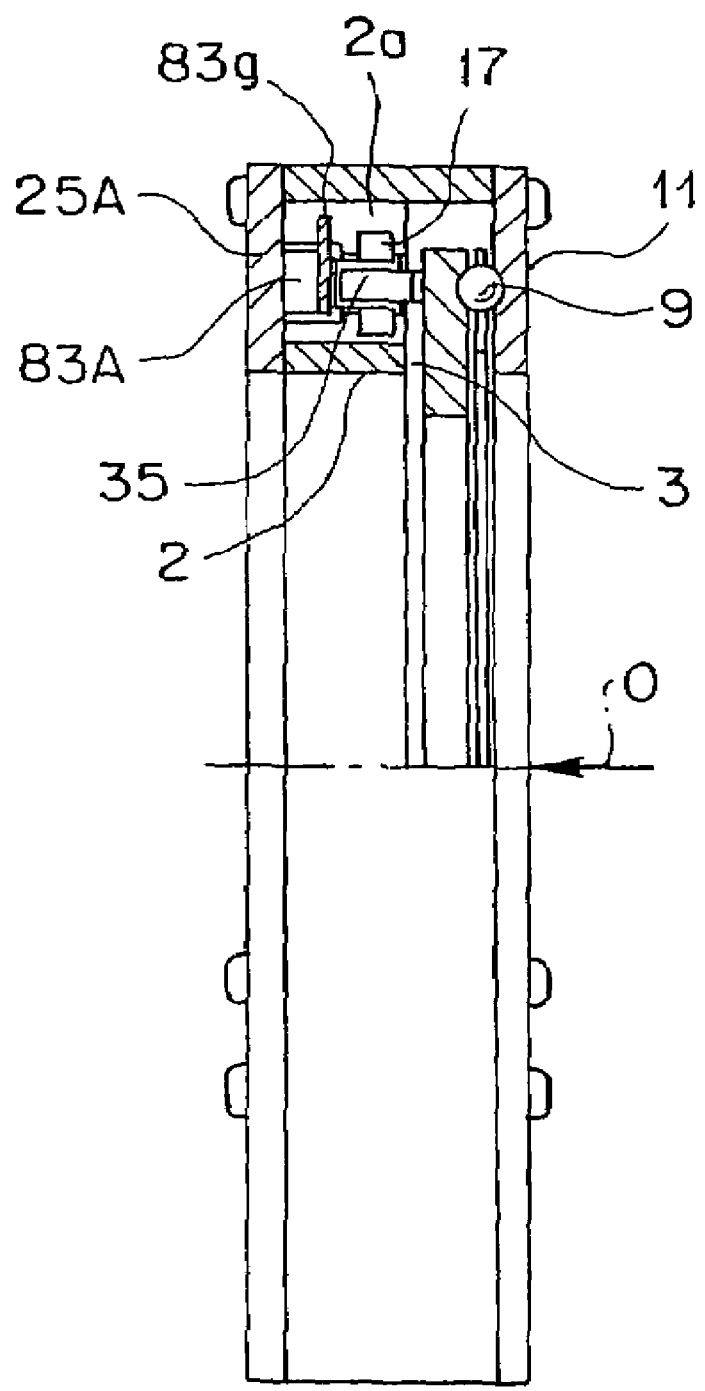
FIG. 39 is a view taken along the line I-I of FIG. 38.

FIG. 38 is a diagram of the leaf spring viewed from a rotation axis when the leaf spring 83 is assembled to the housing. FIG. 39 is a view taken along the line I-I of FIG. 38. FIG. 40 is a view taken along the line J-J of FIG. 38.

As shown in FIG. 38, the leaf spring 83 of this modification is a resiliently deformable ring-shaped metallic leaf spring. The leaf spring 83 includes three spring portions 83A, 83B, and 83C, which are connected to each other by three circular arc-shaped connection portions 83h. The spring portions 83A, 83B, and 83C can be inserted into the three insertion openings 2a of the housing 2 from the rear of the vibrator unit 15, respectively.

The spring portions 83A, 83B, and 83C have the same shape. Here, the shape of the spring portion 83A is described. In the leaf spring 83A, on a middle flat section of the leaf spring 83A, a small hemispherical protrusion 83d is provided while protruding towards the vibrator unit 15 in the Q direction and serves as a pressing portion. Both sides of the middle flat section are slightly bent to form arm portions 83a, which are resiliently deformable pressurizing portions. Also, a protrusion 83g is provided, which protrudes from the middle flat section in the R direction (from the rotation axis to the outer periphery thereof) and serves as a leaf spring support mechanism and a pressing position restriction unit. Furthermore, slots 83b and 83c extending in the T direction are formed at ends of the arm portions 83a. The small hemispherical protrusion 83d is located at a position distant from the middle point of the center axis of the support shaft 17 of the vibrator unit 15 in the Q direction. The small hemispherical protrusion 83d is in point contact with the center of the end surface 16a of the vibrator holder 16 after being assembled. The protrusion 83g fits into one of the guide grooves 2b of the insertion openings 2a of the housing 2 without backlash so as to restrict the movement of the leaf spring 83A in the T direction. That is, the protrusion 83g restricts the pressing position. It is noted that the protrusion 83g may protrude towards the inside in contrast to the above-described direction.

As will be described below, when the spring portions 83A, 83B, and 83C press against the vibrator holders 16 and extend in the T direction, the connection portions 83h easily deform to absorb the expansion of the leaf spring.

Figure 40:
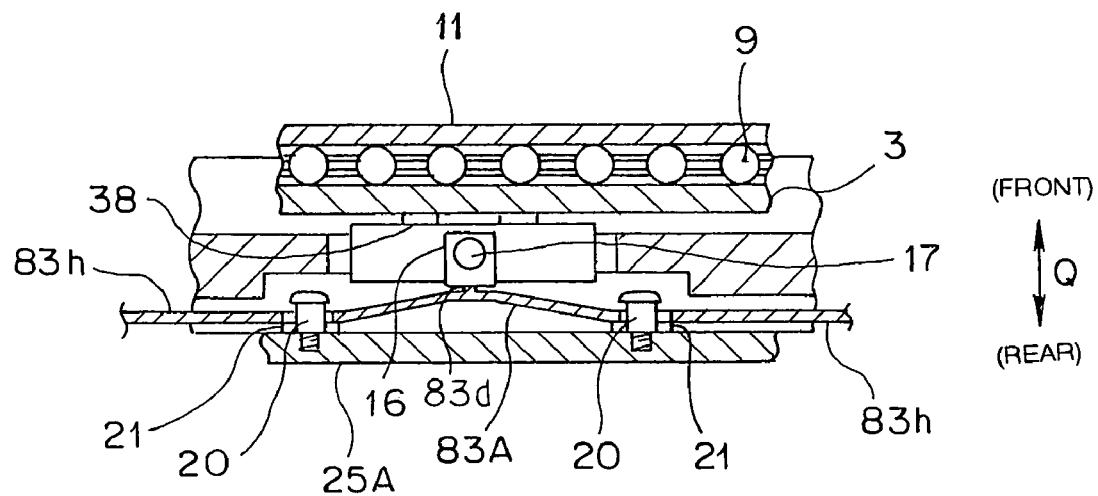
FIG. 40 is a view taken along the line J-J of FIG. 38.

As shown in FIG. 40, when the leaf spring 83 is assembled in the housing 2, the adjustment washer 21 is inserted between the leaf spring 83 and the presser plate 25A, and the shoulder screws 20 passing through the slots 83b and 83c are screwed to the presser plate 25A. Here, the presser plate 25A is an integrated ring-shaped member.

The vibrator units 15 disposed in the insertion openings 2a of the housing 2 are urged by the spring portions 83A, 83B, and 83C of the leaf spring 83 from the rear, and then the presser plate 25A is fixed to the housing 2 by screws. After the presser plate 25A is fixed to the housing 2, the small hemispherical protrusions 83d press against the vibrator holders 16. The pressing strength can be adjusted by changing the thicknesses of the adjustment washer 21 and the adjustment washer 26 between the presser plate 25A and the housing 2. When the leaf spring 83 presses against the vibrator holders 16 or when the pressing strength is adjusted (that is, the pressing strength is changed), ends of the spring portions 83A, 83B, and 83C attached to the shoulder screw 20 slightly slide in the slots 83b and 83c, which the shoulder screws 20 pass through, so as to expand towards both sides thereof. However, since the protrusion 83g fits in the guide grooves 2b, the pressing position of the small hemispherical protrusion 83d against the vibrator holder A is not shifted in the T direction. Furthermore, even when the spring portions 83A, 83B, and 83C deform, the small hemispherical protrusion 83d is only translated. Accordingly, the pressing direction does not change. Thus, the stable and superior pressing state against the vibrator can be obtained.

When the leaf spring 83 of this modification is applied, the same advantage as that of the leaf spring 18 is provided. In particular, since the pressing position of the small hemispherical protrusion 83d remains unchanged, the small hemispherical protrusion 83d presses the center of the vibrator holder 16 at all times. In addition, since the leaf spring 83 is formed as a single ring without being divided into three pieces, the assembly is facilitated.

Figure 41:
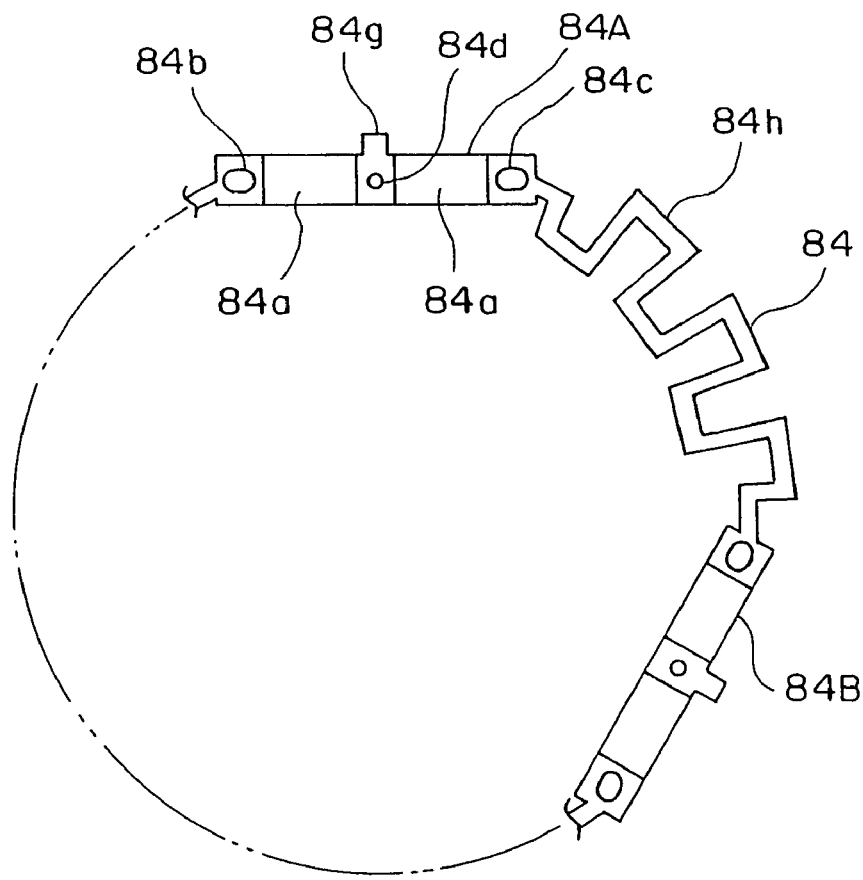
FIG. 41 is a plan view of another modification of the leaf spring shown in FIG. 11.

Instead of the leaf spring 83 of the above-described modification, the leaf spring 84 having a shape shown in FIG. 41 can be proposed. The leaf spring 84 has a shape in which the shape of a connection portion 84h for connecting, for example, the spring portion 84A to the spring portion 84B is a crank shape or zigzag shape, and therefore, the leaf spring 84 is more easily deformed. The shapes of the other portions are similar to those of the leaf spring 83. In the spring portion 84A, a small hemispherical protrusion 84d is provided at a middle flat section thereof while protruding in the Q direction (towards the front side) and serves as a pressing portion. Also, a protrusion 84g is provided, which protrudes from the middle flat section in the R direction (from the rotation axis to the outer periphery thereof) and serves as a pressing position restriction unit. Furthermore, both sides of the middle flat portion are slightly bent to form arm portions 84a, which are resiliently deformable pressurizing portions. Still furthermore, slots 84b and 84c extending in the T direction are formed at ends of the arm portions 84a.

When the leaf spring 84 presses against the vibrator holder 16 and the pressing strength is further adjusted, both ends of the spring portion 84A or 84B expand. However, since the connection portion 84h easily deforms, the positional shift of the spring portion 84A or 84B becomes relatively small compared to the expansion of the ends. In addition, since, like the leaf spring 83, the protrusion 84g fits in one of the guide grooves 2b, the shift in the T direction of the pressing position of the small hemispherical protrusion 84d against the vibrator holder does not occur. Furthermore, the pressing direction does not change. Thus, the stable and superior pressing state against the vibrator can be obtained.

The modifications of the vibrator unit 15 and the leaf spring 18 of the above-described embodiment are described next with reference to FIGS. 42 through 46.

Figure 42:
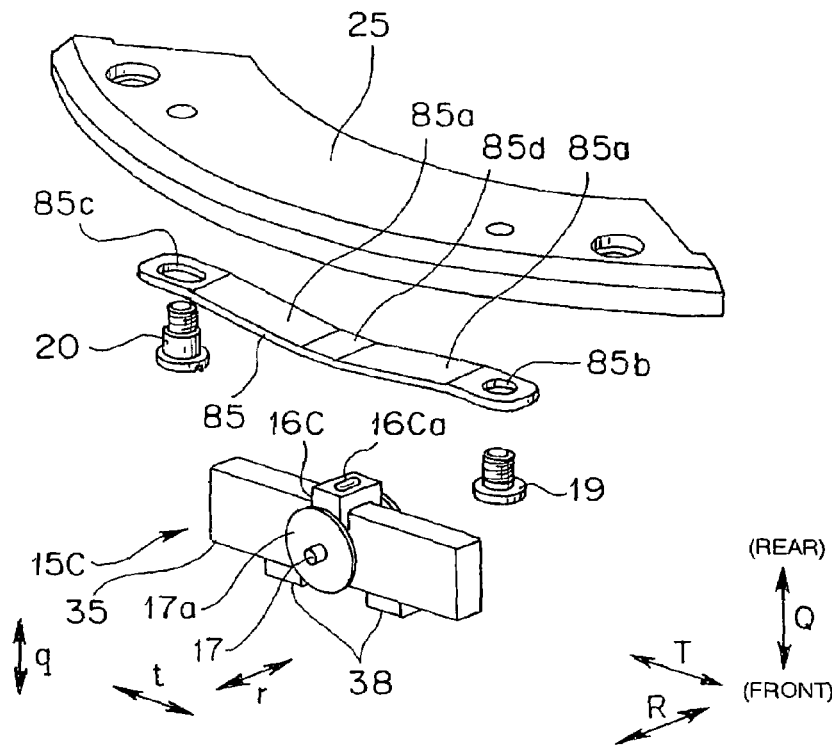
FIG. 42 is an exploded perspective view of the vibrator unit and the leaf spring, which are examples of the modifications of the vibrator unit and the leaf spring applied to the vibration motor shown in FIG. 1.

FIG. 42 is an exploded perspective view of a vibrator unit 15C and a leaf spring 85, which are examples of modifications.

In the vibrator unit 15C of this modification, unlike the vibrator unit 15, an oval stepped portion 16Ca is formed on a surface of a vibrator holder 16C so as to extend in the R direction and to protrude in the Q direction, i.e., towards the leaf spring 85, and serves as a pressed portion. The vibrator holder 16C is fixed to the vibrator. The other portions are similar to those of the vibrator unit 15. The oval stepped portion 16Ca is located at a position where the support shaft 17 of the vibrator holder 16 is translated in the Q direction.

The leaf spring 85, which is a resilient plate member used together with the vibrator unit 15C, has two arm portions 85a, a circular hole 85b, and a slot 85c as in the above-described embodiment except that the leaf spring 85 has no protrusion on a middle flat portion 85d serving as a pressing surface. The leaf spring 85 is attached to the presser plates 25 with the adjustment washer 21 therebetween by the setscrew 19 and the shoulder screw 20. Thereafter, while the middle flat portion 85d of the leaf spring 85 is in line contact with the oval stepped portion 16Ca of the vibrator holder 16, the presser plates 25 is fixed to the housing 2.

In the assembled state, the middle flat portion 85d of the leaf spring 85 presses against the top of the oval stepped portion 16Ca formed on the surface of the vibrator holder 16 and extending in the R direction. To adjust the pressing strength, the adjustment washers 21 and 26 are used, as for the leaf spring 18 of the above-described embodiment.

In the vibration wave motor including the vibrator unit 15C and the leaf spring 85 of this modification, since the middle flat portion 85d of the leaf spring 85 is in contact with the oval stepped portion 16Ca of the vibrator holder 16, the vibrator holder 16 is pressed at the position coincident with the center of the support shaft at all times including the case where the pressing strength is adjusted. Accordingly, the two driving elements 38 of the vibrator 35 are evenly in contact with the rotor plate 6 in a direction perpendicular to the friction contact surface. Thus, more stable driving state can be obtained compared to the above-described embodiment.

Figure 43:
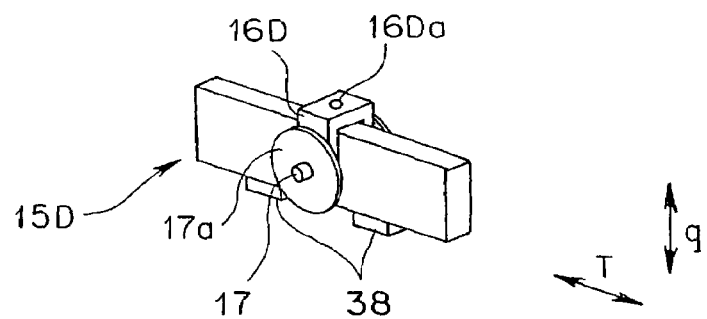
FIG. 43 is a perspective view of a further modification of the vibrator unit applied to the vibration motor shown in FIG. 1.

FIG. 43 is a perspective view of a vibrator unit 15D, which is another modification for the vibrator unit 15C.

In the vibrator unit 15D of this modification, a small hemispherical protrusion 16Da is formed on an end surface of a vibrator holder 16D fixed to the vibrator 35 at a position distant from the middle point of the center axis of the support shaft 17 in the Q direction and serves as a pressed protrusion. To press against the vibrator unit 15D, the leaf spring 85 of the above-described modification is employed (see FIG. 42).

In a vibration wave motor including the vibrator unit 15D of this modification, the middle flat portion 85d of the leaf spring 85 is in point contact with the small hemispherical protrusion 16Da of the vibrator holder 16D to press against the vibrator holder 16D. Accordingly, even when the degree of parallelization between the presser plates 25 and the rotor plate 6 is relatively low in the R or T direction, the leaf spring 85 is not in contact with the vibrator holder 16D at one side including the case where the pressing strength is adjusted. Therefore, the vibrator 35 is pressed via the small hemispherical protrusion 16Da. Accordingly, the two driving elements 38 of the vibrator 35 are evenly in contact with the rotor plate 6 in a direction perpendicular to the friction contact surface. Thus, more stable driving state can be obtained compared to the above-described embodiment.

Figure 44:
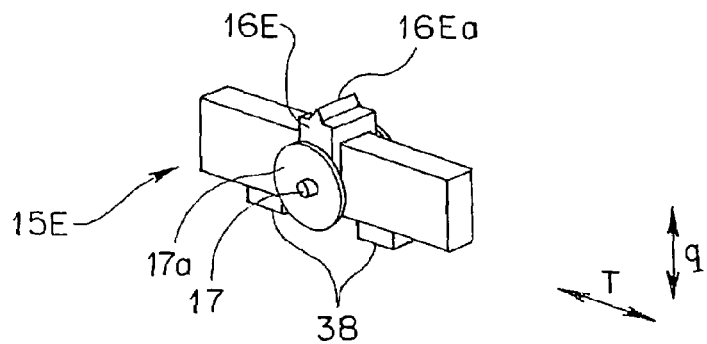
FIG. 44 is a perspective view of a further modification of the vibrator unit applied to the vibration motor shown in FIG. 1.

FIG. 44 is a perspective view of a vibrator unit 15E, which is another modification for the vibrator unit 15C.

In the vibrator unit 15E of this modification, a mountain-shaped protrusion 16Ea having a ridge line on the top is formed as a pressed protrusion on an end surface of a vibrator holder 16E fixed to the vibrator 35. The ridge line extends along the R direction and is located at a position where the center axis of the support shaft 17 is translated in the Q direction. To press against the vibrator unit 15E, the leaf spring 85 of the above-described modification is employed (see FIG. 42).

In a vibration wave motor including the vibrator unit 15E of this modification, the middle flat portion 85d of the leaf spring 85 is in line contact with the mountain-shaped protrusion 16Ea of the vibrator holder 16E to press against the vibrator holder 16E. When the leaf spring 85 presses against the vibrator holder 16E or when the pressing strength is adjusted, the leaf spring 85 is not in contact with the vibrator holder 16E at one side. Therefore, the vibrator 35 is pressed via the mountain-shaped protrusion 16Ea at all times. Accordingly, the two driving elements 38 of the vibrator 35 are evenly in contact with the rotor plate 6 in a direction perpendicular to the friction contact surface. Thus, more stable driving state can be obtained compared to the above-described embodiment.

Figure 45:
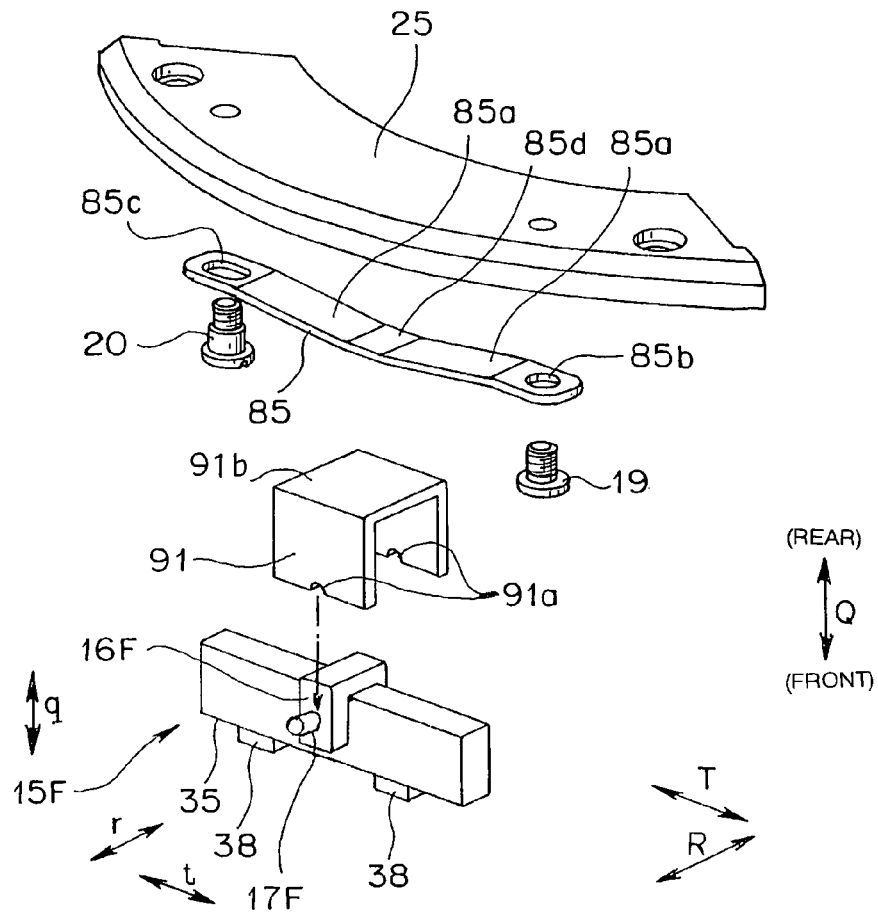
FIG. 45 is an exploded perspective view of another modification of the vibrator unit, the presser plate, and the leaf spring applied to the vibration wave motor shown in FIG. 1.

FIG. 45 is an exploded perspective view of a vibrator unit 15F, which is another modification for the vibrator unit 15C, a presser 91 serving as a pressing member, and the leaf spring 85.

The vibrator unit 15F of this modification includes the vibrator 35 and a vibrator holder 16F having a round support shaft 17F which is fixed to the vibrator 35 and protrudes from both sides of the vibrator 35. The support shaft 17F is located at a position of the node of vibration of the vibrator 35. The vibrator holder 16F and the vibrator 35 rotatably fit to the presser 91 via the support shaft 17F. The presser 91 has a U-shaped opening. At an end of the presser 91 adjacent to the opening, two notches 91a opposed to each other in the R direction are formed to serve as an engagement portion engaged with the support shaft. A flat end surface 91b is formed at the other end of the presser 91 opposite to the opening. The presser 91 fits to the vibrator holder 16F in the R direction without backlash. The support shaft 17F is rotatably engaged with the notches 91a. To press against the vibrator unit 15F, the leaf spring 85 of the above-described modification is employed (see FIG. 42).

The vibrator unit 15F with which the presser 91 is engaged is inserted to the insertion opening 2a of the housing 2, and the support shaft 17F fits into the guide grooves 2b. Thereafter, the presser plate 25 on which the leaf spring 85 is mounted is attached to the housing 2. The end surface 91b of the presser 91 is in flat contact with the middle flat portion 85d of the leaf spring 85, thereby being pressed followed by the flat portion 85d. The vibrator 35 is pressed via the support shaft 17F of the vibrator holder 16F so that the driving elements 38 are in tight contact with the rotor plate 6. Adjustment of the pressing strength of the leaf spring 85 can be performed in the same manner as that described with reference to FIG. 42.

In a vibration wave motor according to this modification, when the leaf spring 85 presses against the vibrator unit 15F or when the pressing strength is adjusted, the middle flat portion 85d of the leaf spring 85 is always in flat contact with the end surface 91b of the presser 91. In addition, since the presser 91 directly presses against the support shaft 17F of the vibrator 35, the two driving elements 38 of the vibrator 35 are evenly in contact with the rotor plate 6 in a direction perpendicular to the friction contact surface. Thus, more stable driving state can be obtained compared to the above-described embodiment.

Figure 46:
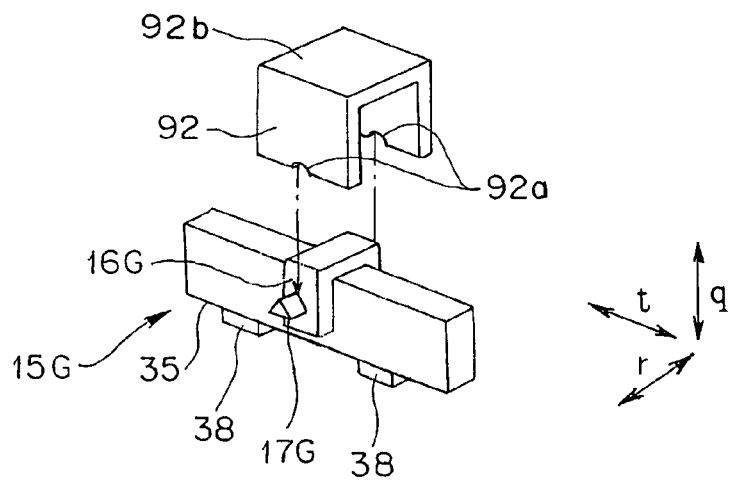
FIG. 46 is an exploded perspective view of another modification of the vibrator unit, the presser plate applied to the vibration wave motor shown in FIG. 1.

FIG. 46 is an exploded perspective view of a vibrator unit 15G, which is another modification for the vibrator unit 15C, and a presser 92 serving as a pressing member.

The vibrator unit 15G of this modification includes the vibrator 35 and a vibrator holder 16G. The vibrator holder 16G includes a support shaft 17G serving as a support rod having a prismatic shape, for example, a triangle pole. The support shaft 17G protrudes from both sides of the vibrator holder 16G and is fixed to the vibrator holder 16G. In this case, the ridge line of the support shaft 17G having a triangle pole shape is located at a position of the node of vibration of the vibrator 35. The presser 92 rotatably fits to the vibrator 35 and the vibrator holder 16G fixed to the vibrator via the support shaft 17G. The presser 92 has a U-shaped opening. At an end of the presser 92 adjacent to the opening, two notches 92a opposed to each other in the R direction are formed to serve as an engagement portion engaged with the support shaft 17G. A flat end surface 92b is formed at the other end of the presser 92 opposite to the opening. The presser 92 fits to the vibrator holder 16G in the R direction without backlash.

The presser 92 can rotate about the ridge line of the support shaft 17G having a triangle pole shape in the notches 92a. To press against the vibrator unit 15G, the leaf spring 85 of the above-described modification is employed (see FIG. 42) and presses the flat end surface 92b of the presser 92.

The operation of a vibration wave motor including the vibrator unit 15G and the presser 92 is the same as that of the modification shown in FIG. 45, and therefore, the same advantage is provided.

Two modifications of the pressing strength adjustment mechanism of the vibrator in the vibration wave motor 1 of the above-described embodiment are described next with reference to FIGS. 47 through 49.

Figure 47:
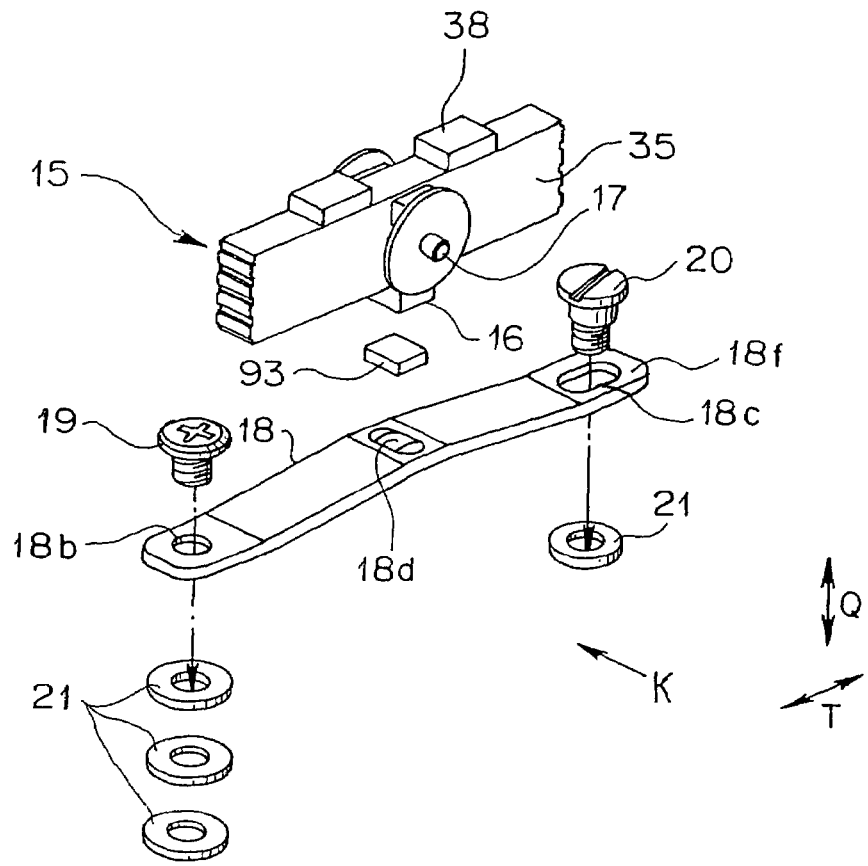
FIG. 47 is an exploded perspective view of a vibrator-unit pressing portion of the vibration wave motor shown in FIG. 1 including a modification of a pressing strength adjustment mechanism.

FIG. 47 is an exploded perspective view of a vibrator-unit pressing portion of a vibration wave motor including first pressing strength adjustment means (pressing strength adjustment mechanism), which is one of the modifications. FIG. 48 illustrates an assembled vibration wave motor when viewed in a direction indicated by arrow K of FIG. 47.

The vibrator-unit pressing portion including the first pressing strength adjustment means of this modification includes the vibrator unit 15, the leaf spring 18, and the adjustment washer 21 serving as the pressing strength adjustment means, all of which are the same as those used in the above-described embodiment. The vibrator unit pressurizing portion further includes a plate-shaped adjustment spacer 93 also serving as the pressing strength adjustment means.

Figure 48:
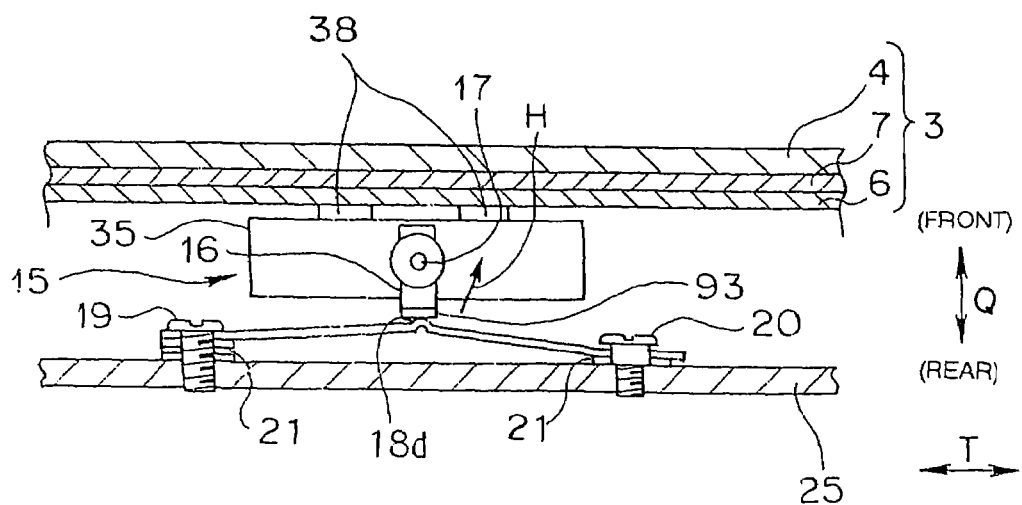
FIG. 48 is a view on arrow K of FIG. 47.

As shown in FIG. 48, in the vibrator 35 of the vibrator unit 15, like the above-described embodiment, the driving element 38 is pressed against the rotor plate 6 by the urging force of the leaf spring 18 attached to the presser plates 25 with the adjustment washer 21 therebetween.

The pressing strength of the leaf spring 18 against the vibrator unit 15 can be adjusted by the thickness of the adjustment washers 21 disposed between both ends of the leaf spring 18 and the presser plates 25. In particular, as shown in FIG. 47, by changing the number (or total thickness) of the adjustment washer 21 serving as pressing direction adjustment means and inserted into both ends of the leaf spring 18 and the presser plates 25 to perform the adjustment, a pressing direction H to press the oval stepped portion 18d against the vibrator holder 16 can be adjusted. By adjusting the pressing direction H, the two driving elements 38 of the vibrator 35 spaced from each other can be evenly or perpendicularly in contact with the friction contact surface 6a of the rotor plate 6, thus increasing the conversion efficiency of the vibration wave motor.

In addition, the pressing strength can be adjusted by bonding the adjustment spacer 93 having an appropriate thickness onto the end surface 16a of the vibrator holder 16. In this case, the oval stepped portion 18d of the leaf spring 18 presses against the vibrator holder 16 with the adjustment spacer 93 therebetween. If the adjustment of the pressing direction H is not required, the pressing strength can be adjusted using only the adjustment spacer 93 without using the adjustment washer 21.

Figure 49:
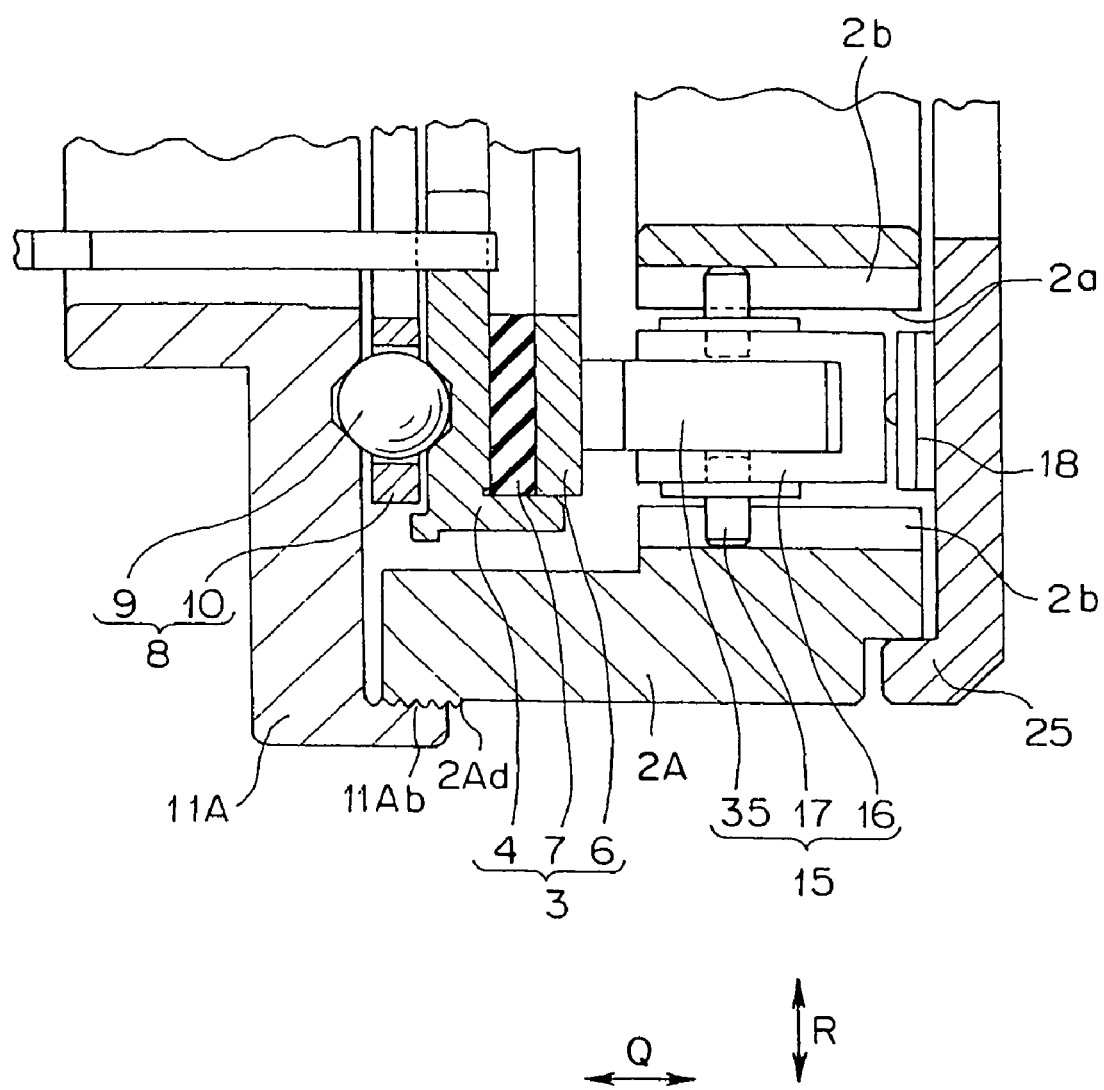
FIG. 49 is a sectional view of the housing, the vibrator unit, and the rotor of the vibration wave motor including a pressing strength adjustment mechanism, which is one of the modifications.
Figure 50:
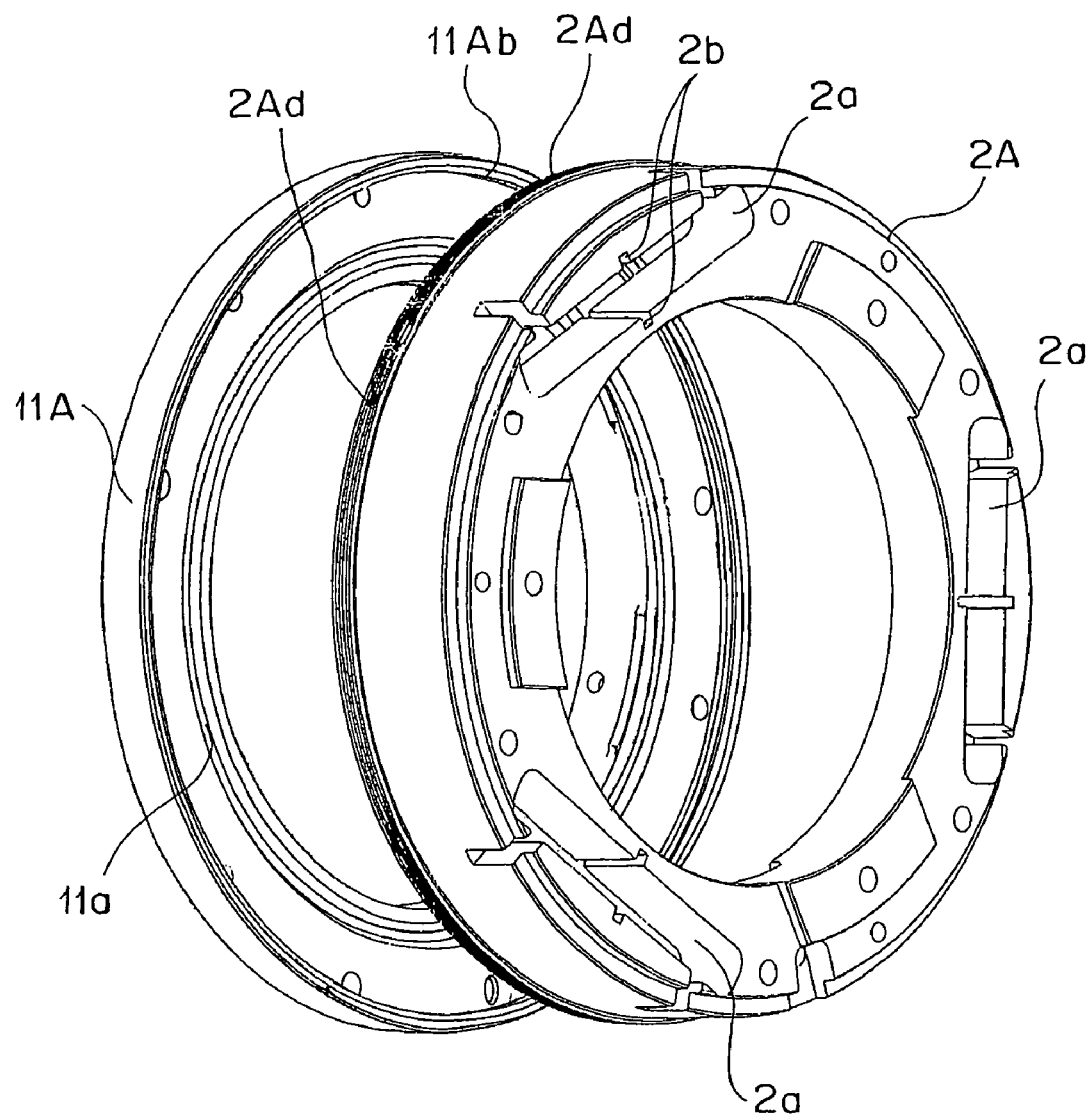
FIG. 50 is an exploded perspective view of the housing and the rotor of the vibration wave motor including the pressing strength adjustment mechanism shown in FIG. 49.

FIG. 49 is a sectional view of a housing, a vibrator unit, and a rotor of a vibration wave motor including second pressing strength adjustment means (a pressing strength adjustment mechanism), which is one of the modifications. FIG. 50 is an exploded perspective view of the housing and the rotor of this modification.

The vibration wave motor having the pressing strength adjustment mechanism of this modification includes a housing 2A, the vibrator unit 15 inserted into the housing 2A, the leaf spring 18 for pressing against the vibrator 35 of the vibrator unit 15, a rotor 3 in contact with the vibrator 35 and rotatably driven, the bearing member 8, the bearing holder 11A, and the presser plates 25.

Like the housing 2 of the above-described embodiment, the housing 2A includes the insertion openings 2a and the guide grooves 2b for inserting the vibrator unit 15. The housing 2A further includes an adjustment screw (adjustment male screw) 2Ad for adjusting the pressing strength of a leaf spring on the outer periphery of the housing 2A.

The bearing holder 11A includes a V groove 11a and an adjustment screw (adjustment female screw) 11Ab screwed by the adjustment screw 2Ad of the housing 2A.

In a vibration wave motor of this modification, the vibrator unit 15, the leaf spring 18, the presser plates 25 are assembled into the housing 2A. The rotor 3 and the bearing member 8 are further attached onto the front of these components. The adjustment screw 2Ad is screwed to the adjustment screw 11Ab of the bearing holder 11A.

By screwing the adjustment screw 2Ad to the adjustment screw 11Ab, the vibrator holder 16 and the vibrator 35 are pressed by the leaf spring 18. By changing a screwed amount, the pressing strength of the driving element 38 against the rotor plate 6 can be adjusted. When an appropriate pressing strength is obtained, the adjustment screws 2Ad and 11Ab are fixed by means of, for example, bonding.

According to the pressing strength adjustment mechanism of this modification, the pressing strength of the vibrator 35 against the rotor 3 can be easily adjusted by the adjustment screws 2Ad and 11Ab. Furthermore, the pressing strength may be adjusted by using the adjustment washers 21 and 26 of the above-described embodiment in addition to the adjustment screws 2Ad and 11Ab.

The modification of the roller pressing unit using the leaf spring shown in FIG. 16 applied to the vibration wave motor 1 of FIG. 1 is described with reference to FIGS. 51 and 52.

Figure 51:
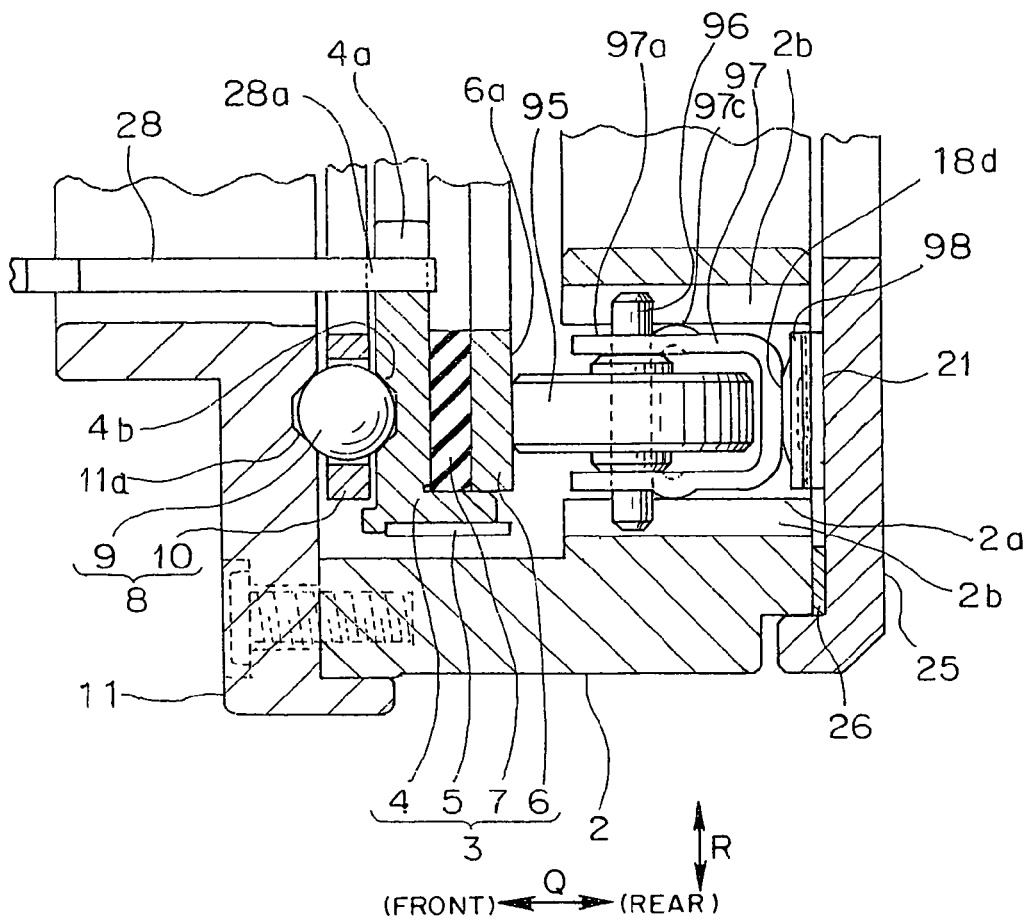
FIG. 51 is an enlarged sectional view along the rotation axis about a roller and the leaf spring of the vibration wave motor including a modification of the leaf spring shown in FIG. 16.
Figure 52:
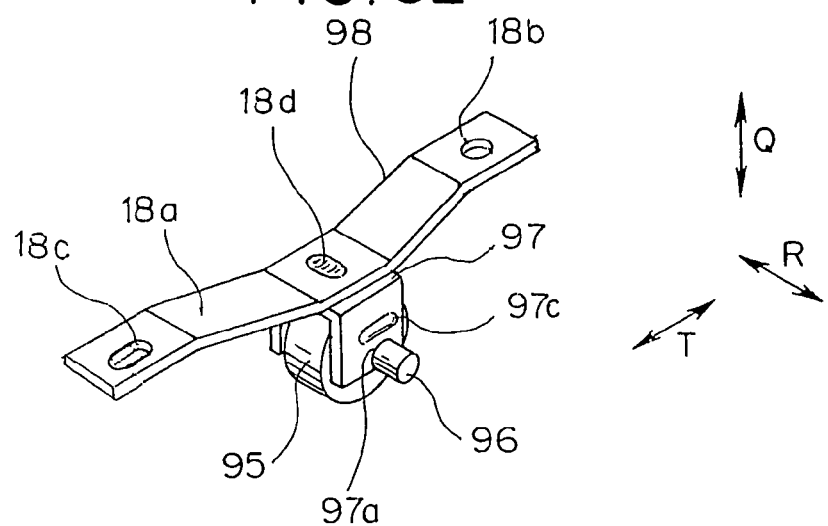
FIG. 52 is a perspective view of the leaf spring and the roller shown in FIG. 51.

FIG. 51 is an enlarged sectional view of a vibration wave motor including the roller pressing unit of this modification. FIG. 52 is a perspective view of a leaf spring, a roller holder, and a roller of the roller pressing unit shown in FIG. 51.

The roller pressing unit of this modification includes a leaf spring 98 and a roller holder 97. As shown in FIG. 52, the leaf spring 98 has the same shape as the leaf spring 18 shown in FIG. 11 applied to the vibration wave motor 1 of the above-described embodiment. Like the leaf spring 18, the leaf spring 98 is mounted on the presser plates 25. The roller holder 97 has a U-shape for holding a roller 95. Protrusions 97c are provided on the side surfaces of the roller holder 97. Shaft holes 97a are further provided on the side surfaces of the roller holder 97 for a roller shaft 96 of the roller 95 to pass through and rotate.

As shown in FIG. 51, in the roller pressing unit of this modification, the oval stepped portion 18d of the leaf spring 98 is in contact with the top surface of the roller holder 97. The roller holder 97 is inserted into the insertion opening 2a of the housing 2 together with the roller 95 so that the protrusions 97c fit into the insertion opening 2a with no space between. The roller 95 is pressed in the Q direction by the urging force of the leaf spring 98 via the roller holder 97 and the roller shaft 96, and therefore, the roller 95 is pressed against the rotor plate 6 at a predetermined urging force.

Like the vibration wave motor 1 of the above-described embodiment, in a vibration wave motor including the roller pressurizing unit of this modification, the roller 95 is pressed against the rotor plate 6 due to the urging force of the leaf spring 98. While this urging force is balanced with the pressing strength of the driving element 38 of the vibrator 35 against the rotor plate 6 due to the urging force of the leaf spring 18, the rotor 3 is driven to rotate.

Figure 53:
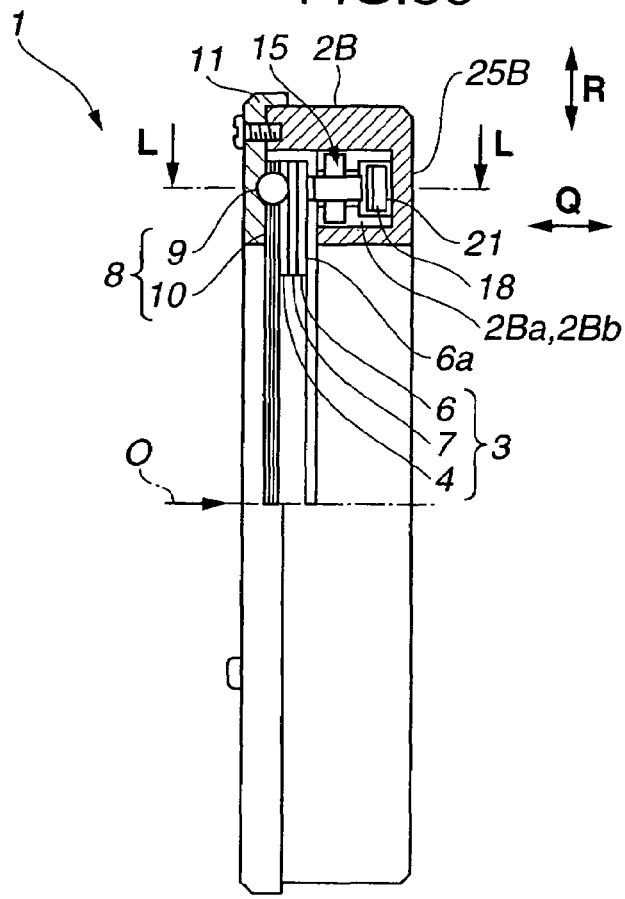
FIG. 53 is a side view, partially in section, of the vibration wave motor including the modification of the presser plate of the vibration wave motor shown in FIG. 1.

The modifications of the presser plate 25 in the vibration wave motor 1 of the above-described embodiment are described next with reference to FIGS. 53 through 56. As shown in FIG. 53, in this modification, a presser plate 25B is integrated into a housing 2B. The other structures are similar to those of the above-described vibration wave motor 1, and therefore, the descriptions are not repeated.

Figure 54:
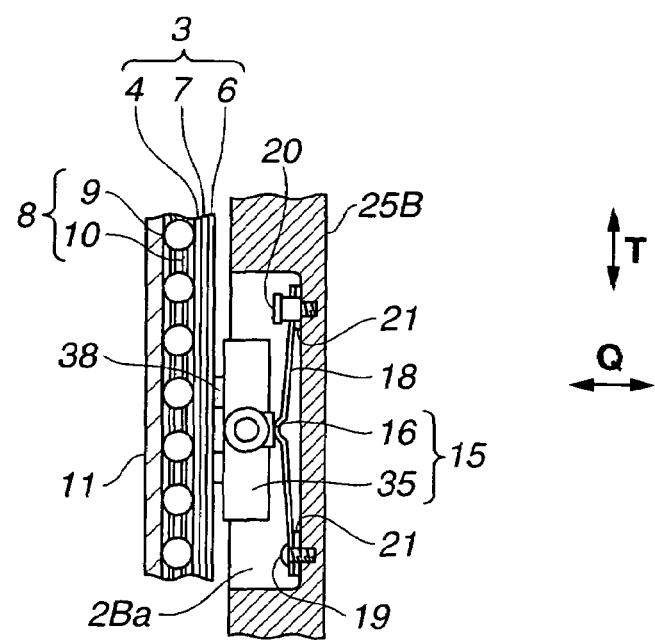
FIG. 54 is a sectional view taken along the line L-L of FIG. 53.
Figure 56:
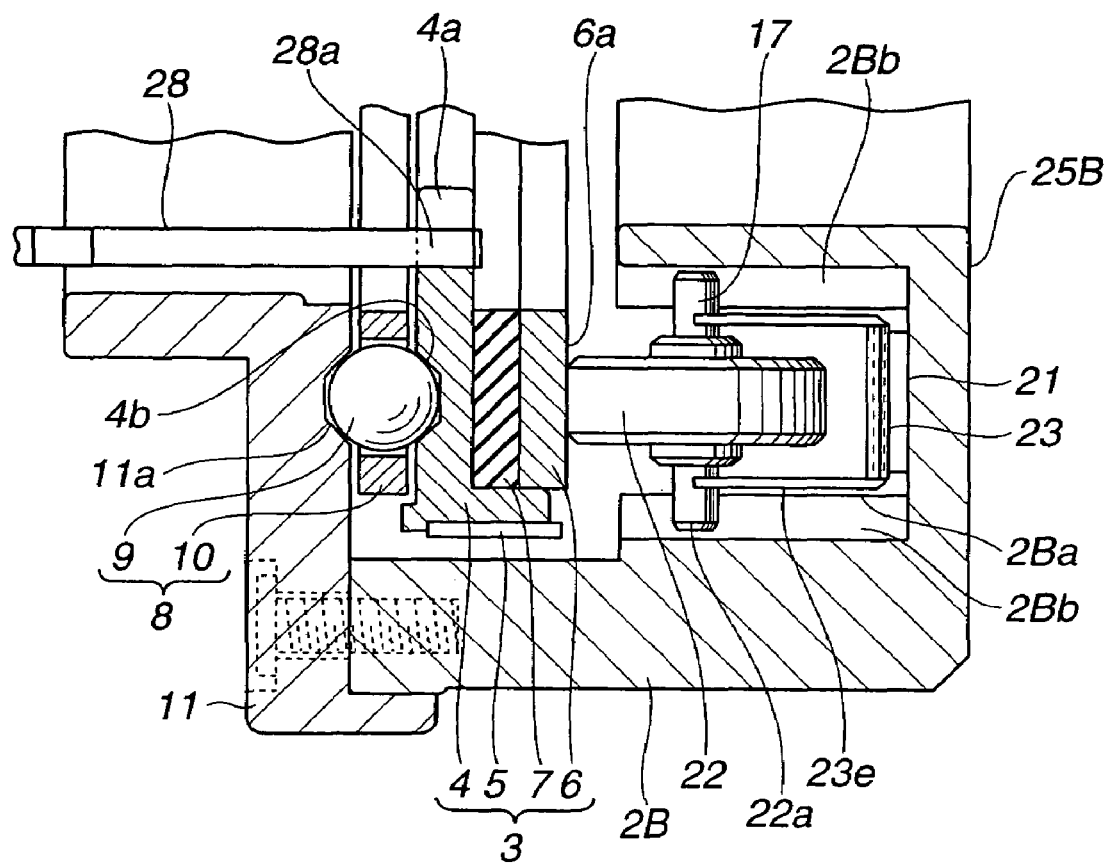
FIG. 56 is an enlarged sectional view about a rotor of the vibration wave motor shown in FIG. 53 along the rotation axis.

FIG. 53 is a side view, partially in section, of the vibration wave motor of this modification along rotation axis. FIG. 54 is a sectional view taken along the line L-L of FIG. 53. FIG. 55 is an enlarged sectional view of a vibrator unit of the vibration wave motor including a rotation axis shown in FIG. 53. FIG. 56 is an enlarged sectional view of a roller of the vibration wave motor including a rotation axis shown in FIG. 53.

In this modification, an insertion opening 2Ba provided in the housing 2B is open only to the rotor 3. That is, the insertion opening 2Ba is not a through-hole in the rotation axis direction. The bottom of the insertion opening 2Ba is formed at the side opposite to the rotor 3 in the rotation axis. The bottom surface functions as the presser plate 25B.

As shown in FIGS. 53 through 55, according to this modification, the vibrator unit 15 is disposed in the insertion opening 2Ba provided in the housing 2B and the support shaft 17 of the vibrator unit 15 is inserted in a guide groove 2Bb. In this state, the vibrator unit 15 is supported so that the movement of the vibrator unit 15 is restricted in the T and the R directions and is allowed only in the Q direction.

Like the above-described embodiment, the leaf spring 18 is attached to the presser plate 25B by the setscrew 19 and the shoulder screw 20. At that time, by disposing the adjustment washer 21 serving as the first pressing strength adjustment means between the leaf spring 18 and the presser plate 25B and by appropriately adjusting the thickness of the adjustment washer 21, the pressing strength of the leaf spring 18 can be adjusted. The vibrator unit 15 is urged against the rotor 3 by the leaf spring 18, and therefore, the driving element 38 of the vibrator unit 15 is in contact with the friction contact surface 6a of the rotor plate 6 at a predetermined pressing strength.

As shown in FIG. 56, when the roller 22 is inserted into the insertion opening 2Ba, the support shaft 17 of the roller 22 is inserted into guide grooves 2Bb with the roller 22 disposed in the insertion opening 2Ba. Then, the roller 22 is supported so as to be movable in the Q direction. Like the above-described embodiment, the leaf spring 23 urges the roller 22 against the rotor 3. Accordingly, the roller 22 is always in contact with the friction contact surface 6a of the rotor plate 6 at a predetermined pressing strength. In this case, by disposing the adjustment washer 21 serving as the first pressing strength adjustment means between the leaf spring 23 and the presser plate 25B and by appropriately adjusting the thickness of the adjustment washer 21, the pressing strength of the leaf spring 23 can be adjusted.

In the assembled vibration wave motor in which the bearing holder 11 is fixed to the housing 2B by screws, the leaf springs 18 and 23, the vibrator 35, the roller 22, and the rotor 3 are clamped by the presser plate 25B of the housing 2B and the bearing holder 11 at the front. In the clamped state, the rotor 3 is rotatably supported by the housing 2B and the bearing holder 11 via the balls 9 fitted in the V grooves 11a and 4b. Thus, the bearing holder 11 prevents the vibrator unit 15, the roller 22, and the rotor 3 from dropping off the housing 2B.

According to this modification, since the presser plate is integrated into the housing, the number of components can be reduced, thus simplifying the assembly procedure.

While, in the embodiment and modifications of the invention disclosed herein, a vibration wave motor is a motor in which a vibrator generates a driving force from ultrasonic vibration, it should be clearly understood that the present invention is equally suitable for use of a vibration wave motor in which a vibrator generates a driving force from an auditory sound vibration other than ultrasonic vibration.

Furthermore, the key structures of the vibration wave motor of the present invention can be applied to a linear actuator motor. In this case, a housing 2, a bearing member, and a bearing holder member are formed from straight members or members curved along a direction of the driving movement.

A vibration wave motor according to the present invention is a high-efficiency vibration wave motor in which a vibrator is in frictional contact with a rotor in an appropriate condition. Furthermore, a vibration wave motor according to the present invention can be integrated into a unit that can be easily assembled into a variety of apparatuses.

What is claimed is:

1. A vibration wave motor comprising:
    at least one vibrator including a driving element, the driving element being excited to perform elliptical vibration, the vibrator having a node of vibration;
    a rotor supported to rotate about a rotation axis, the rotor having a contact surface in contact with the vibrator;
    a support member in which the vibrator is arranged;
    a guide support portion formed in the support member, the guide support portion supporting the vibrator substantially at the node of vibration while restricting movement of the vibrator in a direction perpendicular to the rotation axis and a circumferential direction and enabling linear movement of the vibrator along the rotation axis direction;
    an urging member arranged in the support member, the urging member urging the vibrator in the rotation axis direction of the rotor so as to be in contact with the contact surface;
    a bearing member disposed so as to be in contact with a surface of the rotor opposed to the contact surface; and
    a bearing holder member mounted to one end of the support member so as to clamp the bearing member, the rotor, the vibrator, and the urging member together with the support member;
    wherein the vibrator, the rotor, the support member, and the urging member are integrated into a unit to form the vibration wave motor.

2. The vibration wave motor according to claim 1, wherein a plurality of the guide support portions are formed on the surface of the support member while being circumferentially spaced apart from each other, at least one guide support portion supports the vibrator, and the other guide support portions support rolling elements in rolling contact with the rotor at all times.

3. The vibration wave motor according to claim 1, wherein an annular rotor plate member integrated into the rotor serves as the contact surface of the rotor.

4. The vibration wave motor according to claim 1, further comprising:
    a pressing strength adjustment mechanism for adjusting pressing strength of the urging member, the urging member urging the vibrator against the rotor so that the vibrator is in frictional contact with the rotor.

5. The vibration wave motor according to claim 1, wherein a vibrator holder having support protrusions formed on both sides thereof at positions substantially corresponding to a node of vibration of the vibrator is fixed to the vibrator in an integrated manner.

6. A lens barrel comprising:
the vibration wave motor according to claim 1, the vibration wave motor driving a predetermined lens.

7. A vibration wave motor comprising:
a housing;
a rotor rotatable about a rotation axis relative to the housing;
a plurality of contacting members in contact with the rotor and being aligned in a direction of the rotation axis;
a plurality of guide support portions provided on the housing, each supporting one of the plurality of the contacting members;
a guide groove formed on each of the guide support portions, the guide groove guiding the contacting member so as to move forward and backward in the rotation axis direction;
a plurality of urging portions, each disposed at a side opposite to the rotor with respect to the contacting member in the rotation axis direction, each urging a respective corresponding contacting member against the rotor; and
a holding member fixed to the housing at a side of the rotor opposite to the housing in the rotation axis direction,
the holding member maintaining the rotor and the plurality of contacting members in place relative to the housing, and
wherein a roller in rolling contact with the rotor at all times is a vibrator having a driving element being excited to provide elliptical vibration and a node of vibration.

8. The vibration wave motor according to claim 7, further comprising:
a plurality of presser portions supporting the plurality of urging portions;
wherein the plurality of urging portions, the plurality of contacting members, and the roller are held between the holding member and the presser portions.

9. The vibration wave motor according to claim 8, wherein the plurality of urging portions are made from separate members.

10. The vibration wave motor according to claim 8, wherein the plurality of urging portions are connected to each other by a connection part to form a single urging member.

11. The vibration wave motor according to claim 8, wherein the plurality of presser portions are made from separate members.

12. The vibration wave motor according to claim 8, wherein the plurality of presser portions are integrated into a single presser member.

13. The vibration wave motor according to claim 7, wherein the plurality of guide support portions have substantially the same shape and the plurality of guide grooves have substantially the same shape.

14. The vibration wave motor according to claim 13, wherein each of the plurality of guide support portions and each of the plurality of guide grooves support one of the vibrator and the roller functioning as the contacting member.

15. The vibration wave motor according to claim 7, further comprising:
a pressing strength adjustment mechanism for independently adjusting pressing strength of the plurality of urging portions.

16. A vibration wave motor comprising:
a housing;
a rotor rotatable about a rotation axis relative to the housing;
a plurality of guide support portions disposed in the housing, each having a guide groove extending in the rotation axis direction;
at least one vibrator arranged in at least one of the plurality of guide support portions, the vibrator being excited to provide elliptical vibration, the vibrator having a node of vibration, the vibrator being restricted by the guide groove to move in a direction perpendicular to the rotation axis and in a circumferential direction of the rotation axis, the vibrator being supported by the guide groove for forward and backward movement in the rotation axis direction;
an urging member disposed at a side opposite to the rotor with respect to the vibrator in the rotation axis direction, the urging member urging the vibrator against the rotor;
a holding member fixed to the housing at the side of the rotor opposite to the housing in the rotation axis direction;
a roller disposed in one of the guide support portions that does not have a vibrator, the roller being movably supported by the guide groove in said one of the guide support portions, the roller being in rolling contact with the rotor at all times; and
an urging member for urging the roller against the rotor,
wherein the holding member maintains the rotor and the at least one vibrator in place relative to the housing, and
wherein the output of the vibration wave motor is changed by changing a number of the vibrators disposed in the plurality of guide support portions other than said one of the guide support portions.

17. The vibration wave motor according to claim 16, further comprising:
a pressing strength adjustment mechanism for adjusting a pressing strength of the urging member urging the vibrator against the rotor.

* * * * *

UNITED STATES PATENT AND TRADEMARK OFFICE
CERTIFICATE OF CORRECTION

PATENT NO.        : 7,466,062 B2
APPLICATION NO.   : 11/287920
DATED             : December 16, 2008
INVENTOR(S)       : Koji Sakatani et al.

It is certified that error appears in the above-identified patent and that said Letters Patent is hereby corrected as shown below:

At column 14, line 24, after the words "piezoelectric sheets", delete "37XX" and insert therefor --37X--.

At column 14, line 30, after the words "piezoelectric sheets", delete "37XX" and insert therefor --37X--.

Signed and Sealed this

Fifth Day of May, 2009

JOHN DOLL
*Acting Director of the United States Patent and Trademark Office*